(12) United States Patent
Galvin

(10) Patent No.: US 12,261,631 B2
(45) Date of Patent: Mar. 25, 2025

(54) DEEP LEARNING USING LARGE CODEWORD MODEL WITH HOMOMORPHICALLY COMPRESSED DATA

(71) Applicant: AtomBeam Technologies Inc., Moraga, CA (US)

(72) Inventor: Brian Galvin, Silverdale, WA (US)

(73) Assignee: ATOMBEAM TECHNOLOGIES INC, Moraga, CA (US)

( * ) Notice: Subject to any disclaimer, the term of this patent is extended or adjusted under 35 U.S.C. 154(b) by 0 days.

(21) Appl. No.: 18/909,976

(22) Filed: Oct. 9, 2024

(65) Prior Publication Data

US 2025/0047295 A1   Feb. 6, 2025

Related U.S. Application Data

(63) Continuation-in-part of application No. 18/770,652, filed on Jul. 12, 2024, and a continuation-in-part of
(Continued)

(51) Int. Cl.
| | |
|---|---|
| *H03M 7/00* | (2006.01) |
| *G06N 20/00* | (2019.01) |
| *H03M 7/30* | (2006.01) |

(52) U.S. Cl.
CPC .......... *H03M 7/3059* (2013.01); *G06N 20/00* (2019.01); *H03M 7/6005* (2013.01)

(58) Field of Classification Search
CPC ... H03M 7/3059; H03M 7/6005; G06N 20/00
See application file for complete search history.

(56) References Cited

U.S. PATENT DOCUMENTS

| | | |
|---|---|---|
| 4,780,718 A | 10/1988 | Hudson et al. |
| 5,708,436 A | 1/1998 | Loiz et al. |
| (Continued) | | |

FOREIGN PATENT DOCUMENTS

| | | |
|---|---|---|
| EP | 3364212 A1 | 8/2018 |
| GB | 2620921 A | 1/2024 |
| WO | 2020104416 A1 | 5/2020 |

OTHER PUBLICATIONS

Balaneshin-Kordan, Saeid et al., Deep ueral Architecture for Multi-Modal Retrieval based on Joint Embedding Space for Text and Images, Association for Computing Machinery, Feb. 5-9, 2018, pp. 1-9, Marina Del Rey, CA, USA.
(Continued)

*Primary Examiner* — Jean B Jeanglaude
(74) *Attorney, Agent, or Firm* — Galvin Patent Law LLC; Brian R. Galvin

(57) ABSTRACT

A system and method for deep learning using a large codeword model with homomorphically compressed and dyadically encrypted data is disclosed. The system preprocesses input data, applies homomorphic-dyadic compression and encryption, tokenizes the compressed data into source-blocks, and assigns codewords using a codebook. These codewords are processed through a machine learning core, which can be either a conventional transformer-based architecture or a latent transformer core utilizing a variational autoencoder. The system enables secure operations on encrypted data, preserving privacy while allowing complex computations. The processed output is decrypted, decompressed, and translated to match the input modality. A neural upsampler may further enhance the output. The machine learning core is continuously trained using the processed data and additional training data, improving performance over time.

20 Claims, 39 Drawing Sheets

Related U.S. Application Data application No. 18/755,653, filed on Jun. 26, 2024, and a continuation-in-part of application No. 18/737,906, filed on Jun. 7, 2024, and a continuation-in-part of application No. 18/736,498, filed on Jun. 6, 2024, said application No. 18/755,653 is a continuation-in-part of application No. 18/657,683, filed on May 7, 2024, now Pat. No. 12,159,216, which is a continuation-in-part of application No. 18/648,340, filed on Apr. 27, 2024, now Pat. No. 12,166,507, which is a continuation-in-part of application No. 18/427,716, filed on Jan. 30, 2024, now Pat. No. 12,093,972, which is a continuation-in-part of application No. 18/410,980, filed on Jan. 11, 2024, now Pat. No. 12,068,761, which is a continuation-in-part of application No. 18/537,728, filed on Dec. 12, 2023, now Pat. No. 12,058,333, said application No. 18/770,652 is a continuation-in-part of application No. 18/503,135, filed on Nov. 6, 2023, which is a continuation of application No. 18/305,305, filed on Apr. 21, 2023, now Pat. No. 11,811,428, which is a continuation-in-part of application No. 18/190,044, filed on Mar. 24, 2023, now Pat. No. 11,831,343, which is a continuation-in-part of application No. 17/875,201, filed on Jul. 27, 2022, now Pat. No. 11,700,013, and a continuation-in-part of application No. 17/727,913, filed on Apr. 25, 2022, now Pat. No. 11,620,051, said application No. 17/875,201 is a continuation of application No. 17/514,913, filed on Oct. 29, 2021, now Pat. No. 11,424,760, and a continuation of application No. 17/458,747, filed on Aug. 27, 2021, now Pat. No. 11,422,978, said application No. 17/727,913 is a continuation of application No. 17/404,699, filed on Aug. 17, 2021, now Pat. No. 11,385,794, said application No. 17/514,913 is a continuation-in-part of application No. 17/404,699, filed on Aug. 17, 2021, now Pat. No. 11,385,794, said application No. 18/305,305 is a continuation-in-part of application No. 17/234,007, filed on Apr. 19, 2021, now Pat. No. 11,782,879, which is a continuation-in-part of application No. 17/180,439, filed on Feb. 19, 2021, now Pat. No. 11,366,790, which is a continuation-in-part of application No. 16/923,039, filed on Jul. 7, 2020, now Pat. No. 11,232,076, said application No. 17/458,747 is a continuation-in-part of application No. 16/923,039, filed on Jul. 7, 2020, now Pat. No. 11,232,076, which is a continuation-in-part of application No. 16/716,098, filed on Dec. 16, 2019, now Pat. No. 10,706,018, which is a continuation of application No. 16/455,655, filed on Jun. 27, 2019, now Pat. No. 10,509,771, said application No. 17/404,699 is a continuation-in-part of application No. 16/455,655, filed on Jun. 27, 2019, now Pat. No. 10,509,771, which is a continuation-in-part of application No. 16/200,466, filed on Nov. 26, 2018, now Pat. No. 10,476,519, which is a continuation-in-part of application No. 15/975,741, filed on May 9, 2018, now Pat. No. 10,303,391.

(60) Provisional application No. 63/651,359, filed on May 23, 2024, provisional application No. 63/485,518, filed on Feb. 16, 2023, provisional application No. 63/388,411, filed on Jul. 12, 2022, provisional application No. 63/232,041, filed on Aug. 11, 2021, provisional application No. 63/140,111, filed on Jan. 21, 2021, provisional application No. 63/027,166, filed on May 19, 2020, provisional application No. 62/926,723, filed on Oct. 28, 2019, provisional application No. 62/578,824, filed on Oct. 30, 2017.

(56) References Cited

U.S. PATENT DOCUMENTS

| | | |
|---|---|---|
| 7,411,540 B1 | 8/2008 | Lopez et al. |
| 7,629,922 B2 | 12/2009 | Winstead et al. |
| 7,876,257 B2 | 1/2011 | Vetro et al. |
| 9,524,392 B2 | 12/2016 | Naehrig et al. |
| 11,086,843 B2* | 8/2021 | Swaminathan ..... G06F 16/5862 |
| 11,100,420 B2* | 8/2021 | Dirac ..................... G06N 20/00 |
| 11,216,742 B2* | 1/2022 | Bhattacharyya ........ G06F 17/18 |
| 11,451,242 B2 | 9/2022 | Choi et al. |
| 11,557,323 B1* | 1/2023 | Stewart .................. G06V 20/49 |
| 11,656,353 B2 | 5/2023 | Li et al. |
| 2004/0017307 A1 | 1/2004 | Cirillo et al. |
| 2004/0160353 A1 | 8/2004 | Cirillo et al. |
| 2008/0231504 A1 | 9/2008 | Sartor et al. |
| 2010/0117875 A1* | 5/2010 | Oslick ..................... H03M 7/46 |
| | | 341/59 |
| 2011/0012778 A1 | 1/2011 | Nguyen et al. |
| 2015/0054678 A1 | 2/2015 | Wakayama |
| 2017/0048537 A1 | 2/2017 | Boufounos et al. |
| 2018/0196609 A1 | 7/2018 | Niesen |
| 2020/0258296 A1 | 8/2020 | Pennings et al. |
| 2020/0395955 A1 | 12/2020 | Choi et al. |
| 2022/0156631 A1 | 5/2022 | Kanso et al. |
| 2022/0404490 A1 | 12/2022 | Evans et al. |
| 2023/0131694 A1 | 4/2023 | Saber et al. |
| 2023/0169623 A1 | 6/2023 | Chen et al. |
| 2023/0184927 A1 | 6/2023 | Chen et al. |
| 2024/0185037 A1 | 6/2024 | Park et al. |
| 2024/0195438 A1 | 6/2024 | Isik et al. |

OTHER PUBLICATIONS

Kahn, Abdul Rafae et al., Coding Textual Inputs Boosts the Accuracy of Neural Networks, 2020 Conference on Empirical Methods in Natural Language Processing, Nov. 16-20, 2020, pp. 1350-1360.

Messina, Nicola et al., Towards Efficient Cross-Modal Visual Textual Retrieval using Transformer-Encoder Deep Features, 2021 International Conference on Content-Based Multimedia Indexing, 2021, pp. 1-6, United States.

Seo, Beomseok et al., How Does A Transformer Learn Compression? An Attention Study on Huffman and LZ4, Department of Electronic and Electrical Engineering, Dec. 12, 2023, pp. 1-10, vol. 11, Seoul, South Korea.

Vaswani, Ashish et al., Attention is All You Need, 31st Conference on Neural Information Processing Systems, 2017, pp. 1-11, Long Beach, CA, USA.

Wang, Tianming et al., T-CVAE: Transformer-Based Conditioned Variational Autoencoder for Story Completion, Proceedings of the Twenty-Eigth Joint Conference on Artificial Intelligence, pp. 5233-5239.

Wieting, John et al., A Bilingual Generative Transformer for Semantic Sentence Embedding, Nov. 19, 2020, pp. 1-14.

\* cited by examiner

DEEP LEARNING USING LARGE CODEWORD MODEL WITH HOMOMORPHICALLY COMPRESSED DATA

CROSS-REFERENCE TO RELATED APPLICATIONS

Priority is claimed in the application data sheet to the following patents or patent applications, each of which is expressly incorporated herein by reference in its entirety:
Ser. No. 18/770,652
Ser. No. 18/503,135
Ser. No. 18/305,305
Ser. No. 18/190,044
Ser. No. 17/875,201
Ser. No. 17/514,913
Ser. No. 17/404,699
Ser. No. 16/455,655
Ser. No. 16/200,466
Ser. No. 15/975,741
62/578,824
Ser. No. 17/458,747
Ser. No. 16/923,039
63/027,166
Ser. No. 16/716,098
62/926,723
63/388,411
Ser. No. 17/727,913
63/485,518
63/232,041
Ser. No. 17/234,007
Ser. No. 17/180,439
63/140,111
Ser. No. 18/755,653
Ser. No. 18/657,683
Ser. No. 18/648,340
Ser. No. 18/427,716
Ser. No. 18/410,980
Ser. No. 18/537,728
Ser. No. 18/737,906
Ser. No. 18/736,498
63/651,359

BACKGROUND OF THE INVENTION

Field of the Art

The present invention relates to the field of deep learning, data compression, and secure data processing. More specifically, the invention pertains to systems and methods that perform homomorphic compression, dyadic encryption, and deep learning using large codeword models while maintaining data privacy and security.

Discussion of the State of the Art

In recent years, deep learning approaches have shown promising results in data compression, encryption, and secure processing. Autoencoders, particularly variational autoencoders (VAEs), have emerged as powerful tools for learning compact representations of data in a latent space. These neural network architectures consist of an encoder network that maps input data to a lower-dimensional latent space and a decoder network that reconstructs the original data from the latent representation, enabling both compression and potential security benefits.

Concurrently, advances in homomorphic encryption have opened new possibilities for performing computations on encrypted data without decryption. This technology, combined with novel compression techniques like dyadic distribution-based methods, has paved the way for secure data processing in various domains. These developments have significant implications for privacy-preserving machine learning and secure multi-party computations, particularly in sensitive fields such as healthcare and finance.

The integration of large language models and transformer architectures has revolutionized natural language processing and expanded to other data modalities. These models, capable of capturing long-range dependencies and generating contextually rich outputs, have been adapted for various tasks beyond text processing. However, the challenge remains to efficiently process and analyze large volumes of data while maintaining privacy and security. As machine learning and artificial intelligence continue to evolve, there is a growing need for systems that can leverage these advanced models while ensuring data confidentiality and enabling secure collaborations across different entities.

SUMMARY OF THE INVENTION

Disclosed embodiments provide a system and method for deep learning using a large codeword model with homomorphically compressed data. The system incorporates elements of homomorphic compression, dyadic encryption, and large codeword models to process and analyze data while maintaining privacy and security.

The architecture of the system includes components for preprocessing, compressing, and encrypting input data. The compression and encryption process involves analyzing input data sets, creating transformation matrices, transforming the data into modified distributions, such as dyadic distributions, and generating main and secondary data streams. The main data streams are compressed and tokenized into sourceblocks, which are then mapped to codewords using a codebook.

The system utilizes a machine learning core, which can be either a conventional transformer-based architecture or a latent transformer core. The conventional transformer-based architecture includes an embedding layer, a positional encoding layer, and a series of transformer layers. The latent transformer core comprises a variational autoencoder with an encoder and decoder, and a transformer that processes latent space vectors without an embedding or positional encoding layer.

According to a preferred embodiment, a system for deep learning using a large codeword model with homomorphically compressed dyadically encrypted data, comprising: a computing device with memory and a processor; programming instructions that cause the device to: receive inputs, preprocess them, compress and encrypt the data, tokenize the compressed data into sourceblocks, assign codewords to the sourceblocks, process the codewords through a machine learning core, translate the response, decompress and decrypt the response, and train the machine learning core using the processed data and training data, is disclosed.

According to another preferred embodiment, a method for deep learning using a large codeword model with homomorphically compressed dyadically encrypted data, comprising steps of: receiving inputs, preprocessing them, compressing and encrypting the data, tokenizing the compressed data into sourceblocks, assigning codewords to the sourceblocks, processing the codewords through a machine learning core, translating the response, decompressing and decrypting the response, and training the machine learning core using the processed data and training data, is disclosed.

According to an aspect of an embodiment, the system further comprises a syntactic splitting component that splits the codewords or latent space vectors into smaller units before processing through the machine learning core.

According to an aspect of an embodiment, the system implements security measures including cryptographically secure random numbers for data transformation and protections against side-channel attacks.

According to an aspect of an embodiment, the system includes a neural upsampler that processes the codeword response to generate a reconstructed output containing more information than the translated response.

BRIEF DESCRIPTION OF THE DRAWING FIGURES

Figure 33:
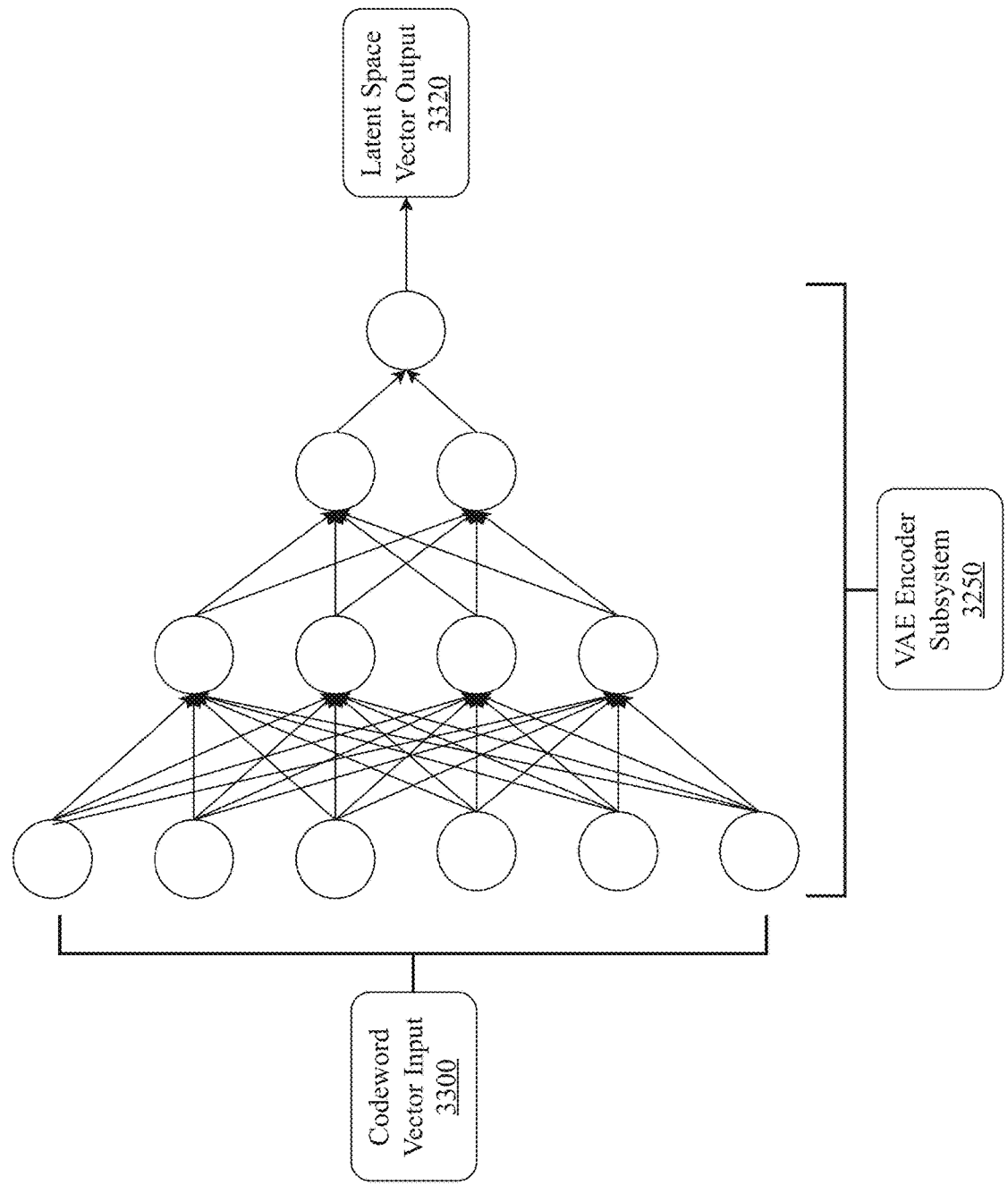
Figure 34:
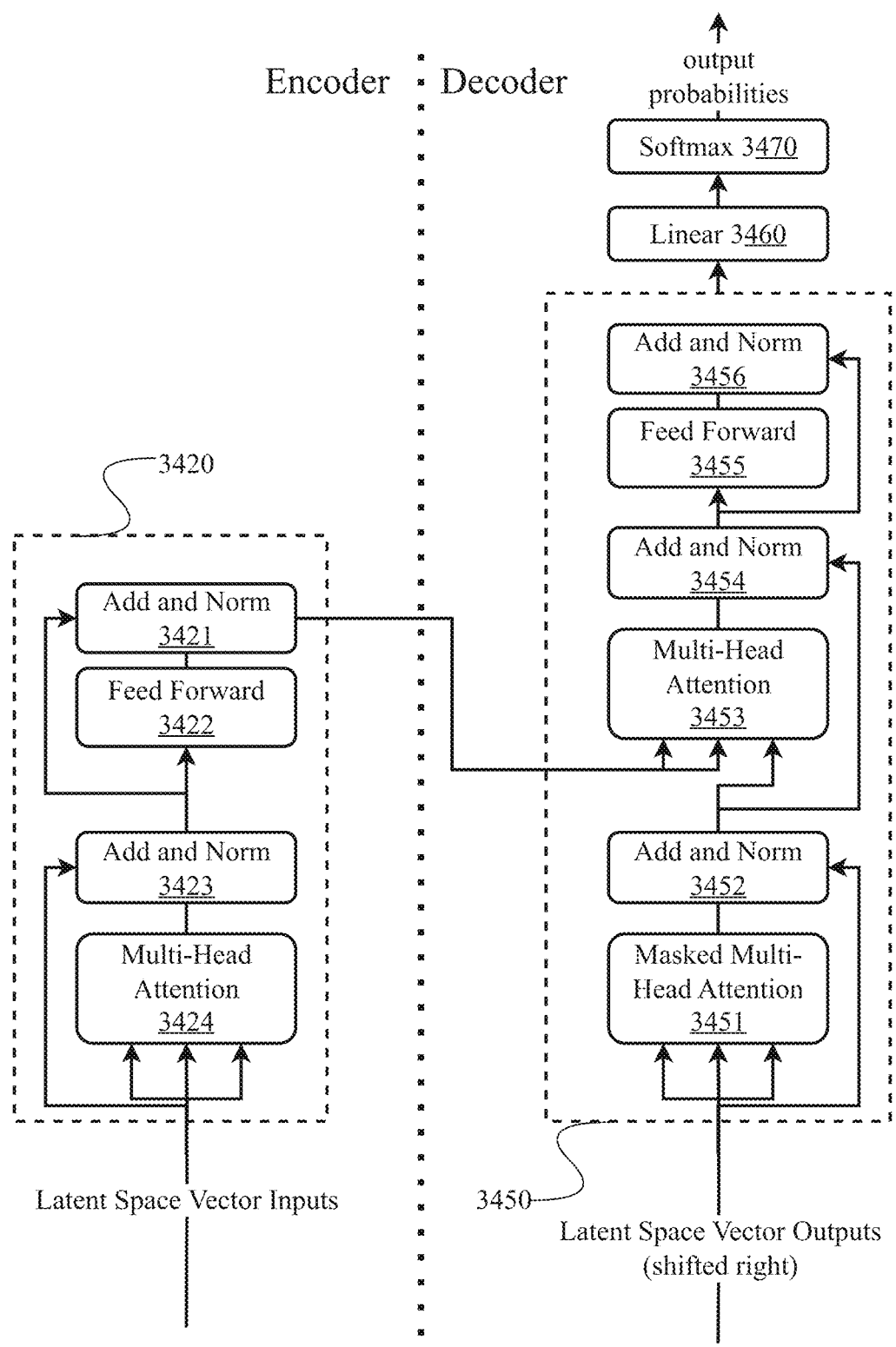
Figure 35:
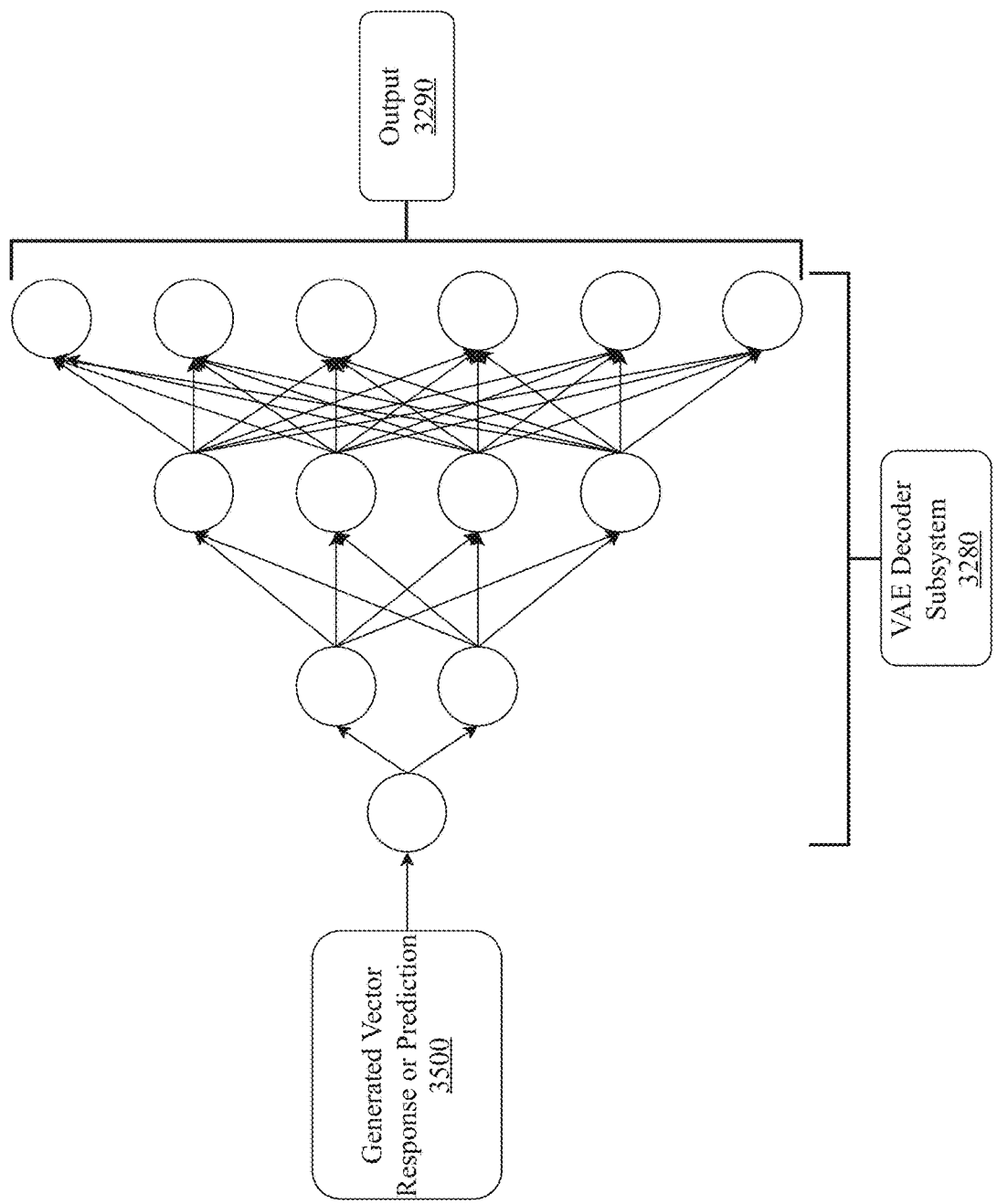
Figure 36:
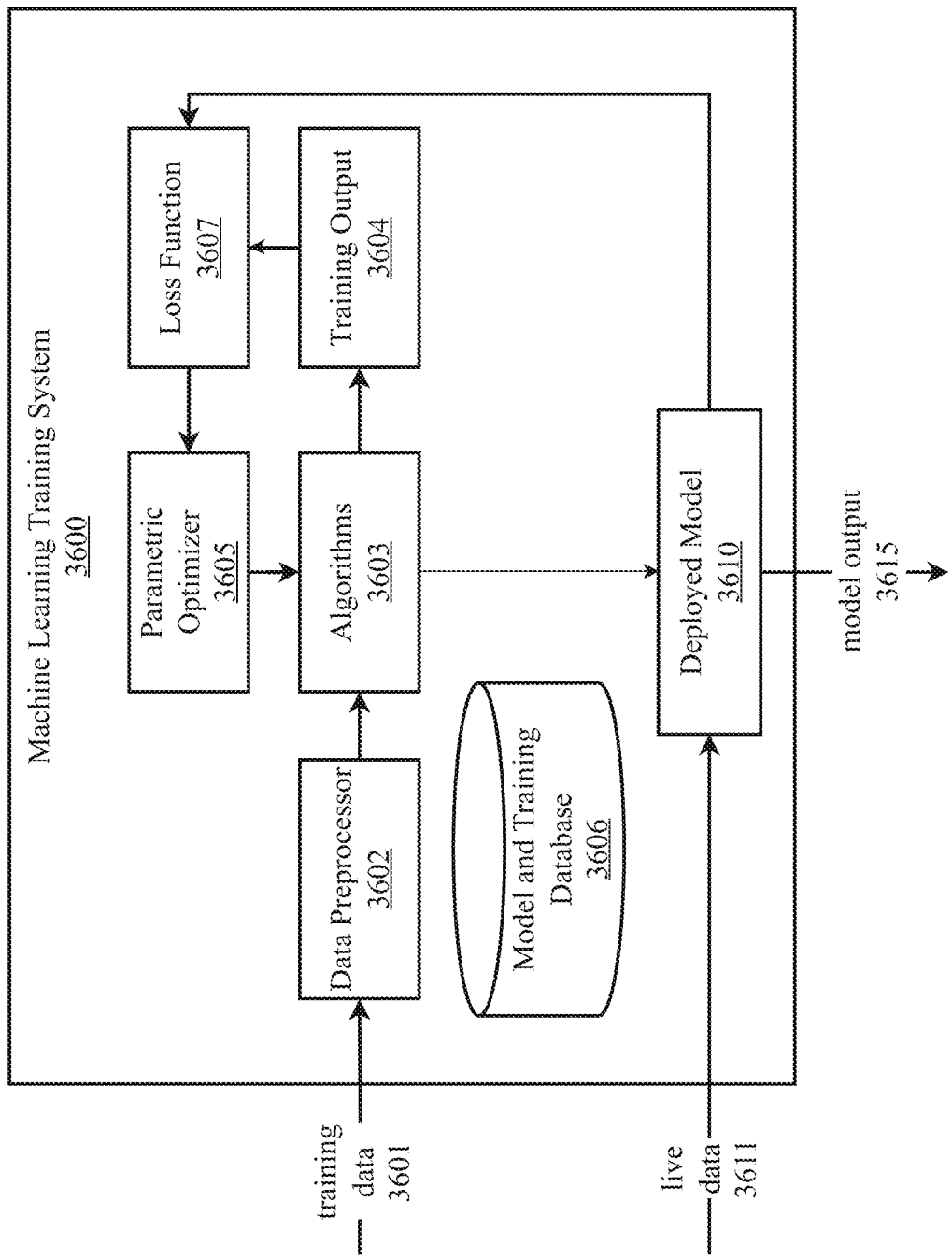

FIG. 33 is a block diagram illustrating a component of the system for a Latent Transformer core for a Large Codeword Model FIG. 34 is a block diagram illustrating a component of the system and method for a large codeword model for deep learning FIG. 35 is a block diagram illustrating a component of the system for a Latent Transformer core for a Large Codeword Model FIG. 36 is a block diagram illustrating an aspect of system and method for a Latent Transformer core for a Large Codeword Model

DETAILED DESCRIPTION OF THE INVENTION

The inventor has conceived and reduced to practice a system and method for deep learning using a large codeword model with homomorphically compressed data. This innovative approach combines the benefits of data compression, encryption, and advanced machine learning techniques to create a powerful and efficient framework for processing and analyzing data while maintaining privacy and security. The system comprises a computing device with at least a memory and a processor, along with a plurality of programming instructions stored in the memory and operable on the processor. When executed, these instructions enable the computing device to perform a series of operations that form the core of the invention.

The system begins by receiving a plurality of inputs, which can be of various types and modalities, such as text, images, audio, or sensor data. These inputs undergo preprocessing to generate a plurality of input data sets. The preprocessing step may involve data cleaning, normalization, feature extraction, and other techniques to prepare the data for further processing.

A key innovation of this system is the simultaneous compression and encryption of the input data sets. This process involves analyzing the input data sets to determine their properties, creating transformation matrices based on these properties, transforming the input data into modified distributions, generating main data streams of transformed data and secondary data streams of transformation information, and finally compressing the main data streams. This process leverages the dyadic distribution-based compression and encryption platform, which offers a novel approach to data processing. The platform operates on the principle of transforming input data into a dyadic distribution whose Huffman encoding is close to uniform. This is achieved through the use of a transformation matrix B, which maps the original data distribution to the desired dyadic distribution.

The dyadic system can operate in various modes, including a lossless mode where both the main data stream and the transformation data are transmitted, allowing perfect reconstruction of the original data, and a lossy mode where only the transformed data is transmitted, providing even stronger encryption at the cost of perfect reconstruction.

After compression and encryption, the system tokenizes the compressed main data streams into a plurality of sourceblocks. These sourceblocks are then assigned a plurality of codewords, where each sourceblock is mapped to a particular codeword through a codebook. This process is a key component of the Large Codeword Model (LCM) architecture. The LCM works with discrete, compressed representations called codewords, unlike traditional deep learning models that operate on raw tokens and dense embeddings. This approach offers improved efficiency and scalability in processing large amounts of data.

Optionally, the system can perform a latent space preprocessing step. This step involves further processing of the codewords or compressed data in a latent space representation. The latent space preprocessing can help in capturing more abstract and meaningful features of the data, potentially improving the performance of subsequent machine learning tasks. This step can be particularly useful when dealing with complex, high-dimensional data, as it can help in reducing dimensionality while preserving important information.

The plurality of codewords is then processed through a machine learning core to generate a codeword response. The machine learning core can be implemented using various architectures, such as a conventional transformer-based architecture or a latent transformer core. The conventional transformer-based architecture comprises an embedding layer, a positional encoding layer, and a series of transformer layers. The latent transformer core, on the other hand, comprises a variational autoencoder with an encoder and a decoder, and a transformer that processes latent space vectors without an embedding layer and a positional encoding layer. The choice of architecture depends on the specific requirements of the task and the nature of the data being processed.

A crucial aspect of this invention is the use of homomorphic compression techniques. The system utilizes a variational autoencoder to enable homomorphic compression. Input data is compressed into a latent space using an encoder network of the variational autoencoder. This allows for homomorphic operations to be performed on the compressed data in the latent space. The homomorphic properties of the compression enable important features such as enhanced privacy, data security, and secure data outsourcing. Operations can be performed on sensitive information in its encrypted form, enabling multiple parties to operate on the data without having the unencrypted contents revealed.

The codeword response generated by the machine learning core is then translated into a translated response which matches the modality of the inputs. This translated response is subsequently decompressed and decrypted, reversing the initial compression and encryption process.

The machine learning core is trained using the decompressed and decrypted response and a plurality of training data. This training process allows the system to learn and improve its performance over time, adapting to the specific characteristics of the data it processes.

The system includes several additional features to enhance its functionality and security. These include a syntactic splitting component that can split the codewords or latent space vectors into smaller units before processing through the machine learning core, security measures that include providing cryptographically secure random numbers for use in data transformation and implementing protections against side-channel attacks, and a neural upsampler that processes the codeword response to generate a reconstructed output containing more information than the translated response.

This invention represents a significant advancement in the field of deep learning and data processing. By combining large codeword models, homomorphic compression, and advanced encryption techniques, it offers a powerful and flexible framework for handling complex data processing tasks while maintaining high levels of security and efficiency. The system's ability to perform operations on encrypted data without decryption opens up new possibilities for secure data analysis and collaboration across various domains, including healthcare, finance, and other fields where data privacy is crucial.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Conceptual Architecture

Figure 1:
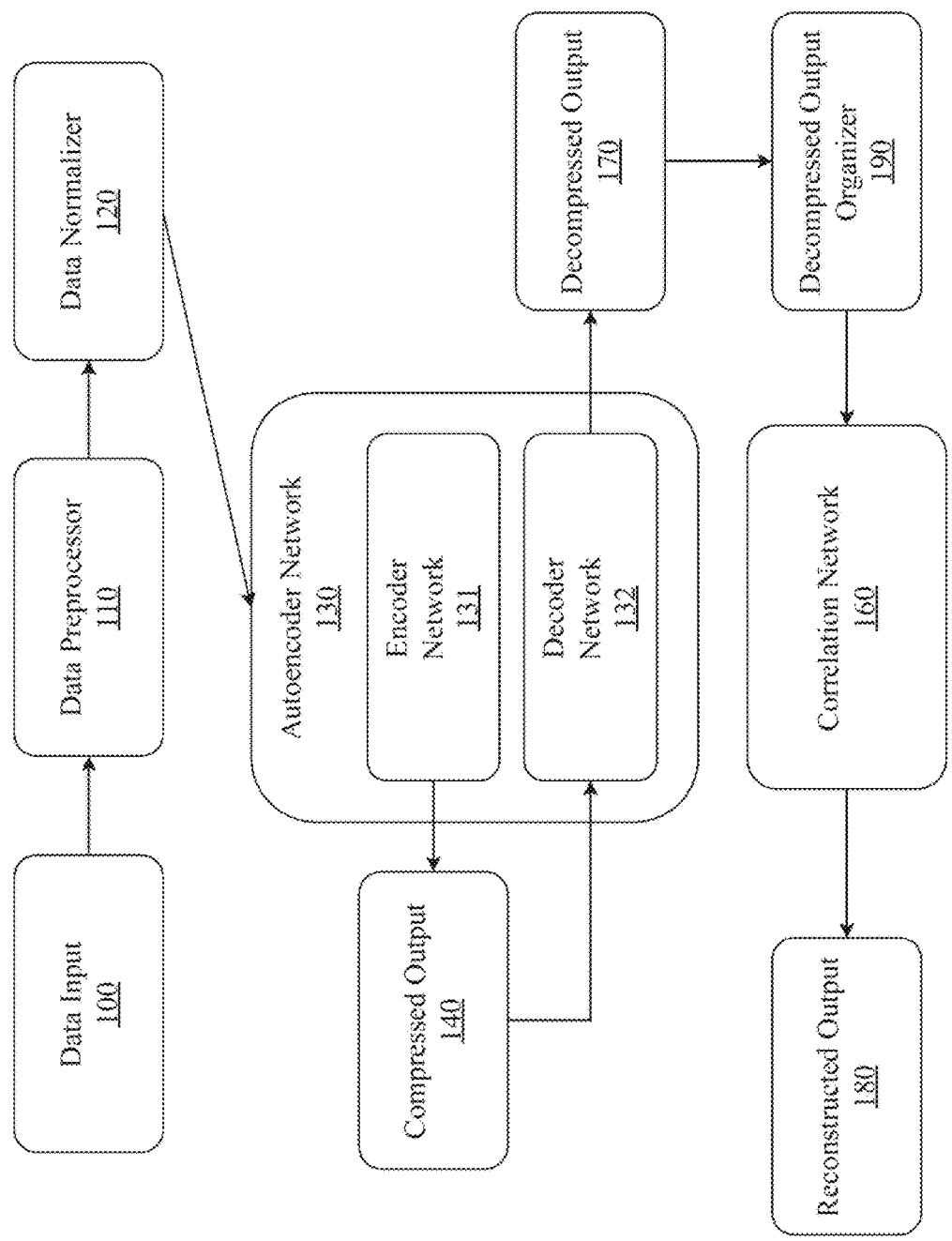
FIG. 1 is a block diagram illustrating an exemplary system architecture for compressing and restoring data using multi-level autoencoders and correlation networks.

FIG. 1 is a block diagram illustrating an exemplary system architecture for compressing and restoring data using multi-level autoencoders and correlation networks. In one embodiment, a system for compressing and restoring data using multi-level autoencoders and correlation networks comprises a plurality of data inputs 100, a data preprocessor 110, a data normalizer 120, a multi-layer autoencoder network 130 which further comprises an encoder network 131 and a decoder network 132, a plurality of compressed outputs 140, plurality of decompressed outputs 170, a decompressed output organizer 190, a plurality of correlation networks 160, and a reconstructed output 180. The plurality of data inputs 100 are representations of raw data from various sources, such as sensors, cameras, or databases. The raw data can be in different formats, including but not limited to images, videos, audio, or structured data. The plurality of data inputs 100 may be transferred to the data preprocessor 110 for further processing. The data preprocessor 110 applies various preprocessing techniques to the raw data received from the data input 100. These techniques may include data cleaning, noise reduction, artifact removal, or format conversion. The preprocessor 110 ensures that the data is in a suitable format and quality for subsequent stages of the system.

The preprocessed data may then be passed to the data normalizer 120. The data normalizer 120 scales and normalizes the data to a consistent range, typically between 0 and 1. Normalization helps to improve the training stability and convergence of the autoencoder network 130. The normalized data is fed into the autoencoder network 130, which includes both the encoder network 131 and the decoder network 132. The encoder network 131 is responsible for encoding the input data into a lower-dimensional latent space representation. It consists of multiple layers of encoders that progressively reduce the dimensionality of the data while capturing the most important features and patterns.

The compressed latent representation obtained from the encoder network 131 is the compressed output 140. The compressed output 140 has a significantly reduced size compared to the original input data, enabling efficient storage and transmission. The compressed output 140 may be stored in a storage system. A storage system may include any suitable storage medium, such as a database, file system, or cloud storage. Storage systems allow for the efficient management and retrieval or the compressed data as needed. When the compressed data needs to be restored or reconstructed, it may be retrieved from the storage system and passed to the decoder network 132. Additionally, the compressed data may be directly passed to either the decompression network 132. The decoder network 132 is responsible for decoding the compressed latent representation back into the original data space by outputting a decompressed output 170. It consists of multiple layers of decoders that progressively increase the dimensionality of the data, reconstructing the original input.

The decompressed output 170 from the decoder network 132 may have some loss of information compared to the original input data due to the compression process. To further enhance the quality of the decompressed output, the system may incorporate a correlation network 160. The correlation network 160 leverages the correlations and patterns between different compressed inputs to restore the decompressed output more accurately. It learns to capture the relationships and dependencies within the data, allowing for better reconstruction and restoration of the original information. The correlation network 160 takes the decompressed outputs 170 as inputs. It analyzes the correlations and similarities between the data samples and uses this information to refine and enhance the decompressed output. The refined decompressed output from the correlation network 160 is a reconstructed output 180 of the system. The reconstructed output 180 closely resembles the original input data, with minimal loss of information and improved quality compared to the output from the decoder network 132 alone.

In one embodiment, the correlation network 160 may receive inputs from a decompressed output organizer 190 which that operates on the decompressed outputs 170 obtained from the decoder network 132. The decompressed output organizer 190 may organize the decompressed outputs 170 into groups based on their correlations and similarities.

By grouping decompressed outputs 170 based on similarities, the correlation network 160 will more easily be able to identify correlations between decompressed outputs 170. The correlation network 160 finds patterns and similarities between decompressed outputs 170 to develop a more holistic reconstructed original input. By priming the correlation network 160 with already grouped, similar compressed outputs 170, the correlation network 160 will be able to generate even more reliable reconstructions. The multi-layer autoencoder network 130 and the correlation network 160 are trained using a large dataset of diverse samples. The training process involves minimizing the reconstruction loss between the original input data and the decompressed output 170. The system learns to compress the data efficiently while preserving the essential features and patterns. An example of PyTorch pseudocode for a multi-layer autoencoder which utilizes a correlation network may be found in APPENDIX A.

Figure 2:
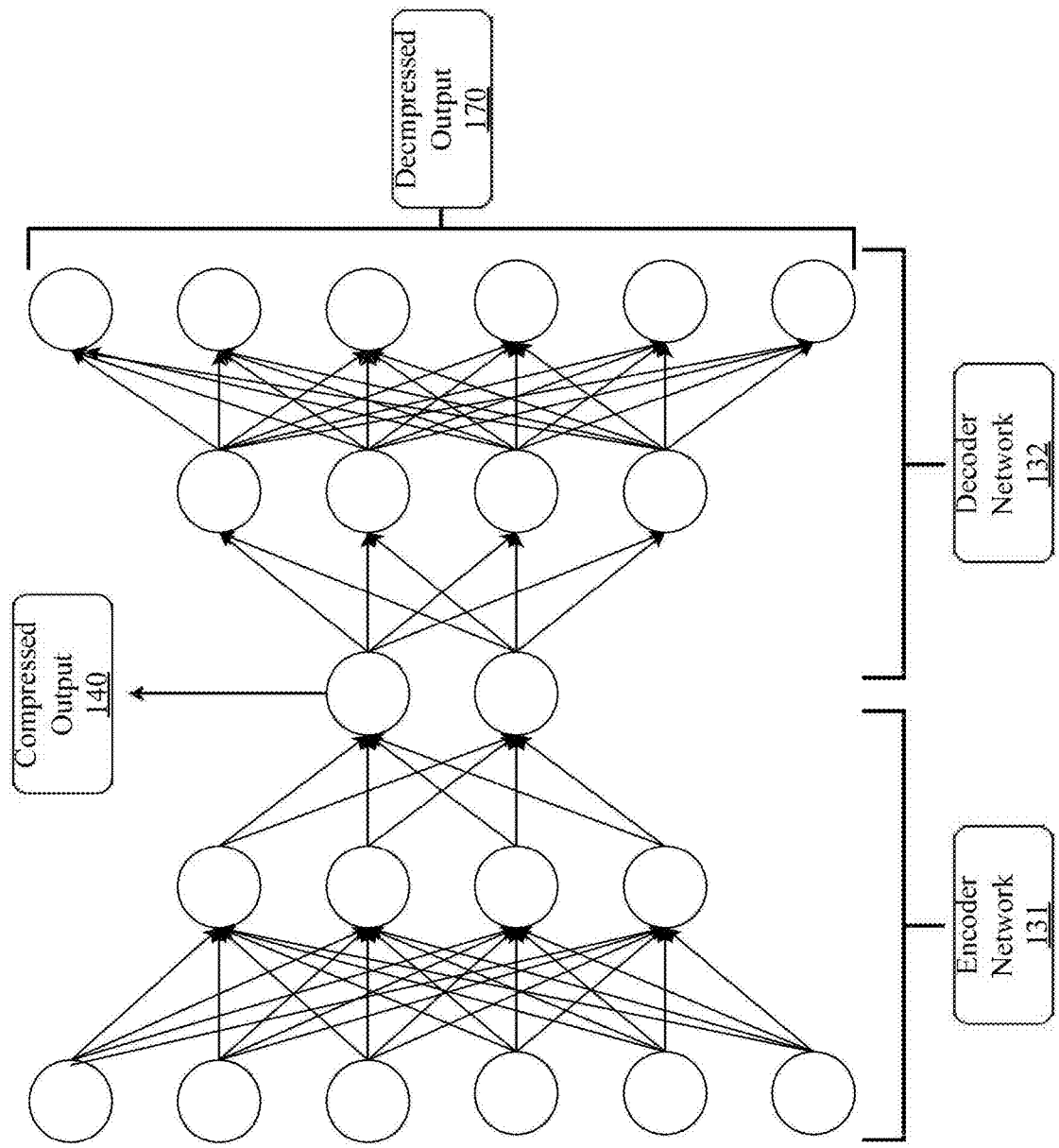
FIG. 2 is a block diagram illustrating an exemplary architecture for a subsystem of the system for compressing and restoring data using multi-level autoencoders and correlation networks, an autoencoder network.

FIG. 2 is a block diagram illustrating an exemplary architecture for a subsystem of the system for compressing and restoring data using multi-level autoencoders and correlation networks, a multi-layer autoencoder network. The multi-layer autoencoder network comprises an encoder network 131 or a decoder network 132 that work together to encode and decode data effectively. The encoder network 131 and decoder network 132 within the multi-layer autoencoder network is comprised of a plurality of layers that contribute to the encoding and decoding process. These layers include, but are not limited to, convolutional layers, pooling layers, and a bottleneck layer. Some embodiments also include functions that operate on information including but not limited to rectified linear unit functions, sigmoid functions, and skip connections.

The convolutional layers are responsible for extracting meaningful features from the input data. They apply convolutional operations using learnable filters to capture spatial patterns and hierarchical representations of the data. The convolutional layers can have different numbers of filters, kernel sizes, and strides to capture features at various scales and resolutions. Skip connections are employed to facilitate the flow of information across different layers of the autoencoder. Skip connections allow the output of a layer to be directly added to the output of a subsequent layer, enabling the network to learn residual mappings and mitigate the vanishing gradient problem. Skip connections help in preserving fine-grained details and improving the training stability of the autoencoder.

Pooling layers are used to downsample the feature maps generated by the convolutional layers. They reduce the spatial dimensions of the feature maps while retaining the most salient information. Common pooling operations include but are not limited to max pooling and average pooling. Pooling layers help in achieving translation invariance, reducing computational complexity, and controlling the receptive field of the autoencoder. Rectified Linear Unit (ReLU) functions introduce non-linearity into the autoencoder by applying a ReLU activation function element-wise to the output of the previous layer. ReLU functions help in capturing complex patterns and relationships in the data by allowing the network to learn non-linear transformations. They also promote sparsity and alleviate the vanishing gradient problem. The bottleneck layer represents the most compressed representation of the input data. The bottleneck layer has a significantly reduced dimensionality compared to the input and output layers of the autoencoder. It forces the network to learn a compact and meaningful encoding of the data, capturing the essential features and discarding redundant information. In one embodiment, the multi-layer autoencoder network is comprised of a plurality of the previously mentioned layers where the sequence and composition of the layers may vary depending on a user's preferences and goals. The bottleneck layer is where the compressed output 140 is created. Each layer previous to the bottleneck layer creates a more and more compressed version of the original input. The layers after the bottleneck layer represent the decoder network 132 where a plurality of layers operate on a compressed input to decompress a data set. Decompression results in a version of the original input which is largely similar but has some lost data from the transformations.

Figure 3:
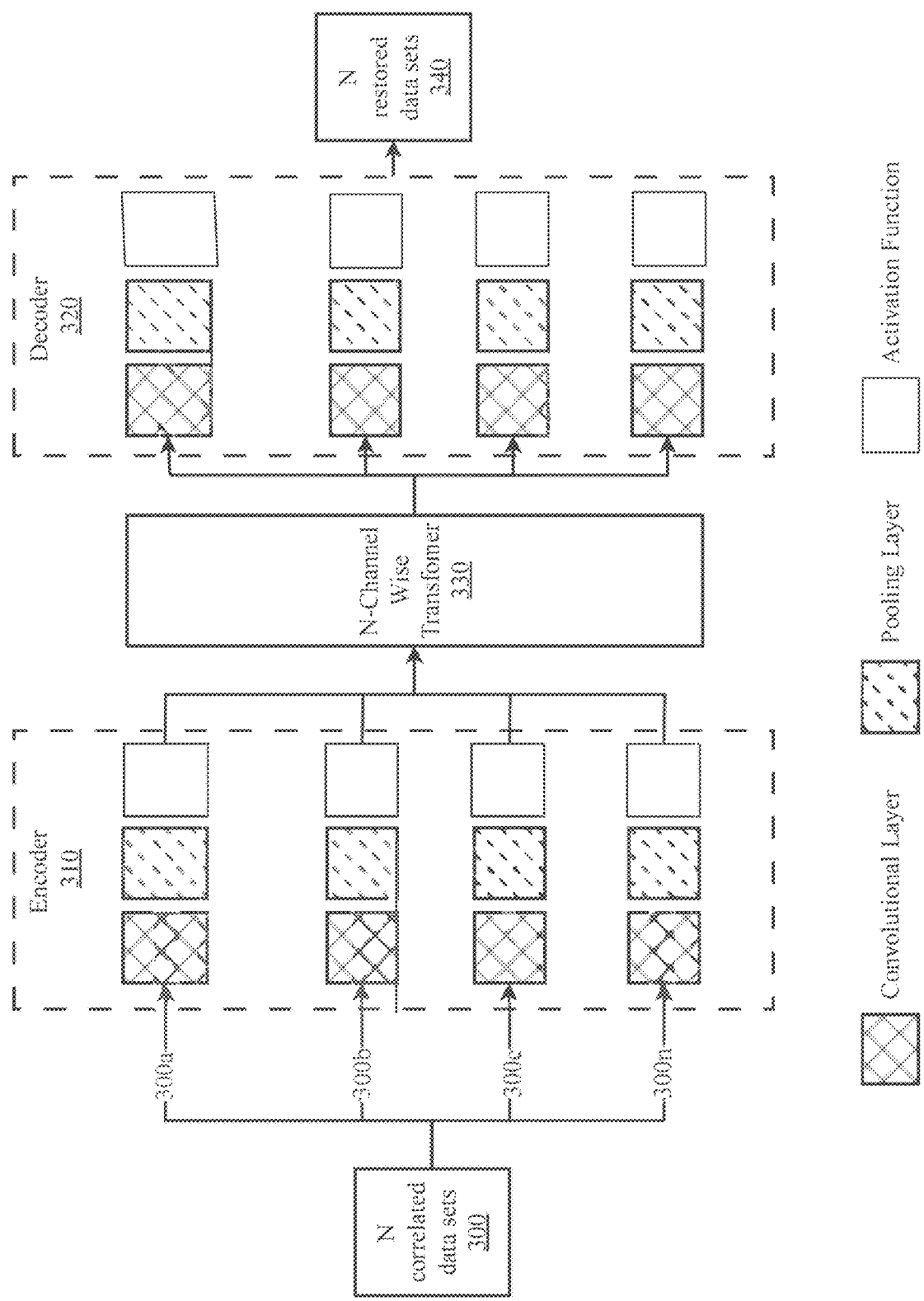
FIG. 3 is a block diagram illustrating an exemplary architecture for a subsystem of the system for compressing and restoring data using multi-level autoencoders and correlation networks, a correlation network.

FIG. 3 is a block diagram illustrating an exemplary architecture for a subsystem of the system for compressing and restoring data using multi-level autoencoders and correlation networks, a correlation network. The correlation network 160 is designed to enhance the reconstruction of decompressed data by leveraging correlations and patterns within the data. The correlation network 160 may also be referred to as a neural upsampler. The correlation network 160 comprises a plurality of correlation network elements that work together to capture and utilize the correlations for improved data reconstruction. Each correlation network element within the correlation network 160 contributes to the correlation learning and data reconstruction process. These elements include, but are not limited to, convolutional layers, skip connections, pooling layers and activation functions such as but not limited to, rectified linear unit functions or sigmoid functions.

The convolutional layers are responsible for extracting meaningful features from the input data. They apply convolutional operations using learnable filters to capture spatial patterns and hierarchical representations of the data. The convolutional layers can have different numbers of filters, kernel sizes, and strides to capture features at various scales and resolutions. Skip connections are employed to facilitate the flow of information across different layers of the autoencoder. Skip connections allow the output of a layer to be directly added to the output of a subsequent layer, enabling the network to learn residual mappings and mitigate the vanishing gradient problem. Skip connections help in preserving fine-grained details and improving the training stability of the autoencoder.

Pooling layers are used to downsample the feature maps generated by the convolutional layers. They reduce the spatial dimensions of the feature maps while retaining the most salient information. Common pooling operations include but are not limited to max pooling and average pooling. Pooling layers help in achieving translation invariance, reducing computational complexity, and controlling the receptive field of the autoencoder. Rectified Linear Unit (ReLU) functions introduce non-linearity into the autoencoder by applying a ReLU activation function element-wise to the output of the previous layer. ReLU functions help in capturing complex patterns and relationships in the data by allowing the network to learn non-linear transformations. They also promote sparsity and alleviate the vanishing gradient problem.

In one embodiment, the correlation network 160 may comprise an encoder 310, a decoder 320, an N number of correlated data sets 300, an N number-channel wise transformer 330, and an N number of restored data sets 340. Additionally, the correlation network 160 may be comprised of a plurality of convolutional layers, pooling layers, and activation functions. In one embodiment, the correlation network 160 may be configured to receive N correlated data sets 300 where each correlated data set includes a plurality of decompressed data points. In one embodiment, the correlation network 160 may be configured to receive four correlated data sets as an input. The correlated data sets may have been organized by a decompressed output organizer 190 to maximize the similarities between the data points in each set. One data set, 300, may include data points 300*a*, 300*b*, 300*c*, through 300*n*, where the decompressed output organizer 190 has determined the N number of data points are similar enough to be grouped together. The correlation network 160 may then receive and process full data sets at a time. In FIG. 3, the data is processed through an encoder 310 by passing through a convolutional layer, a pooling layer, and an activation function.

Activation functions introduce non-linearity into the network, enabling it to learn and represent complex patterns and relationships in the data. Common activation functions include but are not limited to sigmoid, tanh, ReLU (Rectified Linear Unit), and its variants. These functions have different properties and are chosen based on the specific requirements of the task and the network architecture. For example, ReLU is widely used in deep neural networks due to its ability to alleviate the vanishing gradient problem and promote sparsity in the activations. By applying activation functions, the neural network can learn capture non-linear relationships in the data, enabling it to model complex patterns and make accurate predictions or decisions.

The encoder 310 breaks the decompressed outputs passed by the decompressed output organizer 190 down into smaller representations of the original data sets. Following the encoder the data may pass through a transformer 330. A transformer is a type of neural network architecture that may rely on a self-attention mechanism which allows the model to weigh the importance of different parts of the input sequence when processing each element. This enables the transformer to capture dependencies and relationships between elements in the sequence efficiently. After being processed by a transformer 330, the data sets may be further processed by a decoder 320 which restores the smaller representations back into the original decompressed data sets. The decoder 320 may have a similar composition as the encoder 310, but reversed, to undo the operations performed on the data sets by the encoder 310. The transformer 330 may identify important aspects in each group of decompressed data passed through the correlation network which allows the decoder 320 to rebuild a more complete version of the original decompressed data sets. The decoder 320 may output an N number of restored data sets 340 which correspond to the N number of correlated data sets 300 originally passed through the correlation network 170.

Figure 4:
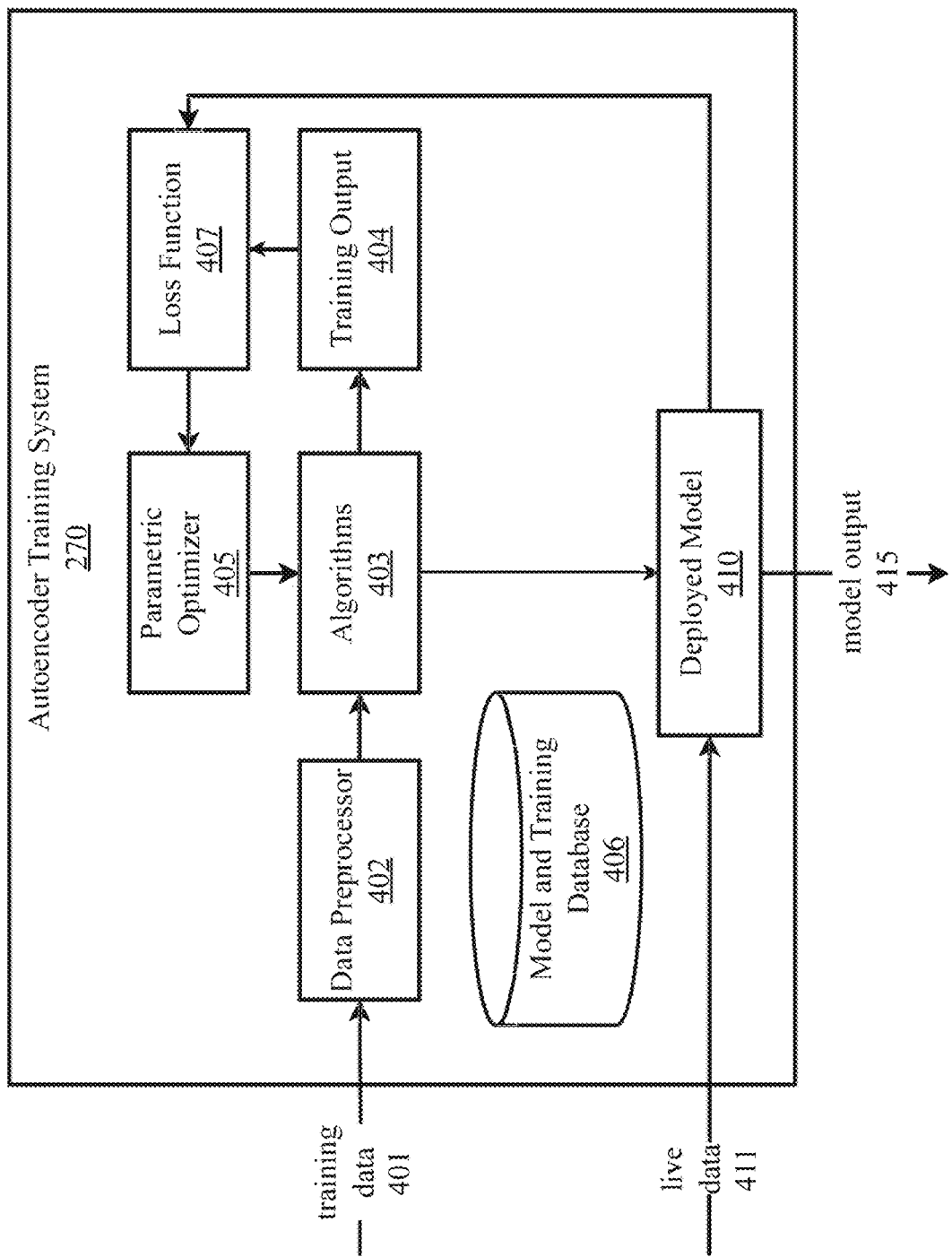
FIG. 4 is a block diagram illustrating an exemplary architecture for a subsystem of the system for compressing and restoring data using multi-level autoencoders and correlation networks, an autoencoder training system.

FIG. 4 is a block diagram illustrating an exemplary aspect of a platform for a subsystem of the system for compressing and restoring data using multi-level autoencoders and correlation networks, an autoencoder training system 270. According to the embodiment, the autoencoder training system 270 may comprise a model training stage comprising a data preprocessor 402, one or more machine and/or deep learning algorithms 403, training output 404, and a parametric optimizer 405, and a model deployment stage comprising a deployed and fully trained model 410 configured to perform tasks described herein such as transcription, summarization, agent coaching, and agent guidance. Autoencoder training system 270 may be used to train and deploy a multi-layer autoencoder network in order to support the services provided by the compression and restoration system.

At the model training stage, a plurality of training data 401 may be received at the autoencoder training system 270. In some embodiments, the plurality of training data may be obtained from one or more storage systems and/or directly from various information sources. In a use case directed to hyperspectral images, a plurality of training data may be sourced from data collectors including but not limited to satellites, airborne sensors, unmanned aerial vehicles, ground-based sensors, and medical devices. Hyperspectral data refers to data that includes wide ranges of the electromagnetic spectrum. It could include information in ranges including but not limited to the visible spectrum and the infrared spectrum. Data preprocessor 402 may receive the input data (e.g., hyperspectral data) and perform various data preprocessing tasks on the input data to format the data for further processing. For example, data preprocessing can include, but is not limited to, tasks related to data cleansing, data deduplication, data normalization, data transformation, handling missing values, feature extraction and selection, mismatch handling, and/or the like. Data preprocessor 402 may also be configured to create training dataset, a validation dataset, and a test set from the plurality of input data 401. For example, a training dataset may comprise 80% of the preprocessed input data, the validation set 10%, and the test dataset may comprise the remaining 10% of the data. The preprocessed training dataset may be fed as input into one or more machine and/or deep learning algorithms 403 to train a predictive model for object monitoring and detection.

During model training, training output 404 is produced and used to measure the quality and efficiency of the compressed outputs. During this process a parametric optimizer 405 may be used to perform algorithmic tuning between model training iterations. Model parameters and hyperparameters can include, but are not limited to, bias, train-test split ratio, learning rate in optimization algorithms (e.g., gradient descent), choice of optimization algorithm (e.g., gradient descent, stochastic gradient descent, of Adam optimizer, etc.), choice of activation function in a neural network layer (e.g., Sigmoid, ReLU, Tanh, etc.), the choice of cost or loss function the model will use, number of hidden layers in a neural network, number of activation unites in each layer, the drop-out rate in a neural network, number of iterations (epochs) in a training the model, number of clusters in a clustering task, kernel or filter size in convolutional layers, pooling size, batch size, the coefficients (or weights) of linear or logistic regression models, cluster centroids, and/or the like. Parameters and hyperparameters may be tuned and then applied to the next round of model training. In this way, the training stage provides a machine learning training loop.

In some implementations, various accuracy metrics may be used by the autoencoder training system 270 to evaluate a model's performance. Metrics can include, but are not limited to, compression ratio, the amount of data lost, the size of the compressed file, and the speed at which data is compressed, to name a few. In one embodiment, the system may utilize a loss function 407 to measure the system's performance. The loss function 407 compares the training outputs with an expected output and determined how the algorithm needs to be changed in order to improve the quality of the model output. During the training stage, all outputs may be passed through the loss function 407 on a continuous loop until the algorithms 403 are in a position where they can effectively be incorporated into a deployed model 415.

The test dataset can be used to test the accuracy of the model outputs. If the training model is compressing or decompressing data to the user's preferred standards, then it can be moved to the model deployment stage as a fully trained and deployed model 410 in a production environment compressing or decompressing live input data 411 (e.g., hyperspectral data). Further, model compressions or decompressions made by deployed model can be used as feedback and applied to model training in the training stage, wherein the model is continuously learning over time using both training data and live data and predictions.

A model and training database 406 is present and configured to store training/test datasets and developed models. Database 406 may also store previous versions of models. According to some embodiments, the one or more machine and/or deep learning models may comprise any suitable algorithm known to those with skill in the art including, but not limited to: LLMs, generative transformers, transformers, supervised learning algorithms such as: regression (e.g., linear, polynomial, logistic, etc.), decision tree, random forest, k-nearest neighbor, support vector machines, Naïve-Bayes algorithm; unsupervised learning algorithms such as clustering algorithms, hidden Markov models, singular value decomposition, and/or the like. Alternatively, or additionally, algorithms 403 may comprise a deep learning algorithm such as neural networks (e.g., recurrent, convolutional, long short-term memory networks, etc.). In some implementations, the autoencoder training system 270 automatically generates standardized model scorecards for each model produced to provide rapid insights into the model and training data, maintain model provenance, and track performance over time. These model scorecards provide insights into model framework(s) used, training data, training data specifications such as chip size, stride, data splits, baseline hyperparameters, and other factors. Model scorecards may be stored in database(s) 406.

Figure 5:
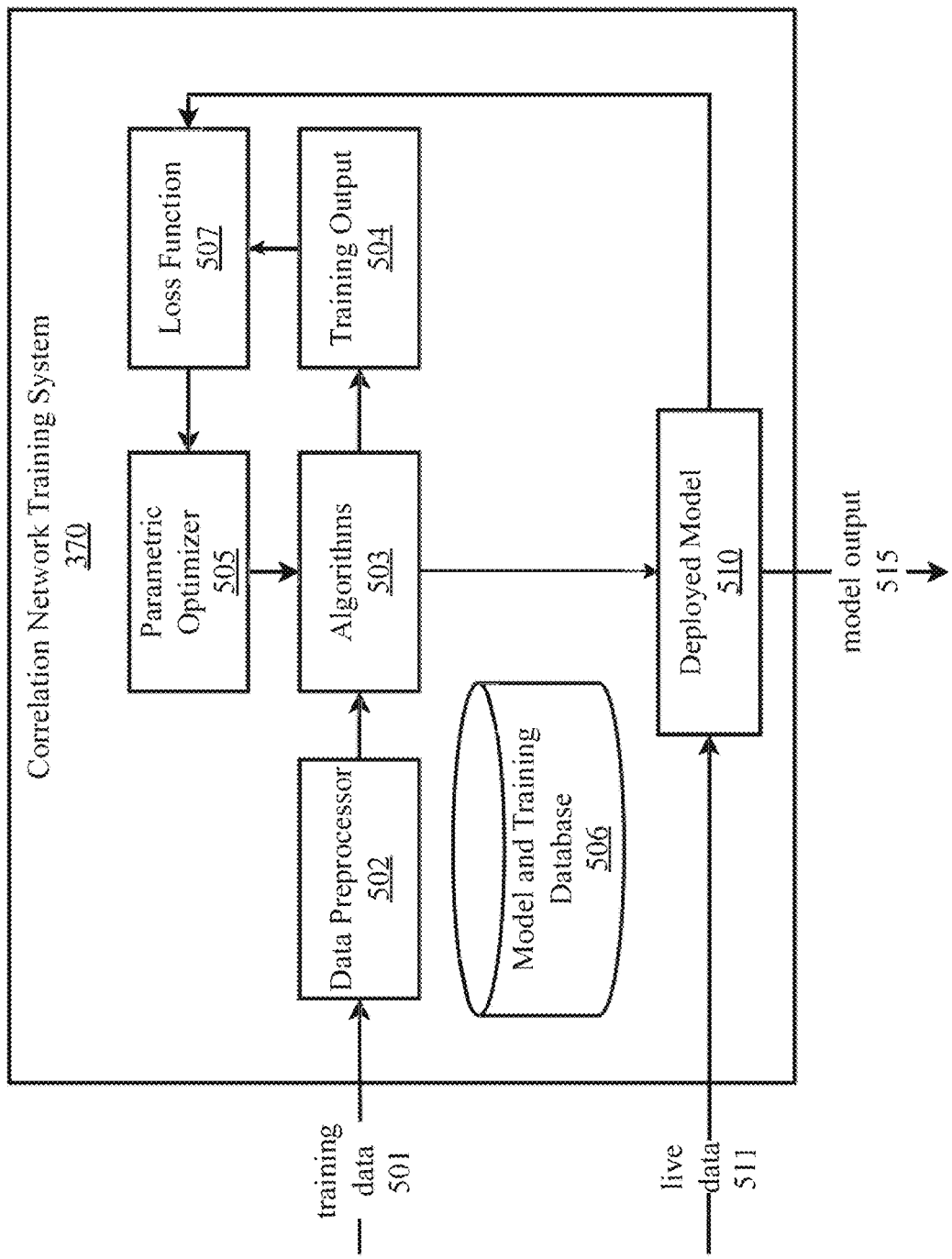
FIG. 5 is a block diagram illustrating an exemplary architecture for a subsystem of the system for compressing and restoring data using multi-level autoencoders and correlation networks, correlation network training system.

FIG. 5 is a block diagram illustrating an exemplary aspect of a subsystem of the system for compressing and restoring data using multi-level autoencoders and correlation networks, a correlation network training system 370. According to the embodiment, correlation network training system 370 may comprise a model training stage comprising a data preprocessor 502, one or more machine and/or deep learning algorithms 503, training output 504, and a parametric optimizer 505, and a model deployment stage comprising a deployed and fully trained model 510 configured to perform tasks described herein such determining correlations between compressed data sets. The correlation network training system 370 may be used to train and deploy the correlation network 300 in order to support the services provided by the compression and decompression system.

At the model training stage, a plurality of training data 501 may be received by the correlation network training system 370. In some embodiments, the plurality of training data may be obtained from one or more storage systems and/or directly from the compression network 131. In some embodiments, the correlation network training system may obtain data sets from a vector grouping system. In a use case directed to hyperspectral data sets, a plurality of decompressed training data may be sourced from a hyperspectral data compression system. Data preprocessor 502 may receive the input data (e.g., decompressed hyperspectral data) and perform various data preprocessing tasks on the input data to format the data for further processing. For example, data preprocessing can include, but is not limited to, tasks related to data cleansing, data deduplication, data normalization, data transformation, handling missing values, feature extraction and selection, mismatch handling, and/or the like. Data preprocessor 502 may also be configured to create training dataset, a validation dataset, and a test set from the plurality of input data 501. For example, a training dataset may comprise 80% of the preprocessed input data, the validation set 10%, and the test dataset may comprise the remaining 10% of the data. The preprocessed training dataset may be fed as input into one or more machine and/or deep learning algorithms 503 to train a predictive model for object monitoring and detection.

During model training, training output 504 is produced and used to measure the accuracy and usefulness of the predictive outputs. During this process a parametric optimizer 505 may be used to perform algorithmic tuning between model training iterations. Model parameters and hyperparameters can include, but are not limited to, bias, train-test split ratio, learning rate in optimization algorithms (e.g., gradient descent), choice of optimization algorithm (e.g., gradient descent, stochastic gradient descent, of Adam optimizer, etc.), choice of activation function in a neural network layer (e.g., Sigmoid, ReLU, Tanh, etc.), the choice of cost or loss function the model will use, number of hidden layers in a neural network, number of activation unites in each layer, the drop-out rate in a neural network, number of iterations (epochs) in a training the model, number of clusters in a clustering task, kernel or filter size in convolutional layers, pooling size, batch size, the coefficients (or weights) of linear or logistic regression models, cluster centroids, and/or the like. Parameters and hyperparameters may be tuned and then applied to the next round of model training. In this way, the training stage provides a machine learning training loop.

In some implementations, various accuracy metrics may be used by a machine learning engine to evaluate a model's performance. Metrics can include, but are not limited to, word error rate (WER), word information loss, speaker identification accuracy (e.g., single stream with multiple speakers), inverse text normalization and normalization error rate, punctuation accuracy, timestamp accuracy, latency, resource consumption, custom vocabulary, sentence-level sentiment analysis, multiple languages supported, cost-to-performance tradeoff, and personal identifying information/payment card industry redaction, to name a few. In one embodiment, the system may utilize a loss function 507 to measure the system's performance. The loss function 507 compares the training outputs with an expected output and determined how the algorithm needs to be changed in order to improve the quality of the model output. During the training stage, all outputs may be passed through the loss function 507 on a continuous loop until the algorithms 503 are in a position where they can effectively be incorporated into a deployed model 515.

The test dataset can be used to test the accuracy of the model outputs. If the training model is establishing correlations that satisfy a certain criterion such as but not limited to quality of the correlations and amount of restored lost data, then it can be moved to the model deployment stage as a fully trained and deployed model 510 in a production environment making predictions based on live input data 511 (e.g., compressed hyperspectral data). Further, model correlations and restorations made by deployed model can be used as feedback and applied to model training in the training stage, wherein the model is continuously learning over time using both training data and live data and predictions. A model and training database 506 is present and configured to store training/test datasets and developed models. Database 506 may also store previous versions of models.

According to some embodiments, the one or more machine and/or deep learning models may comprise any suitable algorithm known to those with skill in the art including, but not limited to: LLMs, generative transformers, transformers, supervised learning algorithms such as: regression (e.g., linear, polynomial, logistic, etc.), decision tree, random forest, k-nearest neighbor, support vector machines, Naïve-Bayes algorithm; unsupervised learning algorithms such as clustering algorithms, hidden Markov models, singular value decomposition, and/or the like. Alternatively, or additionally, algorithms 503 may comprise a deep learning algorithm such as neural networks (e.g., recurrent, convolutional, long short-term memory networks, etc.).

In some implementations, the correlation network training system 270 automatically generates standardized model scorecards for each model produced to provide rapid insights into the model and training data, maintain model provenance, and track performance over time. These model scorecards provide insights into model framework(s) used, training data, training data specifications such as chip size, stride, data splits, baseline hyperparameters, and other factors. Model scorecards may be stored in database(s) 506.

DETAILED DESCRIPTION OF EXEMPLARY ASPECTS

Figure 6:
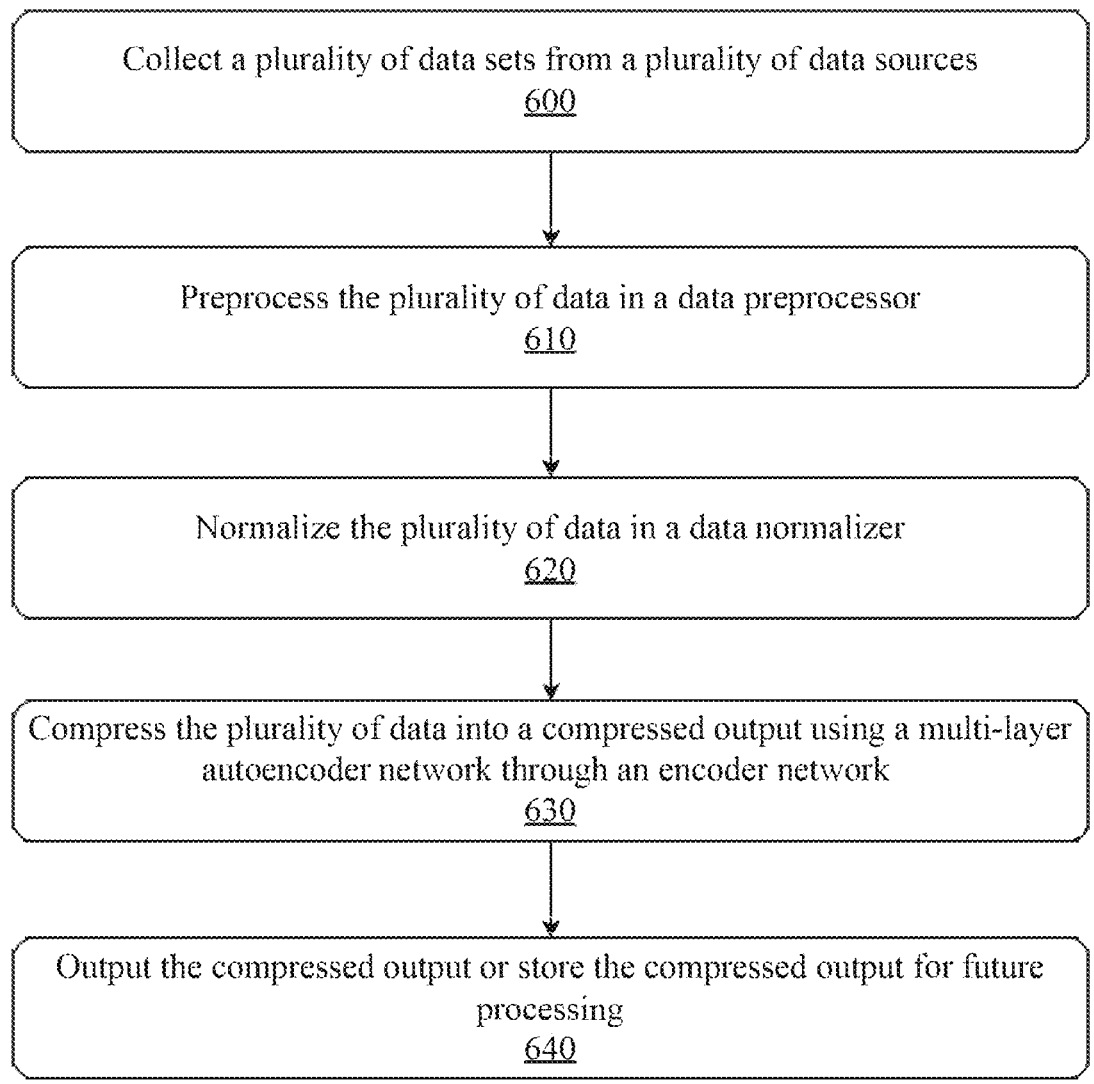
FIG. 6 is a flow diagram illustrating an exemplary method for compressing a data input using a system for compressing and restoring data using multi-level autoencoders and correlation networks.

FIG. 6 is a flow diagram illustrating an exemplary method for compressing a data input using a system for compressing and restoring data using multi-level autoencoders and correlation networks. In a first step 600, a plurality of data sets is collected from a plurality of data sources. These data sources can include various sensors, devices, databases, or any other systems that generate or store data. The data sets may be heterogeneous in nature, meaning they can have different formats, structures, or modalities. For example, the data sets can include images, videos, audio recordings, time-series data, numerical data, or textual data. The collection process involves acquiring the data sets from their respective sources and bringing them into a centralized system for further processing.

In a step 610, the collected data sets are preprocessed using a data preprocessor. The data preprocessor may be responsible for cleaning, transforming, and preparing the data sets for subsequent analysis and compression. Preprocessing tasks may include but are not limited to data cleansing, data integration, data transformation, and feature extraction. Data cleansing involves removing or correcting any erroneous, missing, or inconsistent data points. Data integration combines data from multiple sources into a unified format. Data transformation converts the data into a suitable representation for further processing, such as scaling, normalization, or encoding categorical variables. Feature extraction identifies and selects relevant features or attributes from the data sets that are most informative for the given task.

A step 620 involves normalizing the preprocessed data sets using a data normalizer. Normalization is a step that brings the data into a common scale and range. It helps to remove any biases or inconsistencies that may exist due to different units or scales of measurement. The data normalizer applies various normalization techniques, such as min-max scaling, z-score normalization, or unit vector normalization, depending on the nature of the data and the requirements of the subsequent compression step. Normalization ensures that all the data sets have a consistent representation and can be compared and processed effectively.

In a step 630, the normalized data sets are compressed into a compressed output using a multi-layer autoencoder network. The multi-layer autoencoder network is a deep learning model designed to learn compact and meaningful representations of the input data. It consists of an encoder network and a decoder network. The encoder network takes the normalized data sets as input and progressively compresses them through a series of layers, such as but not limited to convolutional layers, pooling layers, and fully connected layers. The compressed representation is obtained at the bottleneck layer of the encoder network, which has a significantly reduced dimensionality compared to the original data. The multi-layer autoencoder network may utilize a plurality of encoder networks to achieve optimal compression performance. These encoder networks can include different architectures, loss functions, or optimization techniques. The choice of compression technique depends on the specific characteristics and requirements of the data sets being compressed. During the compression process, the multi-layer autoencoder network learns to capture the essential features and patterns present in the data sets while discarding redundant or irrelevant information. It aims to minimize the reconstruction error between the original data and the reconstructed data obtained from the compressed representation. In step 640, the compressed output generated by the multi-layer autoencoder network is either outputted or stored for future processing. The compressed output represents the compact and informative representation of the original data sets. It can be transmitted, stored, or further analyzed depending on the specific application or use case. The compressed output significantly reduces the storage and transmission requirements compared to the original data sets, making it more efficient for downstream tasks.

Figure 7:
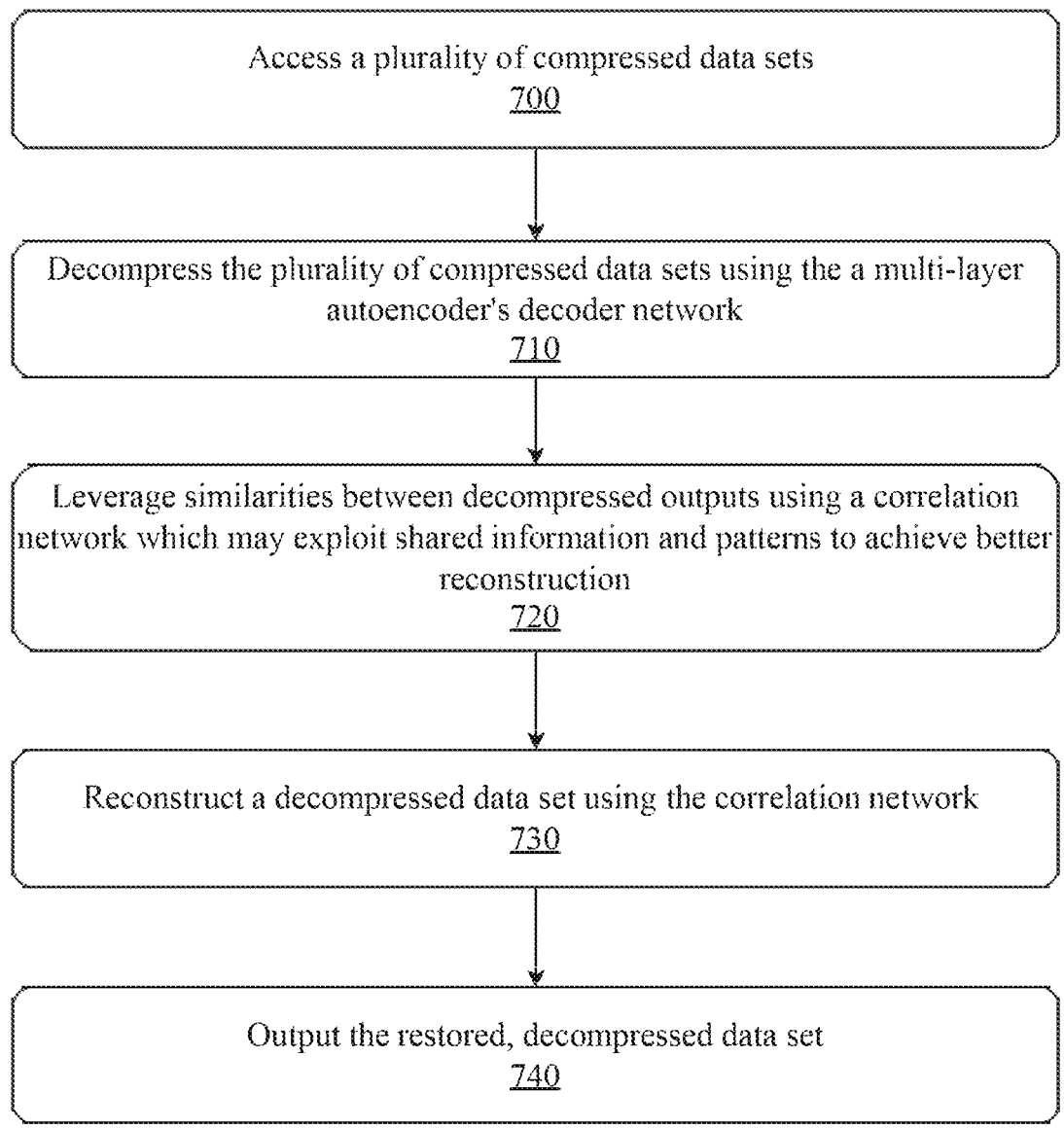
FIG. 7 is a flow diagram illustrating an exemplary method for decompressing a compressed data input using a system for compressing and restoring data using multi-level autoencoders and correlation networks.

FIG. 7 is a flow diagram illustrating an exemplary method for decompressing a compressed data input using a system for compressing and restoring data using multi-level autoencoders and correlation networks. In a first step, 700, access a plurality of compressed data sets. In a step 710, decompress the plurality of compressed data sets using a multi-layer autoencoder's decoder network. The decoder network is responsible for mapping the latent space vectors back to the original data space. The decoder network may include techniques such as transposed convolutions, upsampling layers, or generative models, depending on the specific requirements of the data and the compression method used.

Step 720 includes leveraging the similarities between decompressed outputs using a correlation network, which may exploit shared information and patterns to achieve a better reconstruction. The correlation network is a deep learning model specifically designed to exploit the shared information and patterns among the compressed data sets. It takes the organized decompressed data sets as input and learns to capture the correlations and dependencies between them. The correlation network may consist of multiple layers, such as convolutional layers, recurrent layers, or attention mechanisms, which enable it to effectively model the relationships and similarities among the compressed data sets.

In a step 730, the compressed data sets are reconstructed using the correlation network. The reconstruction process in step 730 combines the capabilities of the correlation network and the decompression systems. The correlation network provides the enhanced and refined latent space representations, while the decompression systems use these representations to generate the reconstructed data. In a step 740, the restored, decompressed data set is outputted. The restored data set represents the reconstructed version of the original data, which includes recovered information lost during the compression process. The outputted data set more closely resembles the original data than would a decompressed output passed solely through a decoder network.

Figure 8:
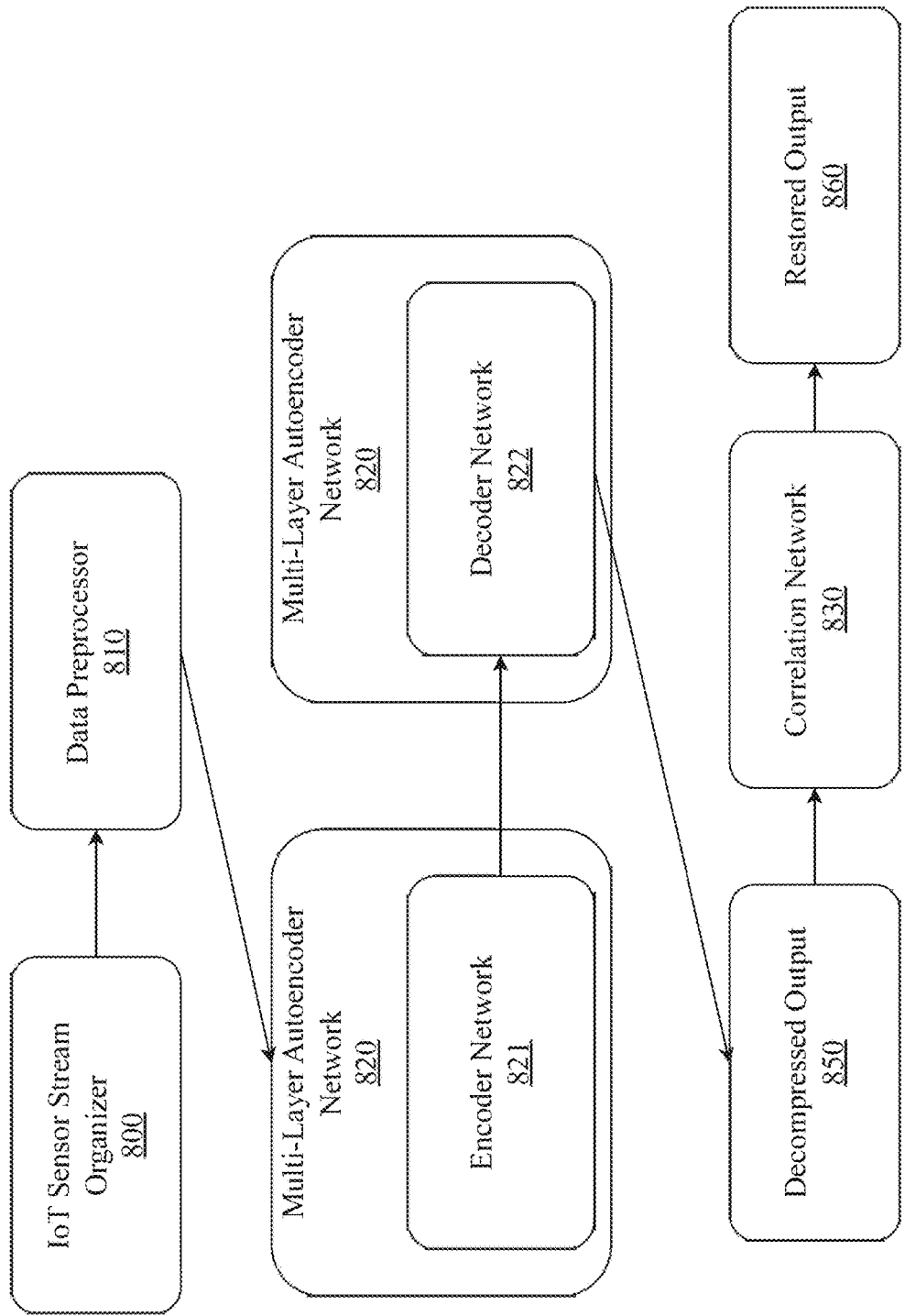
FIG. 8 is a block diagram illustrating an exemplary system architecture for compressing and restoring IoT sensor data using a system for compressing and restoring data using multi-level autoencoders and correlation networks.

FIG. 8 is a block diagram illustrating an exemplary system architecture for compressing and restoring IoT sensor data using a system for compressing and restoring data using multi-level autoencoders and correlation networks. The IoT Sensor Stream Organizer 800 is responsible for collecting and organizing data streams from various IoT sensors. It receives raw sensor data from multiple sources, such as but not limited to temperature sensors, humidity sensors, and accelerometers. The IoT Sensor Stream Organizer 800 may perform necessary preprocessing tasks, such as data cleaning, normalization, and synchronization, to ensure the data is in a suitable format for further processing. The preprocessed IoT sensor data is then passed to a data preprocessor 810. The data preprocessor 810 prepares the data for compression by transforming it into a latent space representation. It applies techniques such as feature extraction, dimensionality reduction, and data normalization to extract meaningful features and reduce the dimensionality of the data. The latent space representation captures the essential characteristics of the IoT sensor data while reducing its size.

The multi-layer autoencoder 820 is responsible for compressing and decompressing the latent space representation of the IoT sensor data. It consists of an encoder network 821 and a decoder network 822. The encoder network 821 takes the latent space representation as input and progressively compresses it through a series of layers, such as but not limited to convolutional layers, pooling layers, and fully connected layers. The compressed representation may pass through a bottleneck layer which transforms the original data to have a significantly reduced dimensionality compared to the original data. Further, the encoder network 821 manages the compression process and stores the compressed representation of the IoT sensor data. It determines the optimal compression settings based on factors such as the desired compression ratio, data characteristics, and available storage resources. The compressed representation is efficiently stored or transmitted, reducing the storage and bandwidth requirements for IoT sensor data.

The decoder network 822 is responsible for reconstructing the original IoT sensor data from the compressed representation. It utilizes the multi-layer autoencoder 820 to map the compressed representation back to the original data space. The decoder network consists of layers such as transposed convolutional layers, upsampling layers, and fully connected layers. It learns to reconstruct the original data by minimizing the reconstruction error between the decompressed output and the original IoT sensor data. The decompressed output 850 represents the decompressed IoT sensor data obtained from the decoder network 822. It closely resembles the original data and retains the essential information captured by the sensors, but includes some information lost during the compressed process. The decompressed output 850 may be further processed, analyzed, or utilized by downstream applications or systems.

To further enhance the compression and reconstruction quality, the system includes a correlation network 830. The correlation network 830 learns and exploits correlations and patterns within the IoT sensor data to improve the reconstruction process. It consists of multiple correlation layers that capture dependencies and relationships among different sensors or data streams. The correlation network 830 helps in preserving important information that may have been lost during the compression process. Following the identification of dependencies and relationships among different data streams, the correlation network 830 reconstruct a decompressed output 850 into a restored output 860 which recovers much of the data lost during the compression and decompression process.

The system may be trained using an end-to-end approach, where the multi-layer autoencoder 820 and the correlation network 830 are jointly optimized to minimize the reconstruction error and maximize the compression ratio. The training process may involves feeding the IoT sensor data through the system, comparing the decompressed output with the original data, and updating the network parameters using backpropagation and gradient descent techniques. The proposed system offers several advantages for IoT sensor data compression. It achieves high compression ratios while preserving the essential information in the data. The multi-layer autoencoder 820 learns compact and meaningful representations of the data, exploiting spatial and temporal correlations. The correlation network 830 further enhances the compression quality by capturing dependencies and patterns within the data. Moreover, the system is adaptable and can handle various types of IoT sensor data, making it suitable for a wide range of IoT applications. It can be deployed on resource-constrained IoT devices or edge servers, reducing storage and transmission costs while maintaining data quality.

Figure 9:
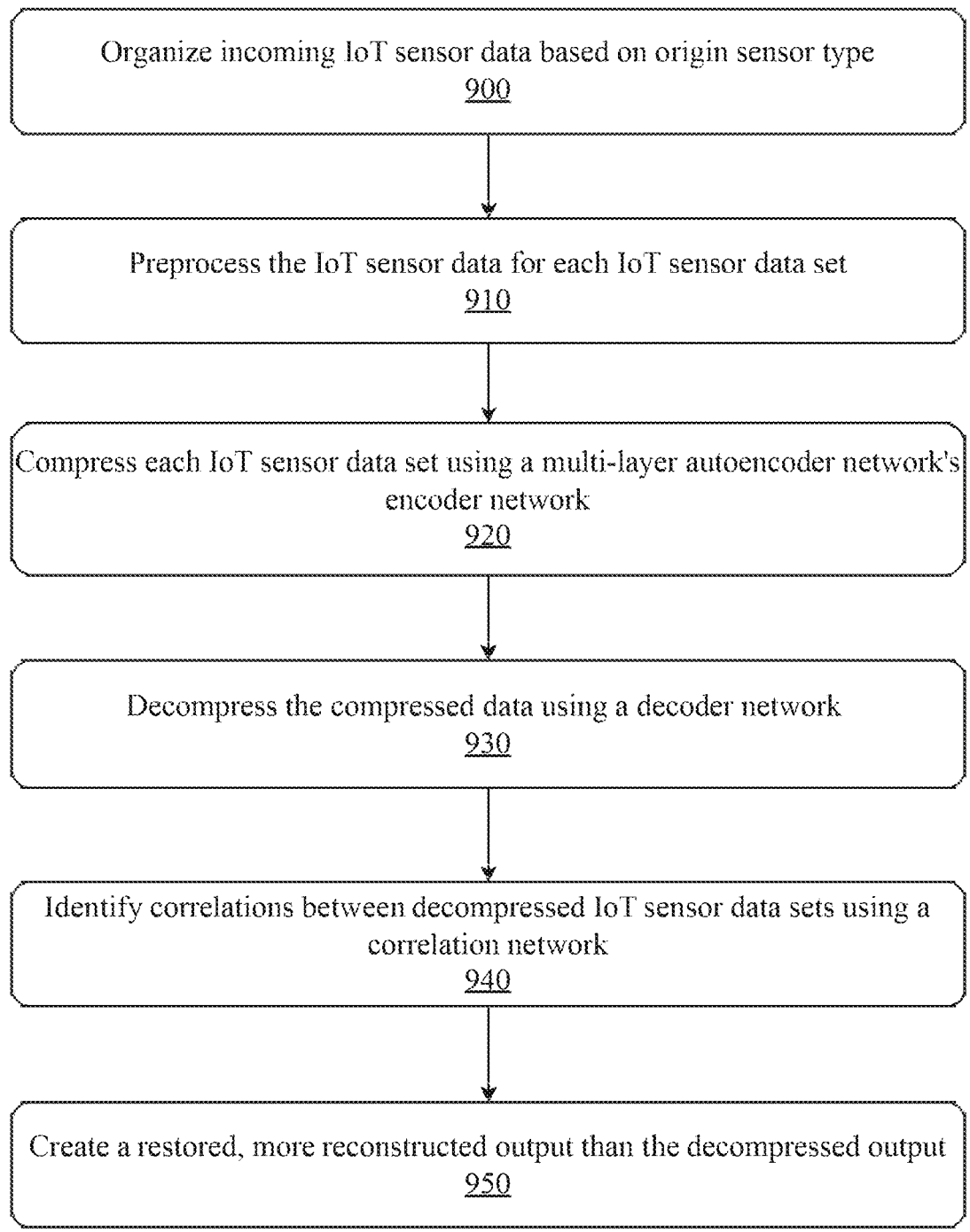
FIG. 9 is a flow diagram illustrating an exemplary method for compressing and decompressing IoT sensor data using a system for compressing and restoring data using multi-level autoencoders and correlation networks.

FIG. 9 is a flow diagram illustrating an exemplary method for compressing and decompressing IoT sensor data using a system for compressing and restoring data using multi-level autoencoders and correlation networks. In a first step 900, incoming IoT sensor data is organized based on its origin sensor type. IoT sensor data can be generated from various types of sensors, such as but not limited to temperature sensors, humidity sensors, pressure sensors, accelerometers, or any other sensors deployed in an IoT network. Each sensor type captures specific measurements or data points relevant to its function. The organization step involves categorizing and grouping the incoming IoT sensor data based on the type of sensor it originated from. This step helps to maintain a structured and organized representation of the data, facilitating subsequent processing and analysis.

In a step 910, the latent space vectors for each IoT sensor data set are preprocessed. Latent space vectors are lower-dimensional representations of the original data that capture the essential features and patterns. Preprocessing the latent space vectors involves applying various techniques to ensure data quality, consistency, and compatibility. This may include but is not limited to data cleaning, normalization, feature scaling, or dimensionality reduction. The preprocessing step aims to remove any noise, outliers, or inconsistencies in the latent space vectors and prepare them for the compression process.

A step 920 involves compressing each IoT sensor data set using a multi-layer autoencoder network. The multi-layer autoencoder network is a deep learning model designed to learn compact and meaningful representations of the input data. It may comprise an encoder network and a decoder network. The encoder network takes the preprocessed latent space vectors as input and progressively compresses them through a series of layers, such as convolutional layers, pooling layers, and fully connected layers. The compressed representation is obtained at the bottleneck layer of the encoder network, which has a significantly reduced dimensionality compared to the original data. The multi-layer autoencoder network may include a compression system that specifically handles the compression of IoT sensor data. The compression system can employ various techniques, such as quantization, entropy coding, or sparse representations, to achieve efficient compression while preserving the essential information in the data. The compression system outputs a compressed IoT sensor data set, which is a compact representation of the original data. In step 930, the original IoT sensor data is decompressed using a decoder network. The decoder network is responsible for reconstructing the original data from the compressed representation. It takes the compressed IoT sensor data sets and applies a series of decompression operations, such as transposed convolutions or upsampling layers, to map the compressed data back to its original dimensionality.

In a step 940, correlations between compressed IoT sensor data sets are identified using a correlation network. The correlation network is a separate deep learning model that learns to capture the relationships and dependencies among different compressed IoT sensor data sets. It takes the decompressed data sets as input and identifies patterns, similarities, and correlations among them. The correlation network can utilize techniques such as convolutional layers, attention mechanisms, or graph neural networks to effectively model the interactions and dependencies between the compressed data sets. The identified correlations provide valuable insights into how different IoT sensor data sets are related and how they influence each other. These correlations can be used to improve the compression efficiency and enhance the restoration quality of the data.

In a step 950, the correlation network creates a restored, more reconstructed version of the decompressed output. By leveraging correlations between decompressed outputs, the correlation network is able to recover a large portion of information lost during the compression and decompression process. The restored, reconstructed output is similar to the decompressed output and the original input, but recovers information that may have been missing in the decompressed output.

Figure 10:
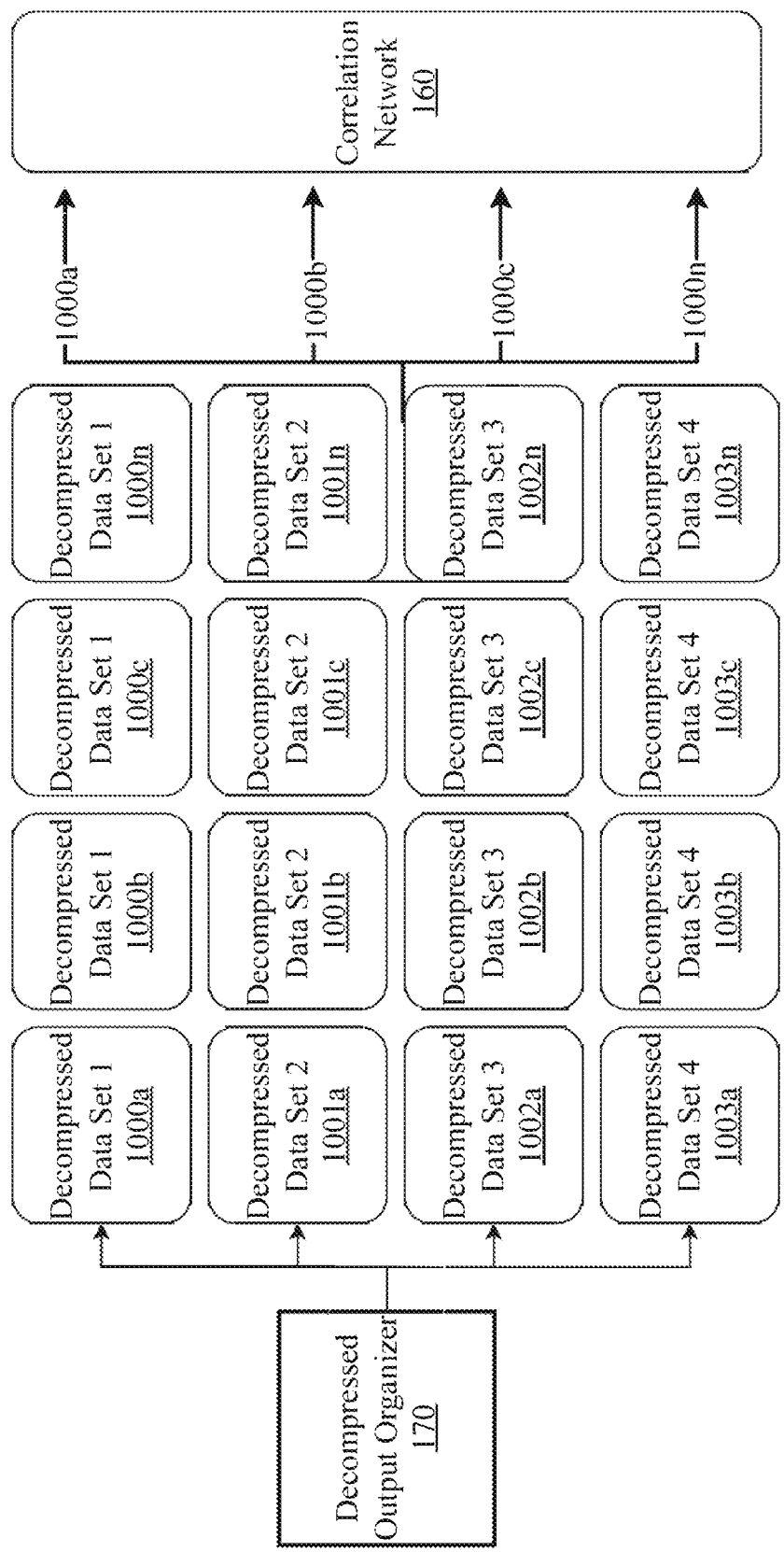
FIG. 10 is a block diagram illustrating an exemplary system architecture for a subsystem of the system for compressing and restoring data using multi-level autoencoders and correlation networks, the decompressed output organizer.

FIG. 10 is a block diagram illustrating an exemplary system architecture for a subsystem of the system for compressing and restoring data using multi-level autoencoders and correlation networks, the decompressed output organizer. In one embodiment, the decompressed output organizer 190 may create a matrix of n by n data sets where each data sets represents a decompressed set of information. In the embodiment depicted, the decompressed output organizer 190 outputs a 4 by 4 matrix of decompressed data sets. The organizer 190 may organizer the decompressed data sets into groups based on how correlated each data set is to each other. For example, decompressed data set 1 which includes 1000$a$, 1000$b$, 1000$c$, and 1000$n$, is a set of four data sets that the decompressed output organizer 190 has determined to be highly correlated. The same is true for decompressed data sets 2, 3, and 4.

The decompressed output organizer primes the correlation network 160 to receive an already organizer plurality of inputs. The correlation network may take a plurality of decompressed data sets as its input, depending on the size of the organized matrix produced by the decompressed output organizer 190. For example, in the embodiment depicted in FIG. 10, the decompressed output organizer 190 produces a 4 by 4 matrix of data sets. The correlation network in turn receives a 4-element data set as its input. If decompressed data set 1 were to be processed by the correlation network 160, the correlation network 160 may take 1000$a$, 1000$b$, 1000$c$, and 1000$n$, as the inputs and process all four data sets together. By clustering data sets together into groups based on how correlated they are, the decompressed output organizer 190 allows the correlation network 160 to produce more outputs that better encompass the original pre-compressed and decompressed data sets. More information may be recovered by the correlation network 160 when the inputs are already highly correlated.

Figure 11:
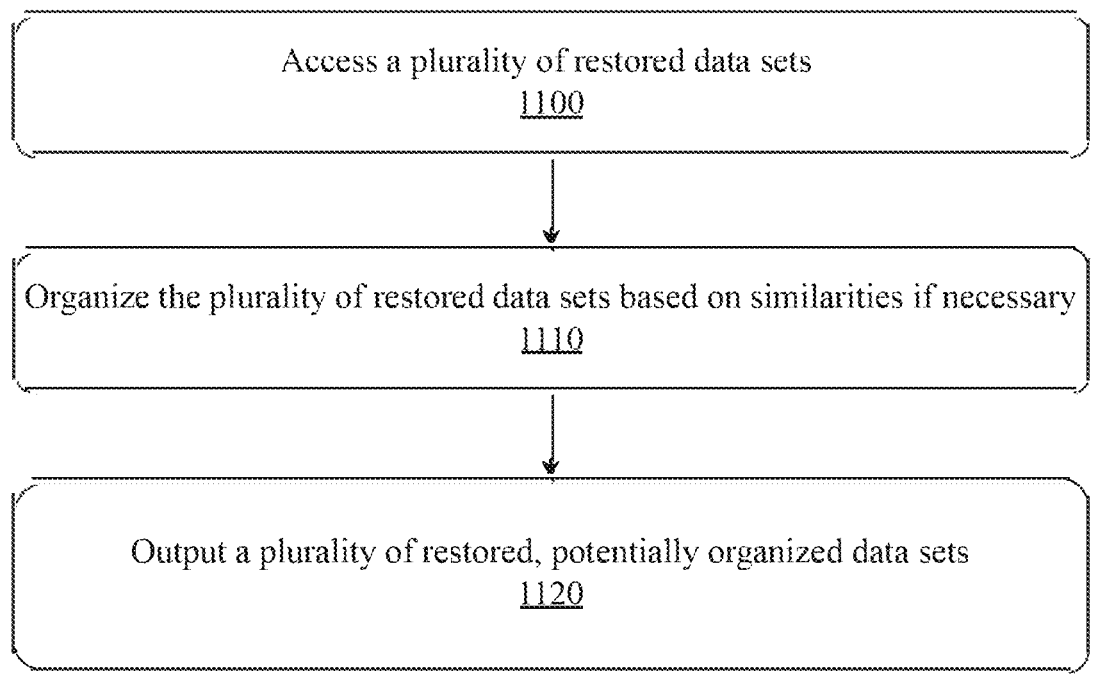
FIG. 11 is a flow diagram illustrating an exemplary method for organizing restored, decompressed data sets after correlation network processing.

FIG. 11 is a flow diagram illustrating an exemplary method for organizing restored, decompressed data sets after correlation network processing. In a first step 1100, access a plurality of restored data sets. In a step 1110, organize the plurality of restored data sets based on similarities if necessary. In a step 1120, output a plurality of restored, potentially organizer data sets. This method essentially reassesses the organizational grouping performed by the decompressed output organizer 190. The correlation network 160 may output a matrix where the matrix contains a plurality of restored, decompressed data sets. The final output of the system may reorganize the restored, decompressed data sets within the outputted matrix based on user preference and the correlations between each data set within the matrix.

Exemplary Computing Environment

Figure 12:
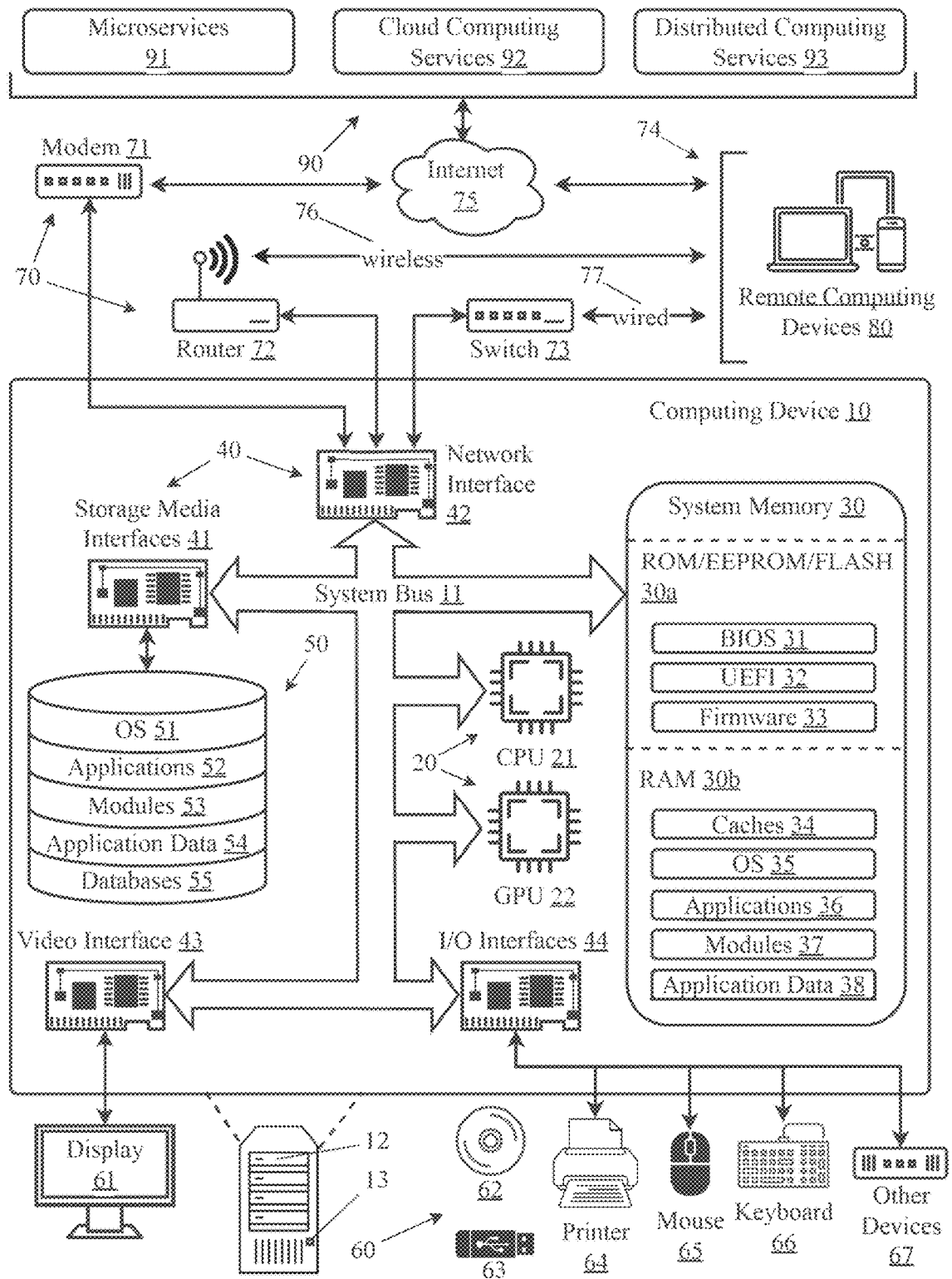
FIG. 12 illustrates an exemplary computing environment on which an embodiment described herein may be implemented, in full or in part.

FIG. 12 illustrates an exemplary computing environment on which an embodiment described herein may be implemented, in full or in part. This exemplary computing environment describes computer-related components and processes supporting enabling disclosure of computer-implemented embodiments. Inclusion in this exemplary computing environment of well-known processes and computer components, if any, is not a suggestion or admission that any embodiment is no more than an aggregation of such processes or components. Rather, implementation of an embodiment using processes and components described in this exemplary computing environment will involve programming or configuration of such processes and components resulting in a machine specially programmed or configured for such implementation. The exemplary computing environment described herein is only one example of such an environment and other configurations of the components and processes are possible, including other relationships between and among components, and/or absence of some processes or components described. Further, the exemplary computing environment described herein is not intended to suggest any limitation as to the scope of use or functionality of any embodiment implemented, in whole or in part, on components or processes described herein.

The exemplary computing environment described herein comprises a computing device 10 (further comprising a system bus 11, one or more processors 20, a system memory 30, one or more interfaces 40, one or more non-volatile data storage devices 50), external peripherals and accessories 60, external communication devices 70, remote computing devices 80, and cloud-based services 90. The system memory 30 can include a computer readable storage medium.

System bus 11 couples the various system components, coordinating operation of and data transmission between those various system components. System bus 11 represents one or more of any type or combination of types of wired or wireless bus structures including, but not limited to, memory busses or memory controllers, point-to-point connections, switching fabrics, peripheral busses, accelerated graphics ports, and local busses using any of a variety of bus architectures. By way of example, such architectures include, but are not limited to, Industry Standard Architecture (ISA) busses, Micro Channel Architecture (MCA) busses, Enhanced ISA (EISA) busses, Video Electronics Standards Association (VESA) local busses, a Peripheral Component Interconnects (PCI) busses also known as a Mezzanine busses, or any selection of, or combination of, such busses. Depending on the specific physical implementation, one or more of the processors 20, system memory 30 and other components of the computing device 10 can be physically co-located or integrated into a single physical component, such as on a single chip. In such a case, some or all of system bus 11 can be electrical pathways within a single chip structure.

Computing device may further comprise externally-accessible data input and storage devices 12 such as compact disc read-only memory (CD-ROM) drives, digital versatile discs (DVD), or other optical disc storage for reading and/or writing optical discs 62; magnetic cassettes, magnetic tape, magnetic disk storage, or other magnetic storage devices; or any other medium which can be used to store the desired content and which can be accessed by the computing device 10. Computing device may further comprise externally-accessible data ports or connections 12 such as serial ports, parallel ports, universal serial bus (USB) ports, and infrared ports and/or transmitter/receivers. Computing device may further comprise hardware for wireless communication with external devices such as IEEE 1394 ("Firewire") interfaces, IEEE 802.11 wireless interfaces, BLUETOOTH® wireless interfaces, and so forth. Such ports and interfaces may be used to connect any number of external peripherals and accessories 60 such as visual displays, monitors, and touch-sensitive screens 61, USB solid state memory data storage drives (commonly known as "flash drives" or "thumb drives") 63, printers 64, pointers and manipulators such as mice 65, keyboards 66, and other devices 67 such as joysticks and gaming pads, touchpads, additional displays and monitors, and external hard drives (whether solid state or disc-based), microphones, speakers, cameras, and optical scanners.

Processors 20 are logic circuitry capable of receiving programming instructions and processing (or executing) those instructions to perform computer operations such as retrieving data, storing data, and performing mathematical calculations. Processors 20 are not limited by the materials from which they are formed or the processing mechanisms employed therein, but are typically comprised of semiconductor materials into which many transistors are formed together into logic gates on a chip (i.e., an integrated circuit or IC). The term processor includes any device capable of receiving and processing instructions including, but not limited to, processors operating on the basis of quantum computing, optical computing, mechanical computing (e.g., using nanotechnology entities to transfer data), and so forth. Depending on configuration, computing device 10 may comprise more than one processor. For example, computing device 10 may comprise one or more central processing units (CPUs) 21, each of which itself has multiple processors or multiple processing cores, each capable of independently or semi-independently processing programming instructions. Further, computing device 10 may comprise one or more specialized processors such as a graphics processing unit (GPU) 22 configured to accelerate processing of computer graphics and images via a large array of specialized processing cores arranged in parallel.

System memory 30 is processor-accessible data storage in the form of volatile and/or nonvolatile memory. System memory 30 may be either or both of two types: non-volatile memory and volatile memory. Non-volatile memory 30a is not erased when power to the memory is removed, and includes memory types such as read only memory (ROM), electronically-erasable programmable memory (EEPROM), and rewritable solid-state memory (commonly known as "flash memory"). Non-volatile memory 30a is typically used for long-term storage of a basic input/output system (BIOS) 31, containing the basic instructions, typically loaded during computer startup, for transfer of information between components within computing device, or a unified extensible firmware interface (UEFI), which is a modern replacement for BIOS that supports larger hard drives, faster boot times, more security features, and provides native support for graphics and mouse cursors. Non-volatile memory 30a may also be used to store firmware comprising a complete operating system 35 and applications 36 for operating computer-controlled devices. The firmware approach is often used for purpose-specific computer-controlled devices such as appliances and Internet-of-Things (IoT) devices where processing power and data storage space is limited. Volatile memory 30b is erased when power to the memory is removed and is typically used for short-term storage of data for processing. Volatile memory 30b includes memory types such as random-access memory (RAM), and is normally the primary operating memory into which the operating system 35, applications 36, program modules 37, and application data 38 are loaded for execution by processors 20. Volatile memory 30b is generally faster than non-volatile memory 30a due to its electrical characteristics and is directly accessible to processors 20 for processing of instructions and data storage and retrieval. Volatile memory 30b may comprise one or more smaller cache memories which operate at a higher clock speed and are typically placed on the same IC as the processors to improve performance.

Interfaces 40 may include, but are not limited to, storage media interfaces 41, network interfaces 42, display interfaces 43, and input/output interfaces 44. Storage media interface 41 provides the necessary hardware interface for loading data from non-volatile data storage devices 50 into system memory 30 and storage data from system memory 30 to non-volatile data storage device 50. Network interface 42 provides the necessary hardware interface for computing device 10 to communicate with remote computing devices 80 and cloud-based services 90 via one or more external communication devices 70. Display interface 43 allows for connection of displays 61, monitors, touchscreens, and other visual input/output devices. Display interface 43 may include a graphics card for processing graphics-intensive calculations and for handling demanding display requirements. Typically, a graphics card includes a graphics processing unit (GPU) and video RAM (VRAM) to accelerate display of graphics. One or more input/output (I/O) interfaces 44 provide the necessary support for communications between computing device 10 and any external peripherals and accessories 60. For wireless communications, the necessary radio-frequency hardware and firmware may be connected to I/O interface 44 or may be integrated into I/O interface 44.

Non-volatile data storage devices 50 are typically used for long-term storage of data. Data on non-volatile data storage devices 50 is not erased when power to the non-volatile data storage devices 50 is removed. Non-volatile data storage devices 50 may be implemented using any technology for non-volatile storage of content including, but not limited to, CD-ROM drives, digital versatile discs (DVD), or other optical disc storage; magnetic cassettes, magnetic tape, magnetic disc storage, or other magnetic storage devices; solid state memory technologies such as EEPROM or flash memory; or any other memory technology or any other medium which can be used to store data without requiring power to retain the data after it is written. Non-volatile data storage devices 50 may be non-removable from computing device 10 as in the case of internal hard drives, removable from computing device 10 as in the case of external USB hard drives, or a combination thereof, but computing device will typically comprise one or more internal, non-removable hard drives using either magnetic disc or solid-state memory technology. Non-volatile data storage devices 50 may store any type of data including, but not limited to, an operating system 51 for providing low-level and mid-level functionality of computing device 10, applications 52 for providing high-level functionality of computing device 10, program modules 53 such as containerized programs or applications, or other modular content or modular programming, application data 54, and databases 55 such as relational databases, non-relational databases, object oriented databases, BOSQL databases, and graph databases.

Applications (also known as computer software or software applications) are sets of programming instructions designed to perform specific tasks or provide specific functionality on a computer or other computing devices. Applications are typically written in high-level programming languages such as C++, Java, and Python, which are then either interpreted at runtime or compiled into low-level, binary, processor-executable instructions operable on processors 20. Applications may be containerized so that they can be run on any computer hardware running any known operating system. Containerization of computer software is a method of packaging and deploying applications along with their operating system dependencies into self-contained, isolated units known as containers. Containers provide a lightweight and consistent runtime environment that allows applications to run reliably across different computing environments, such as development, testing, and production systems.

The memories and non-volatile data storage devices described herein do not include communication media. Communication media are means of transmission of information such as modulated electromagnetic waves or modulated data signals configured to transmit, not store, information. By way of example, and not limitation, communication media includes wired communications such as sound signals transmitted to a speaker via a speaker wire, and wireless communications such as acoustic waves, radio frequency (RF) transmissions, infrared emissions, and other wireless media.

External communication devices 70 are devices that facilitate communications between computing device and either remote computing devices 80, or cloud-based services 90, or both. External communication devices 70 include, but are not limited to, data modems 71 which facilitate data transmission between computing device and the Internet 75 via a common carrier such as a telephone company or internet service provider (ISP), routers 72 which facilitate data transmission between computing device and other devices, and switches 73 which provide direct data communications between devices on a network. Here, modem 71 is shown connecting computing device 10 to both remote computing devices 80 and cloud-based services 90 via the Internet 75. While modem 71, router 72, and switch 73 are shown here as being connected to network interface 42, many different network configurations using external communication devices 70 are possible. Using external communication devices 70, networks may be configured as local area networks (LANs) for a single location, building, or campus, wide area networks (WANs) comprising data networks that extend over a larger geographical area, and virtual private networks (VPNs) which can be of any size but connect computers via encrypted communications over public networks such as the Internet 75. As just one exemplary network configuration, network interface 42 may be connected to switch 73 which is connected to router 72 which is connected to modem 71 which provides access for computing device 10 to the Internet 75. Further, any combination of wired 77 or wireless 76 communications between and among computing device 10, external communication devices 70, remote computing devices 80, and cloud-based services 90 may be used. Remote computing devices 80, for example, may communicate with computing device through a variety of communication channels 74 such as through switch 73 via a wired 77 connection, through router 72 via a wireless connection 76, or through modem 71 via the Internet 75. Furthermore, while not shown here, other hardware that is specifically designed for servers may be employed. For example, secure socket layer (SSL) acceleration cards can be used to offload SSL encryption computations, and transmission control protocol/internet protocol (TCP/IP) offload hardware and/or packet classifiers on network interfaces 42 may be installed and used at server devices.

In a networked environment, certain components of computing device 10 may be fully or partially implemented on remote computing devices 80 or cloud-based services 90. Data stored in non-volatile data storage device 50 may be received from, shared with, duplicated on, or offloaded to a non-volatile data storage device on one or more remote computing devices 80 or in a cloud computing service 92. Processing by processors 20 may be received from, shared with, duplicated on, or offloaded to processors of one or more remote computing devices 80 or in a distributed computing service 93. By way of example, data may reside on a cloud computing service 92, but may be usable or otherwise accessible for use by computing device 10. Also, certain processing subtasks may be sent to a microservice 91 for processing with the result being transmitted to computing device 10 for incorporation into a larger processing task. Also, while components and processes of the exemplary computing environment are illustrated herein as discrete units (e.g., OS 51 being stored on non-volatile data storage device 51 and loaded into system memory 35 for use) such processes and components may reside or be processed at various times in different components of computing device 10, remote computing devices 80, and/or cloud-based services 90.

In an implementation, the disclosed systems and methods may utilize, at least in part, containerization techniques to execute one or more processes and/or steps disclosed herein. Containerization is a lightweight and efficient virtualization technique that allows you to package and run applications and their dependencies in isolated environments called containers. One of the most popular containerization platforms is Docker, which is widely used in software development and deployment. Containerization, particularly with open-source technologies like Docker and container orchestration systems like Kubernetes, is a common approach for deploying and managing applications. Containers are created from images, which are lightweight, standalone, and executable packages that include application code, libraries, dependencies, and runtime. Images are often built from a Dockerfile or similar, which contains instructions for assembling the image. Dockerfiles are configuration files that specify how to build a Docker image. Systems like Kubernetes also support containers or CRI-O. They include commands for installing dependencies, copying files, setting environment variables, and defining runtime configurations. Docker images are stored in repositories, which can be public or private. Docker Hub is an exemplary public registry, and organizations often set up private registries for security and version control using tools such as Hub, JFrog Artifactory and Bintray, Github Packages or Container registries. Containers can communicate with each other and the external world through networking. Docker provides a bridge network by default, but can be used with custom networks. Containers within the same network can communicate using container names or IP addresses.

Remote computing devices 80 are any computing devices not part of computing device 10. Remote computing devices 80 include, but are not limited to, personal computers, server computers, thin clients, thick clients, personal digital assistants (PDAs), mobile telephones, watches, tablet computers, laptop computers, multiprocessor systems, microprocessor based systems, set-top boxes, programmable consumer electronics, video game machines, game consoles, portable or handheld gaming units, network terminals, desktop personal computers (PCs), minicomputers, main frame computers, network nodes, virtual reality or augmented reality devices and wearables, and distributed or multi-processing computing environments. While remote computing devices 80 are shown for clarity as being separate from cloud-based services 90, cloud-based services 90 are implemented on collections of networked remote computing devices 80.

Cloud-based services 90 are Internet-accessible services implemented on collections of networked remote computing devices 80. Cloud-based services are typically accessed via application programming interfaces (APIs) which are software interfaces which provide access to computing services within the cloud-based service via API calls, which are pre-defined protocols for requesting a computing service and receiving the results of that computing service. While cloud-based services may comprise any type of computer processing or storage, three common categories of cloud-based services 90 are microservices 91, cloud computing services 92, and distributed computing services 93.

Microservices 91 are collections of small, loosely coupled, and independently deployable computing services. Each microservice represents a specific computing functionality and runs as a separate process or container. Microservices promote the decomposition of complex applications into smaller, manageable services that can be developed, deployed, and scaled independently. These services communicate with each other through well-defined application programming interfaces (APIs), typically using lightweight protocols like HTTP, gRPC, or message queues such as Kafka. Microservices 91 can be combined to perform more complex processing tasks.

Cloud computing services 92 are delivery of computing resources and services over the Internet 75 from a remote location. Cloud computing services 92 provide additional computer hardware and storage on as-needed or subscription basis. Cloud computing services 92 can provide large amounts of scalable data storage, access to sophisticated software and powerful server-based processing, or entire computing infrastructures and platforms. For example, cloud computing services can provide virtualized computing resources such as virtual machines, storage, and networks, platforms for developing, running, and managing applications without the complexity of infrastructure management, and complete software applications over the Internet on a subscription basis.

Distributed computing services 93 provide large-scale processing using multiple interconnected computers or nodes to solve computational problems or perform tasks collectively. In distributed computing, the processing and storage capabilities of multiple machines are leveraged to work together as a unified system. Distributed computing services are designed to address problems that cannot be efficiently solved by a single computer or that require large-scale computational power. These services enable parallel processing, fault tolerance, and scalability by distributing tasks across multiple nodes.

Figure 13:
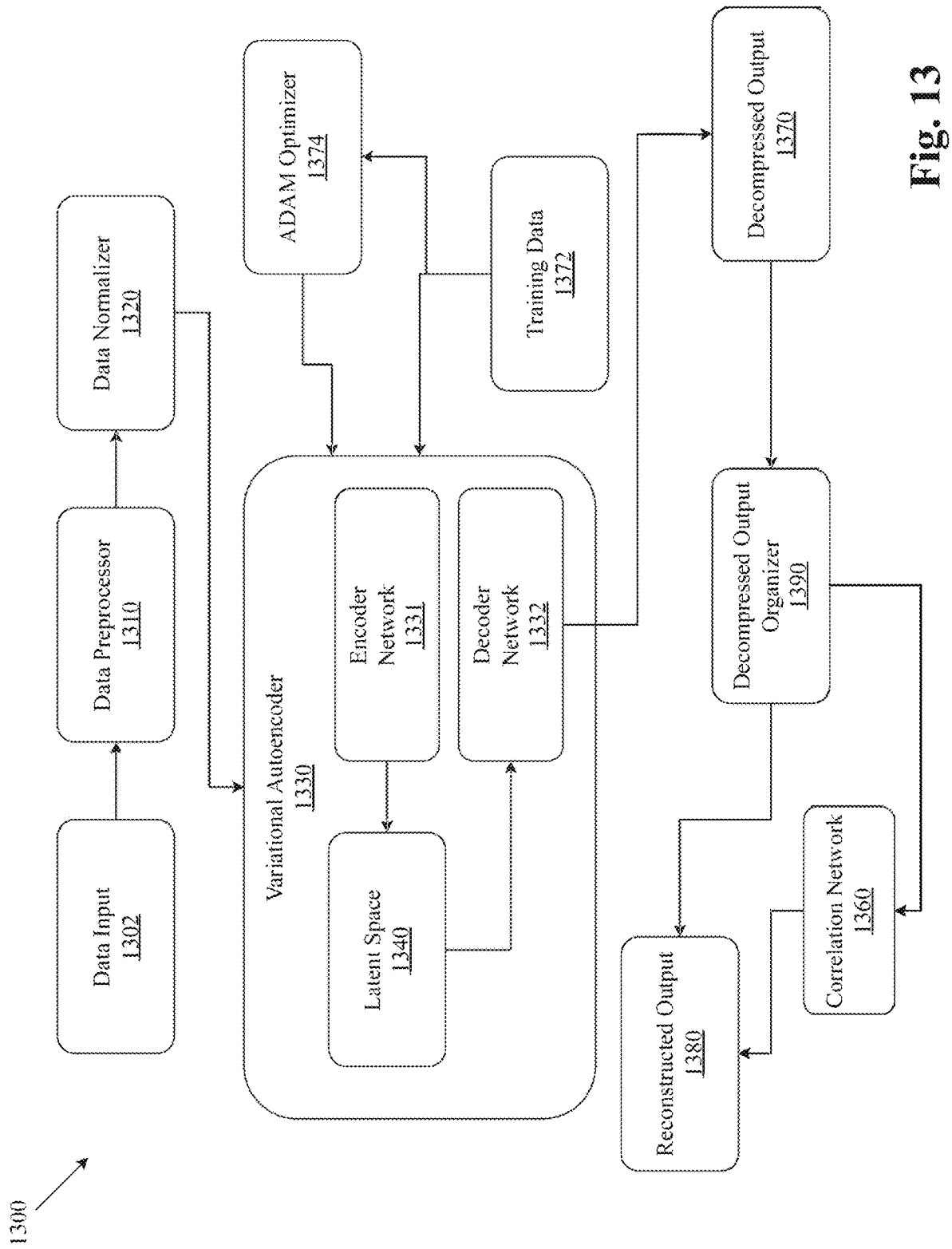
FIG. 13 is a block diagram illustrating an exemplary system architecture for compressing and restoring data using variational autoencoders, according to an embodiment.

FIG. 13 is a block diagram 1300 illustrating an exemplary system architecture for compressing and restoring data using a variational autoencoder. In one or more embodiments, compressing and restoring data using a variational autoencoder enables homomorphic data compression. The variational autoencoder can be configured to learn a smooth, continuous latent space representation of the input data. Thus, in embodiments, small perturbations in the latent space correspond to significant variations in the input data. In embodiments, linear operations in the latent space, such as addition, subtraction, and scalar multiplication correspond to meaningful operations in the input data.

In general, data compression has advantages for computer systems in terms of resource usage and scalability. Data compression techniques can significantly reduce the storage space required for data while still maintaining its integrity and utility. This is particularly valuable in applications dealing with large volumes of data, such as cloud computing and big data analytics. Moreover, using data compression can lead to more efficient transmission over networks, reducing bandwidth requirements.

Homomorphic data compression offers several additional benefits over conventional data compression techniques, primarily in scenarios where preserving privacy and reducing computational overhead are important. One of the primary advantages of homomorphic data compression is the ability to compress data while keeping it encrypted. This is especially important in fields such as healthcare and finance, where sensitive data needs to be analyzed without compromising privacy. Homomorphic compression enables secure outsourcing of computations to third-party service providers while preserving data privacy. This is advantageous in scenarios where organizations need to leverage external resources for data processing without exposing sensitive information. Homomorphic compression techniques can facilitate data analysis on encrypted data without the need for decryption, enabling organizations to derive valuable insights while maintaining data confidentiality. In industries with stringent data privacy regulations, such as healthcare (Health Insurance Portability and Accountability Act of the United States (HIPAA)) and finance (General Data Protection Regulation of the European Union) (GDPR)), homomorphic compression can help organizations comply with regulatory requirements by ensuring the privacy and security of sensitive information.

In one embodiment, a system for compressing and restoring data using a variational autoencoder comprises a plurality of data inputs 1302, a data preprocessor 1310, a data normalizer 1320, a variational autoencoder 1330 which further comprises an encoder network 1331 and a decoder network 1332. Configured and disposed between the encoder network 1331 and the decoder network 1332 is a latent space 1340. The latent space 1340 represents the low-dimensional continuous space where the autoencoder maps the input data. The encoder network 1331 within the variational autoencoder 1330 receives data input 1302. Data input 1302 can include text, images, hyperspectral data, binary data, and/or other types of data. The encoder network 1331 maps the received data input 1302 to a probability distribution in the latent space 1340. In embodiments, the encoder network 1331 outputs parameters of a probability distribution. In embodiments, the parameters can include mean and variance. In embodiments, the probability distribution includes a Gaussian (normal) distribution. In one or more embodiments, the probability distribution can include a Bernoulli distribution, categorical distribution, and/or a multinomial distribution, instead of, or in addition to, a Gaussian distribution. In embodiments, programming instructions executing on a processor cause the variational autoencoder to perform partially homomorphic compression and/or partially homomorphic encryption. In embodiments, the variational autoencoder comprises a latent space, and wherein the plurality of programming instructions further includes instructions that, when executing on the processor, cause the variational autoencoder to perform one or more linear operations in the latent space. In embodiments, programming instructions further includes instructions that, when executing on the processor, cause the variational autoencoder to perform the linear operations that include at least one of addition, subtraction, and scalar multiplication.

The decoder network 1332 maps the latent space 1340 to a decompressed output 1370. The decompressed output can be input to a decompressed output organizer 1390, which in turn outputs a reconstructed output 1380. The data inputs 1302 can be representations of raw data from various sources, such as sensors, cameras, or databases. The raw data can be in different formats, including but not limited to images, videos, audio, or structured data. The plurality of data inputs 1302 may be transferred to the data preprocessor 1310 for further processing. The data preprocessor 1310 applies various preprocessing techniques to the raw data received from the data input 1302. These techniques may include data cleaning, noise reduction, artifact removal, and/or format conversion. The data preprocessor 1310 ensures that the data is in a suitable format and quality for subsequent stages of the system.

The preprocessed data may then be passed to the data normalizer 1320. The data normalizer 1320 scales and normalizes the data to a consistent range, typically between 0 and 1. Normalization can help to improve the training stability and convergence of the variational autoencoder 1330. The normalized data is fed into the variational autoencoder 1330, which includes both the encoder network 1331, latent space 1340, and the decoder network 1332. The encoder network 1331 is responsible for encoding the input data into a lower-dimensional latent space representation. The decoder network 1332 can include multiple layers of encoders that progressively reduce the dimensionality of the data while capturing the most important features and patterns.

The latent space 1340 has a significantly reduced size compared to the original input data, enabling efficient storage and transmission. The latent space 1340 represents a compressed output that may be stored in a storage system. A storage system may include any suitable storage medium, such as a database, file system, or cloud storage. Storage systems allow for the efficient management and retrieval or the compressed data represented by latent space 1340 as needed.

In embodiments, one or more operations may be performed on the compressed data of latent space 1340. The operations can include homomorphic operations. The homomorphic operations can include linear operations. The linear operations can include addition, subtraction, scalar multiplication, and/or other suitable operations.

When the compressed data needs to be restored or reconstructed, it may be retrieved from the storage system and passed to the decoder network 1332. Additionally, the compressed data may be directly passed directly to the decoder network 1332. The decoder network 1332 is responsible for decoding the compressed latent representation back into the original data space by outputting a decompressed output 1370. The decoder network 1332 can include multiple layers of decoders that progressively increase the dimensionality of the data, reconstructing the original input.

The decompressed output 1370 from the decoder network 1332 may have some loss of information compared to the original input data due to the compression process. In one or more embodiments, to further enhance the quality of the decompressed output, the system may optionally incorporate a correlation network 1360. The correlation network 1360 leverages the correlations and patterns between different compressed inputs to restore the decompressed output more accurately. It learns to capture the relationships and dependencies within the data, allowing for better reconstruction and restoration of the original information. The correlation network 1360 takes the decompressed outputs 1370 as inputs. It analyzes the correlations and similarities between the data samples and uses this information to refine and enhance the decompressed output. The refined decompressed output from the correlation network 1360 is a reconstructed output 1380 of the system. The reconstructed output 1380 closely resembles the original input data, with minimal loss of information and improved quality compared to the output from the decoder network 1332 alone.

In one or more embodiments, the correlation network 1360 may receive inputs from a decompressed output organizer 1390 which operates on the decompressed outputs 1370 obtained from the decoder network 1332. The decompressed output organizer 1390 may organize the decompressed outputs 1370 into groups based on their correlations and similarities. By grouping decompressed outputs 1370 based on similarities, the correlation network 1360 will more easily be able to identify correlations between decompressed outputs 1370. Thus, embodiments can further include a correlation network, and wherein the output of the decompressed output organizer is input to the correlation network, and wherein the output of the correlation network provides the reconstructed output.

In one or more embodiments, the variational autoencoder 1330 is trained via training data 1372. The training data 1372 can be part of a supervised or semi-supervised learning process. In embodiments, the variational autoencoder 1330 can be optimized with an ADAM (Adaptive Moment Estimation) optimizer 1374. In one or more embodiments, the encoder network 1331 and decoder network 1332 are trained to learn meaningful representations of the data input 1302 and generate realistic output data for reconstructed output 1380. In embodiments, the ADAM optimizer 1374 is used to adjust the weights of the encoder network 1331 and/or decoder network 1332 based on factors such as the reconstruction error and/or the KL divergence between the learned latent distribution and a predefined prior distribution, such as a Gaussian distribution. In one or more embodiments, the KL (Kullback-Leibler) divergence is used as part of the objective function in probabilistic models to encourage learned distributions to match target distributions, regularize the model, and/or learn meaningful representations to enable features such as homomorphic data compression. Thus, embodiments can include training the variational autoencoder, wherein the training includes using an Adam optimizer.

Figure 14:
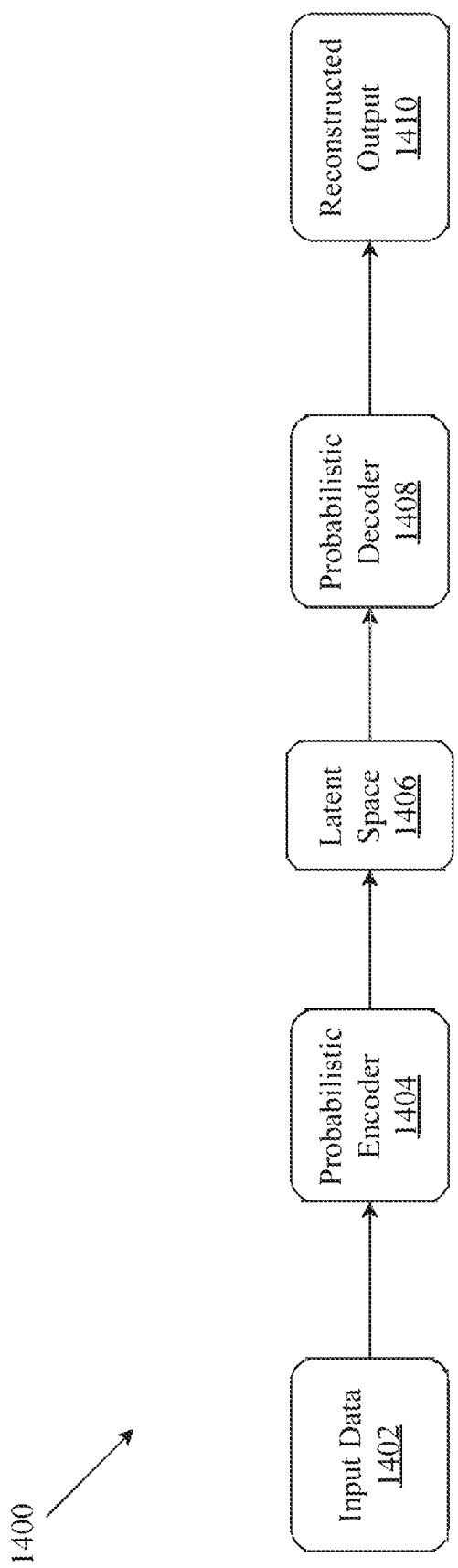
FIG. 14 is a block diagram of a variational autoencoder used in an embodiment.

FIG. 14 is a block diagram 1400 of a variational autoencoder used in an embodiment. The general architecture of an autoencoder includes an encoder, decoder, and latent space. The latent space may be implemented using a bottleneck layer. The encoder section includes an input layer that accepts input data. Hidden layers progressively reduce the dimensionality of the input, capturing important features and patterns. These layers comprise the encoder. The bottleneck layer (latent space) is the final hidden layer, where the dimensionality is significantly reduced. This layer represents the compressed encoding of the input data.

The input data 1402 can include uncompressed data. In one or more embodiments, the uncompressed data can include hyperspectral data. In one or more embodiments, the uncompressed data can include sensor data. The sensor data can originate from a wide variety of sensors, including IoT sensors. The input data 1402 is provided to probabilistic encoder 1404. The probabilistic encoder 1404 can be configured to output a deterministic encoding of the input data 1402 as well as a probability distribution. to generate latent space 1406. The latent space 1406 may have homomorphic properties, which can enable homomorphic data compression and/or partial homomorphic data compression. The information from latent space 1406 can be input to probabilistic decoder 1408. In one or more embodiments, the probabilistic decoder 1408 outputs the parameters of a probability distribution. This distribution is then sampled to obtain a reconstructed output 1410. In one or more embodiments, the variational autoencoder may have a layer configuration similar to that shown in FIG. 2, where the innermost layer that provides compressed output (140 of FIG. 2) serves as a bottleneck layer.

Figure 15:
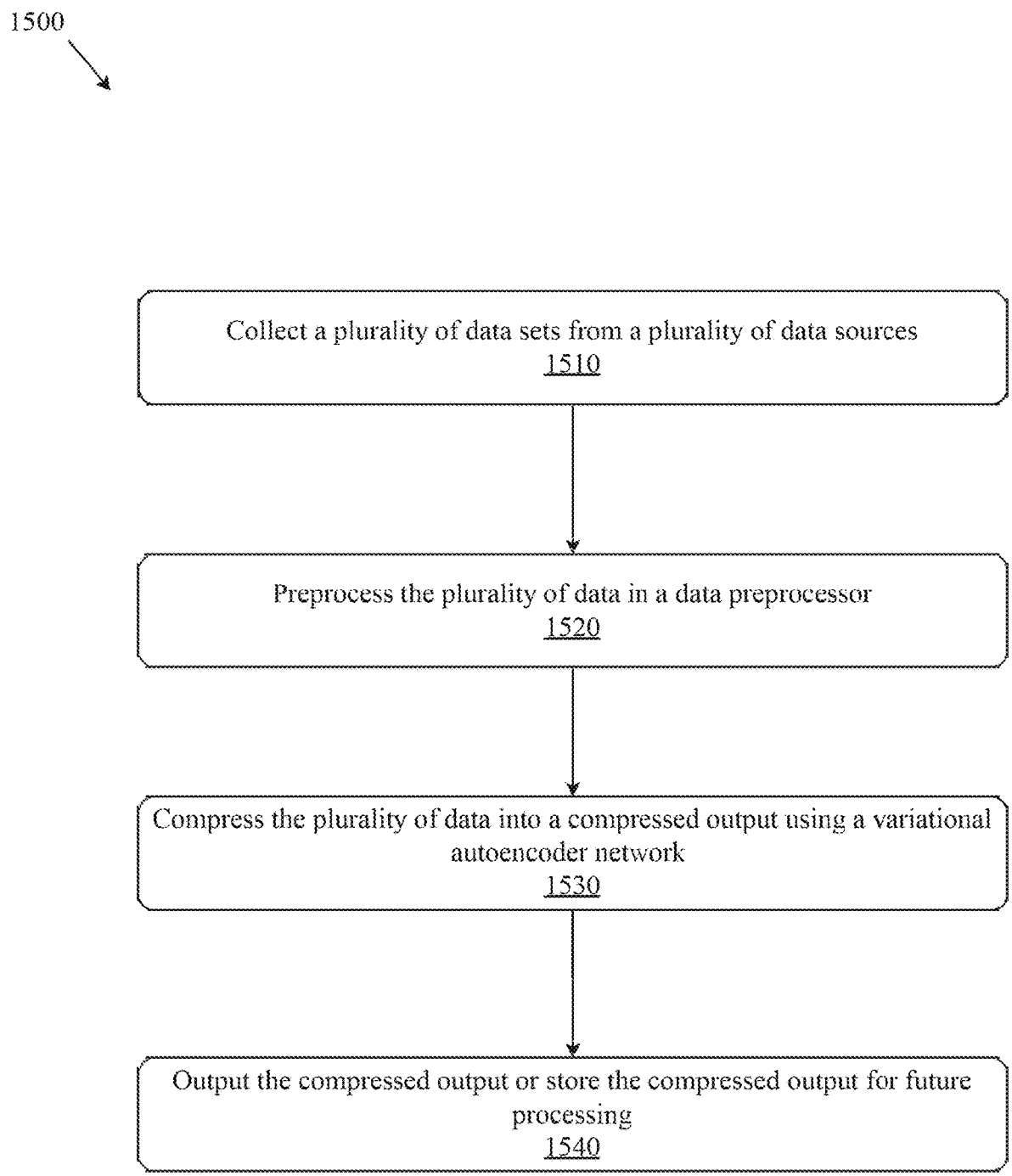
FIG. 15 is a flow diagram illustrating an exemplary method for compressing a data input using a system for compressing and restoring data using variational autoencoders, according to an embodiment.

FIG. 15 is a flow diagram 1500 illustrating an exemplary method for decompressing a compressed data input using a system for compressing and restoring data using variational autoencoders, according to an embodiment. In a first step 1510, a plurality of data sets is collected from a plurality of data sources. These data sources can include various sensors, devices, databases, or any other systems that generate or store data. The data sets may be heterogeneous in nature, meaning they can have different formats, structures, or modalities. For example, the data sets can include images, videos, audio recordings, time-series data, numerical data, or textual data. The collection process involves acquiring the data sets from their respective sources and bringing them into a centralized system for further processing.

In a step 1520, the collected data sets are preprocessed using a data preprocessor. The data preprocessor may be responsible for steps including one or more of cleaning, transforming, normalizing, and preparing the data sets for subsequent analysis and compression. Preprocessing tasks may include but are not limited to, data cleansing, data integration, data transformation, and feature extraction. Data cleansing involves removing or correcting any erroneous, missing, or inconsistent data points. Data integration combines data from multiple sources into a unified format. Data transformation converts the data into a suitable representation for further processing, such as scaling, normalization, or encoding categorical variables. Feature extraction identifies and selects relevant features or attributes from the data sets that are most informative for the given task.

In a step 1530, the preprocessed data sets are compressed into a compressed output using a variational autoencoder. The variational autoencoder provides a deep learning model designed to learn compact and meaningful representations of the input data. As previously described and shown in at least FIG. 13 and FIG. 14, the variational autoencoder of disclosed embodiments can include an encoder network and a decoder network. The encoder network takes the normalized data sets as input and progressively compresses them through a series of layers, such as but not limited to convolutional layers, pooling layers, and fully connected layers. The compressed representation is obtained at the bottleneck layer of the encoder network, which has a significantly reduced dimensionality compared to the original data. The variational autoencoder may utilize a plurality of encoder networks to achieve optimal compression performance. These encoder networks can include different architectures, loss functions, or optimization techniques. The choice of compression technique depends on the specific characteristics and requirements of the data sets being compressed. During the compression process, the variational autoencoder learns to capture the essential features and patterns present in the data sets while discarding redundant or irrelevant information. It aims to minimize the reconstruction error between the original data and the reconstructed data obtained from the compressed representation. In step 1540, the compressed output generated by the variational autoencoder is outputted and/or stored for future processing. The compressed output represents the compact and informative representation of the original data sets. The compressed output can support homomorphic operations, enabling manipulation on encrypted data. The compressed output significantly reduces the storage and transmission requirements compared to the original data sets, making it more efficient for downstream tasks.

Figure 16:
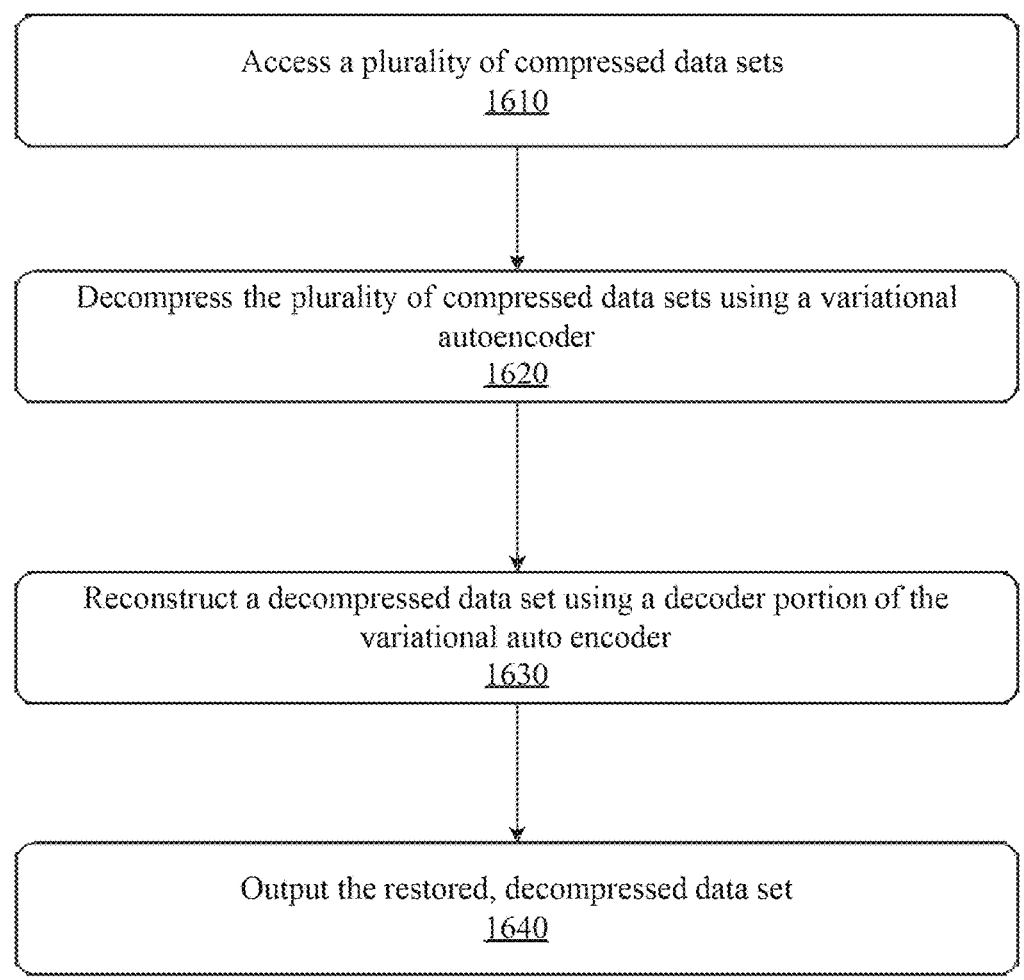
FIG. 16 is a flow diagram illustrating an exemplary method for decompressing a compressed data input using a system for compressing and restoring data using variational autoencoders, according to an embodiment.

FIG. 16 is a flow diagram 1600 illustrating an exemplary method for decompressing a data input using a system for compressing and restoring data using variational autoencoders, according to an embodiment. In a first step, 1610, a plurality of compressed data sets is accessed. Step 1620 includes decompressing the plurality of compressed data sets using a variational autoencoder, such as previously described and shown in at least FIG. 13 and/or FIG. 14. The decoder network is responsible for mapping the latent space vectors back to the original data space. The decoder network may include techniques such as transposed convolutions, upsampling layers, or generative models, depending on the specific requirements of the data and the compression method used. In one or more embodiments, homomorphic operations may be performed on the compressed data sets prior to decompressing.

In a step 1630, the compressed data sets are reconstructed using the decoder (e.g., 1332 of FIG. 13) of the variational autoencoder. In a step 1640, the restored, decompressed data set is outputted. The restored data set represents the reconstructed version of the original data, which includes recovered information lost during the compression process. The outputted data may have had homomorphic operations performed on the latent space compressed version. This feature enables meaningful operations on data while in its compressed (and/or encrypted) form which still apply when the data is decompressed.

As can now be appreciated, disclosed embodiments utilize a variational autoencoder to enable homomorphic compression techniques. Input data is compressed into a latent space using an encoder network of a variational autoencoder. Homomorphic operations are performed on the compressed data in the latent space. The latent space compressed data is decompressed using a decoder network of the variational autoencoder. The homomorphic operations can enable performing operations while the data is in a compressed form, and preserving the results of those operations after the data is in a decompressed form. One or more embodiments can compress data using partially homomorphic encryption (PHE). The PHE of disclosed embodiments allows for specific types of computations to be performed on encrypted data without decrypting it. For example, in a partially homomorphic encryption scheme that supports addition and multiplication, embodiments can include encrypting a value x, encrypting a threshold value T, and then performing a homomorphic comparison operation to check if x<T. In a medical records application, the value T can be a year, and the value x can be a birth year of a patient in a medical record. The result of this operation provides an encrypted value that represents the comparison result. Continuing with the example, disclosed embodiments can enable checking if a patient referred to in a medical record is above a certain age, without needed to decrypt/decompress the medical record. This powerful feature enables third-party verification operations. Continuing with the example, a third party can perform age verification on medical records while in an encrypted form, such that the third party cannot view any personally sensitive identifying information in the medical records. Thus, the homomorphic encryption and compression of disclosed embodiments can provide a range of benefits including enhanced privacy, data security, reduced storage requirements, efficient data processing, and secure data outsourcing.

Although described above as a physical device, referring again to FIG. 12, computing device 10 can be a virtual computing device, in which case the functionality of the physical components herein described, such as processors 20, system memory 30, network interfaces 40, and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where computing device 10 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. Thus, computing device 10 may be either a physical computing device or a virtualized computing device within which computer-executable instructions can be executed in a manner consistent with their execution by a physical computing device. Similarly, terms referring to physical components of the computing device, as utilized herein, mean either those physical components or virtualizations thereof performing the same or equivalent functions.

Figure 17:
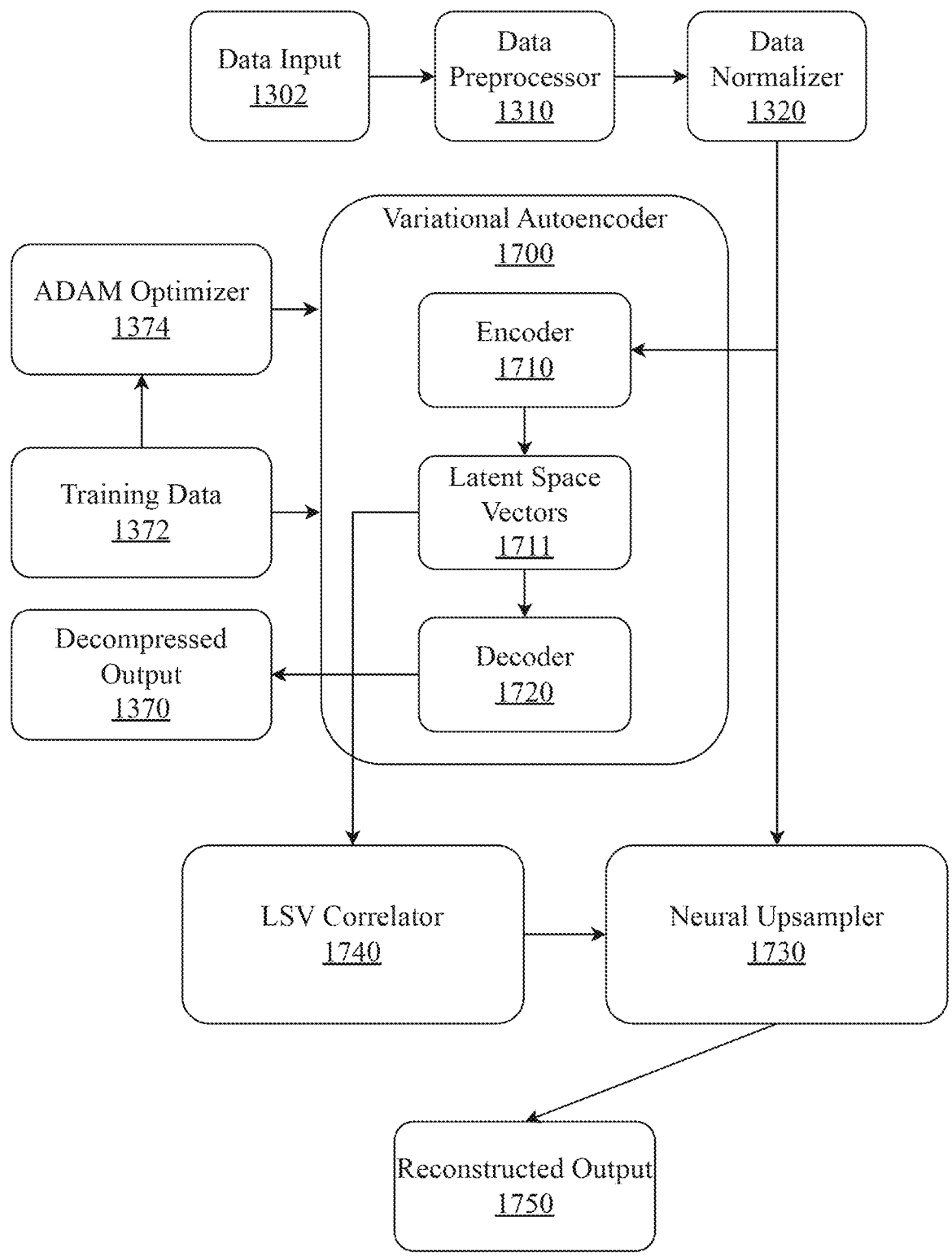
FIG. 17 is a block diagram of a system for homomorphic compression using latent space preprocessing that utilizes a variational autoencoder, a correlation network and a neural upsampler.

FIG. 17 is a block diagram of a system for homomorphic compression using latent space preprocessing that utilizes a variational autoencoder, a correlation network and a neural upsampler. A variational autoencoder (VAE) 1700 is a generative model that learns to encode input data into a compact latent space representation and then decode it back to the original data space. The system receives a data input 1302, which can include various types of data such as images, text, or sensor measurements. The data input 1302 is first processed by a data preprocessor 1310 that performs necessary data cleaning and feature extraction. The preprocessed data is then passed through a data normalizer 1320 to normalize the data and ensure that the input features have similar scales and distributions. The normalized data is fed into the variational autoencoder 1700, which comprises an encoder network 1710 and a decoder network 1720. The encoder network 1710 maps the input data into a lower-dimensional latent space, producing a set of latent space vectors 1711. The latent space represents a compressed representation of the input data that captures the most salient features and variations.

The VAE 1700 can be implemented using different architectures and variations, depending on the specific requirements and characteristics of the data. In one embodiment, the VAE 1700 may be a Hamiltonian VAE (H-VAE) which is a variant of the VAE that learns latent space dynamics based on Hamiltonian mechanics, enabling the modeling of more interpretable and physically meaningful latent representations. H-VAEs can capture complex dependencies and temporal structures in the data. See APPENDIX A for an example of an H-VAE using sample PyTorch code. In another embodiment, the VAE 1700 may be a Disentangled VAE (β-VAE) which modifies a VAE's objective function to encourage learning a more disentangled latent representation, where each latent dimension corresponds to a separate and interpretable factor of variation in the data. The VAE 1700 may also be an Equivariant VAE, a Lie Group VAE, or a Homomorphic Encryption-aware VAE, depending on specific goal of the system. The choice of the specific VAE architecture depends on the nature of the data and the desired properties of the latent space representation. Different VAE variants offer different trade-offs in terms of compression efficiency, latent space interpretability, sample quality, and computational complexity.

During training, the VAE 1700 may be optimized using an ADAM optimizer 1374 and a dataset of training data 1372. The objective is to minimize the reconstruction loss between the input data and the reconstructed output, as well as the KL divergence between the latent space distribution and the prior distribution. The decoder network 1720 takes the latent space vectors 1711 and reconstructs the original data, producing a decompressed output 1370. However, due to the lossy nature of compression, the decompressed output may lack some details and fidelity compared to the original input.

To enhance the quality of the reconstructed output, a neural upsampler 1730 can be employed. The neural upsampler 1730 is a separate neural network that learns to restore the lost information by leveraging correlations and patterns in the latent space vectors. It takes the compressed latent space vectors 1711 as input and generates an upsampled version with improved details and resolution. The neural upsampler 1730 is typically implemented as a deep neural network, such as a convolutional neural network (CNN) or a generative adversarial network (GAN). It takes the compressed latent space vectors 1711 as input and learns to upsample and refine the data to a higher resolution or quality.

In one embodiment, the neural upsampler 1730 may be trained by grouping latent space vectors 1711 generated by the VAE's encoder 1710 together based on their similarity or correlation. This grouping step aims to capture the local dependencies and structures within the latent space. The grouped latent space vectors and the original inputs are used as the inputs for the neural upsampler 1730. The neural upsampler 1730 takes compressed latent space vectors 1711 and the original inputs and applies a series of upsampling and refinement operations. These operations may include but are not limited to transposed convolutions, upsampling layers, or super-resolution techniques. The goal is to increase the spatial resolution and add more details to the decompressed outputs. A reconstructed output is compared against the original high-resolution or high-quality data using a loss function. The loss function measures the discrepancy between the upsampled output and the target data, considering factors such as pixel-wise differences, perceptual similarity, or adversarial losses. The neural upsampler 1730 is then optimized using techniques like stochastic gradient descent to minimize the loss and improve its performance.

During the upsampling process, the neural upsampler 1730 learns to capture and exploit the spatial and contextual information present in the latent space vectors 1711. It learns to fill in missing details, sharpen edges, and generate realistic textures and patterns. By leveraging the correlations and dependencies within the grouped latent space vectors, the neural upsampler can effectively restore the lost information and enhance the visual quality of the reconstructed output 1380.

The architecture of the neural upsampler 1730 can vary depending on the specific requirements and characteristics of the data. In one embodiment, the neural upsampler 1730 may include multiple upsampling stages, skip connections, attention mechanisms, or adversarial components to improve the upsampling performance. The choice of the architecture and training objectives depends on factors such as the desired output resolution, the complexity of the data, and the available computational resources. By incorporating a neural upsampler 1730 into the VAE-based compression and restoration system, the reconstructed output 1380 can achieve a higher level of fidelity and visual quality compared to the decompressed output 1370 alone. The neural upsampler complements the VAE's compression capabilities by recovering the lost details and generating more realistic and visually appealing results.

In an embodiment, a latent space vector correlator 1360 can be optionally used to further exploit the correlations and dependencies among the latent space vectors. The latent space vector correlator 1360 takes the compressed latent space vectors 1711 as input and learns to capture the relationships and structures within the data, providing additional guidance for the reconstruction process. See APPENDIX B for an example of a latent space vector correlator using PyTorch code.

Figure 18:
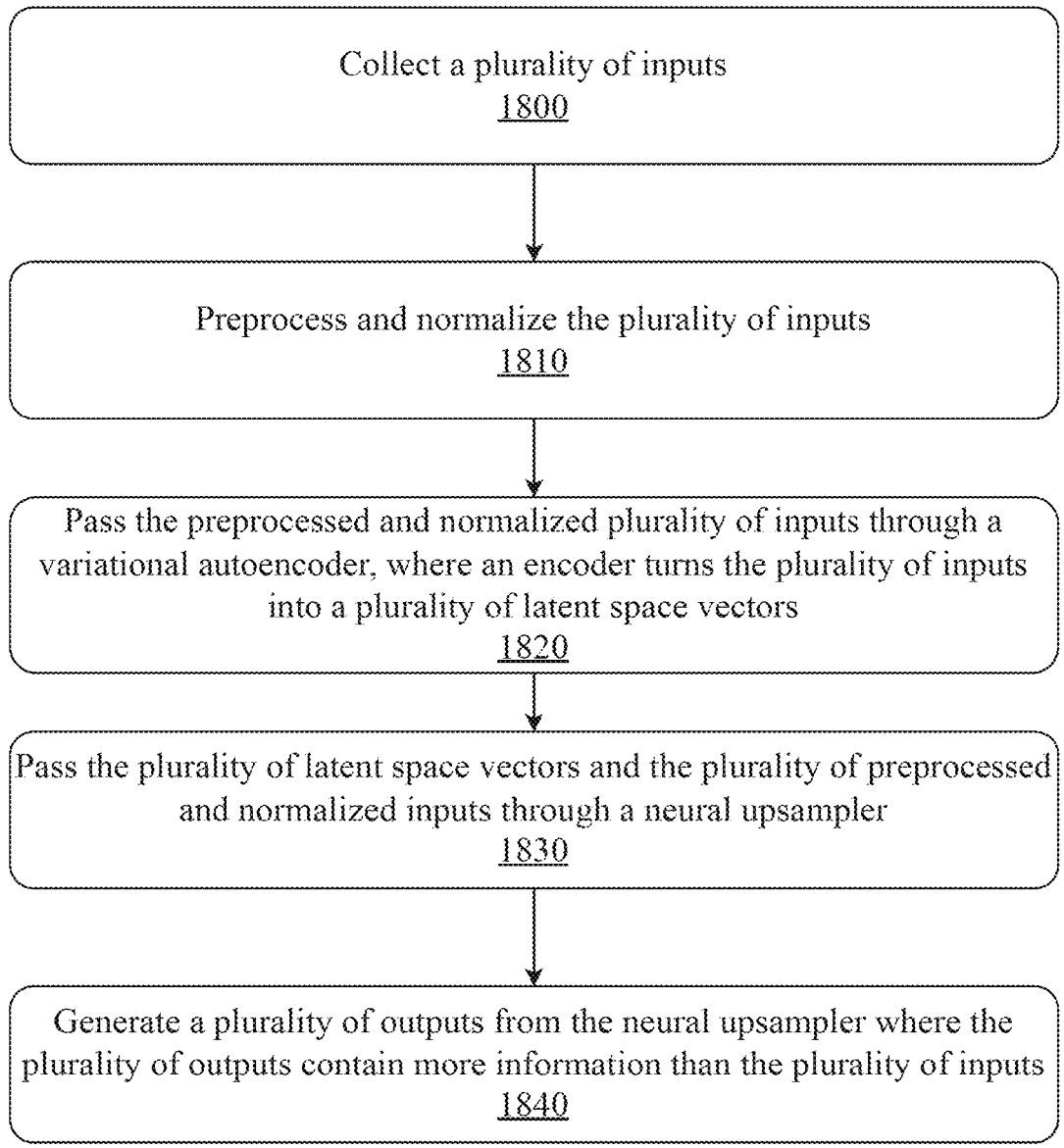
FIG. 18 is a flow diagram illustrating an exemplary method for compressing inputs and restoring data after compression using a variational autoencoder and a neural upsampler.

FIG. 18 is a flow diagram illustrating an exemplary method for compressing inputs and restoring data after compression using a variational autoencoder and a neural upsampler. In a first step 1800, a plurality of inputs are collected. These inputs can include various types of data such as images, text, audio, or sensor measurements, depending on the specific application domain.

In a step 1810, the collected inputs undergo preprocessing and normalization. The preprocessing step involves techniques such as data cleaning, noise reduction, and feature extraction to ensure that the inputs are in a suitable format for further processing. Normalization is applied to standardize the input features, typically by scaling them to a common range or distribution. Preprocessing and normalization help improve the stability and convergence of the subsequent steps.

In a step 1820, the preprocessed and normalized inputs are passed through a variational autoencoder (VAE). The VAE consists of an encoder network that compresses the input data into a lower-dimensional latent space representation. The encoder network learns to capture the most salient features and variations in the input data while discarding redundant or noisy information. The output of the encoder network is a set of latent space vectors that represent the compressed version of the input data. The latent space vectors obtained from the encoder network are then used in a step 1830, along with the preprocessed and normalized inputs, as inputs to a neural upsampler. The neural upsampler is a separate neural network that aims to restore the information lost during the compression process and generate a higher-quality and more detailed version of the input data.

The neural upsampler takes the latent space vectors and the preprocessed and normalized inputs and applies a series of upsampling and refinement operations. These operations can include techniques such as transposed convolutions, upsampling layers, or super-resolution methods. The neural upsampler learns to exploit the spatial and contextual information present in the latent space vectors and the original inputs to fill in missing details, sharpen edges, and generate realistic textures and patterns. During the upsampling process, the neural upsampler leverages the correlations and dependencies within the latent space vectors to effectively restore the lost information. It learns to map the compressed representation back to the original data space while adding more details and improving the visual quality.

In a step 1840, the neural upsampler generates a plurality of outputs that correspond to the restored and enhanced versions of the input data. These outputs contain more information and finer details compared to the compressed latent space vectors. The neural upsampler aims to produce outputs that closely resemble the original input data while benefiting from the compression and restoration capabilities of the VAE.

The training process of the VAE and the neural upsampler involves minimizing a loss function that measures the discrepancy between the generated outputs and the target data. The loss function can consider factors such as pixel-wise differences, perceptual similarity, or adversarial losses, depending on the specific requirements and characteristics of the data. The VAE and the neural upsampler are optimized jointly using techniques like stochastic gradient descent to improve their performance and generate high-quality reconstructions. By combining the compression capabilities of the VAE with the upsampling and refinement abilities of the neural upsampler, the proposed method achieves effective data compression while maintaining the ability to restore the compressed data to a higher quality and resolution. The method can be applied to various domains, including image compression, video compression, or sensor data compression, where both data reduction and high-quality reconstruction are desired.

Figure 19:
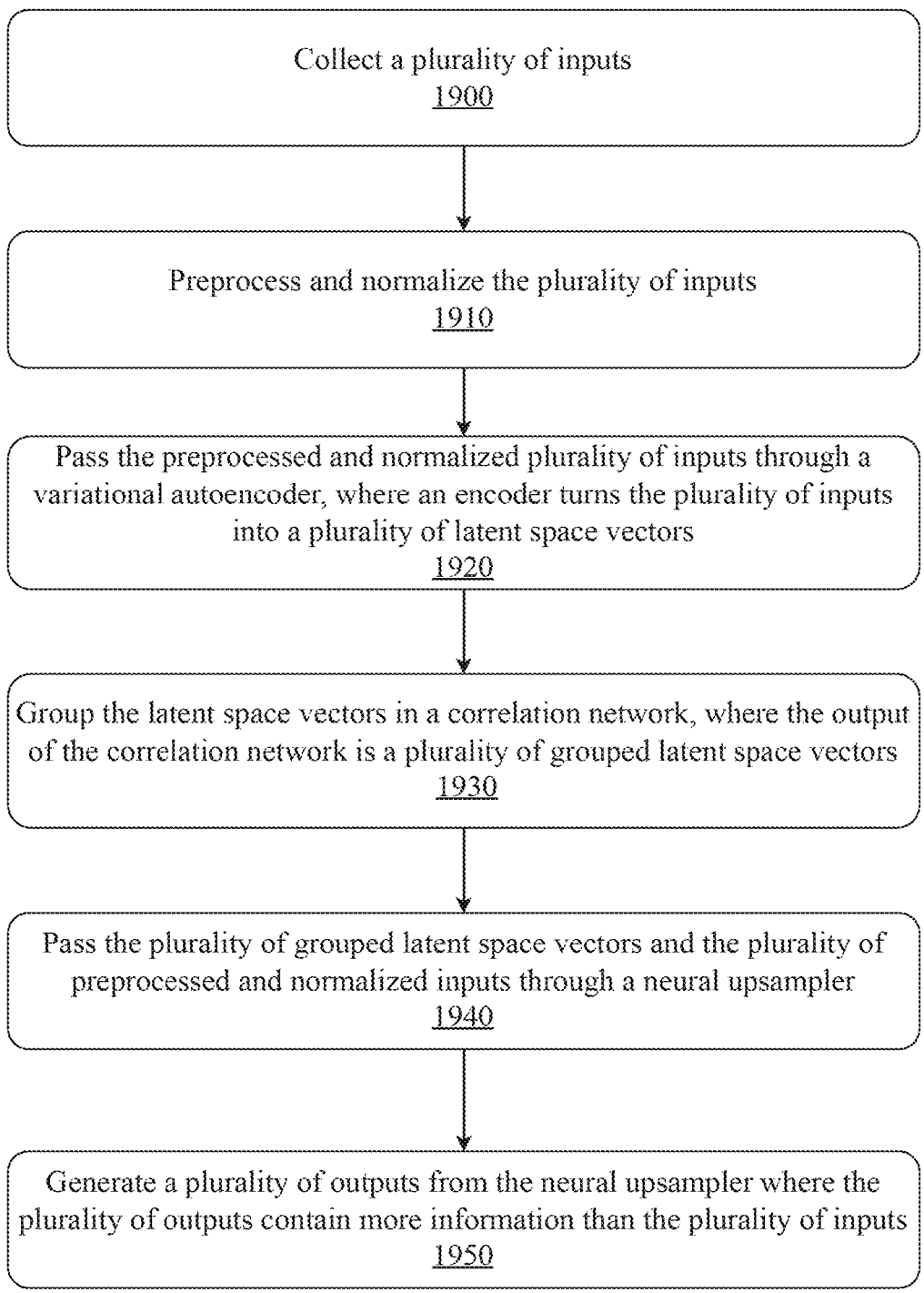
FIG. 19 is a flow diagram illustrating an exemplary method for compressing inputs and restoring data after compression where latent space vectors are organized through a correlation network.

FIG. 19 is a flow diagram illustrating an exemplary method for compressing inputs and restoring data after compression where latent space vectors are organized through a correlation network. In a first step 1900, a plurality of inputs are collected. These inputs can consist of various data types, such as images, text, audio, or sensor measurements, depending on the specific application domain. In a step 1910, the collected inputs are preprocessed and normalized. The preprocessing step involves applying techniques like data cleaning, noise reduction, and feature extraction to ensure that the inputs are in a suitable format for further processing. Normalization is performed to standardize the input features, typically by scaling them to a common range or distribution. Preprocessing and normalization help improve the stability and convergence of the subsequent steps.

In a step 1920, the preprocessed and normalized inputs are passed through a variational autoencoder (VAE). The VAE consists of an encoder network that compresses the input data into a lower-dimensional latent space representation. The encoder network learns to capture the most salient features and variations in the input data while discarding redundant or noisy information. The output of the encoder network is a set of latent space vectors that represent the compressed version of the input data.

In a step 1930, the latent space vectors obtained from the encoder network are passed through a correlation network. The correlation network is designed to capture the relationships and dependencies among the latent space vectors. It analyzes the latent space vectors and groups them based on their correlations and similarities. The correlation network learns to identify patterns and structures within the latent space, allowing for more efficient and meaningful grouping of the vectors. The output of the correlation network is a plurality of grouped latent space vectors. These grouped vectors are formed by clustering or grouping the latent space vectors that exhibit strong correlations or share similar characteristics. By grouping the vectors, the correlation network aims to capture the inherent structure and relationships present in the compressed representation of the input data. The grouped latent space vectors, along with the preprocessed and normalized inputs, are then used as inputs to a neural upsampler in a step 1940. The neural upsampler is a separate neural network that aims to restore the information lost during the compression process and generate a higher-quality and more detailed version of the input data.

The neural upsampler takes the grouped latent space vectors and the preprocessed and normalized inputs and applies a series of upsampling and refinement operations. These operations can include techniques such as transposed convolutions, upsampling layers, or super-resolution methods. The neural upsampler learns to exploit the spatial and contextual information present in the grouped latent space vectors and the original inputs to fill in missing details, sharpen edges, and generate realistic textures and patterns. During the upsampling process, the neural upsampler leverages the correlations and dependencies captured by the correlation network to effectively restore the lost information. It learns to map the compressed representation back to the original data space while adding more details and improving the visual quality.

In a step 1950, the neural upsampler generates a plurality of outputs that correspond to the restored and enhanced versions of the input data. These outputs contain more information and finer details compared to the compressed latent space vectors. The neural upsampler aims to produce outputs that closely resemble the original input data while benefiting from the compression, grouping, and restoration capabilities of the VAE, correlation network, and neural upsampler.

The training process of the VAE, correlation network, and neural upsampler involves minimizing a loss function that measures the discrepancy between the generated outputs and the target data. The loss function can consider factors such as pixel-wise differences, perceptual similarity, or adversarial losses, depending on the specific requirements and characteristics of the data. The VAE, correlation network, and neural upsampler are optimized jointly using techniques like stochastic gradient descent to improve their performance and generate high-quality reconstructions.

By incorporating a correlation network into the compression and restoration pipeline, the proposed method leverages the relationships and dependencies among the latent space vectors to enhance the grouping and reconstruction process. The correlation network helps to capture the intrinsic structure of the compressed data, enabling more effective upsampling and refinement by the neural upsampler.

The skilled person will be aware of a range of possible modifications of the various aspects described above. Accordingly, the present invention is defined by the claims and their equivalents.

Figure 20:
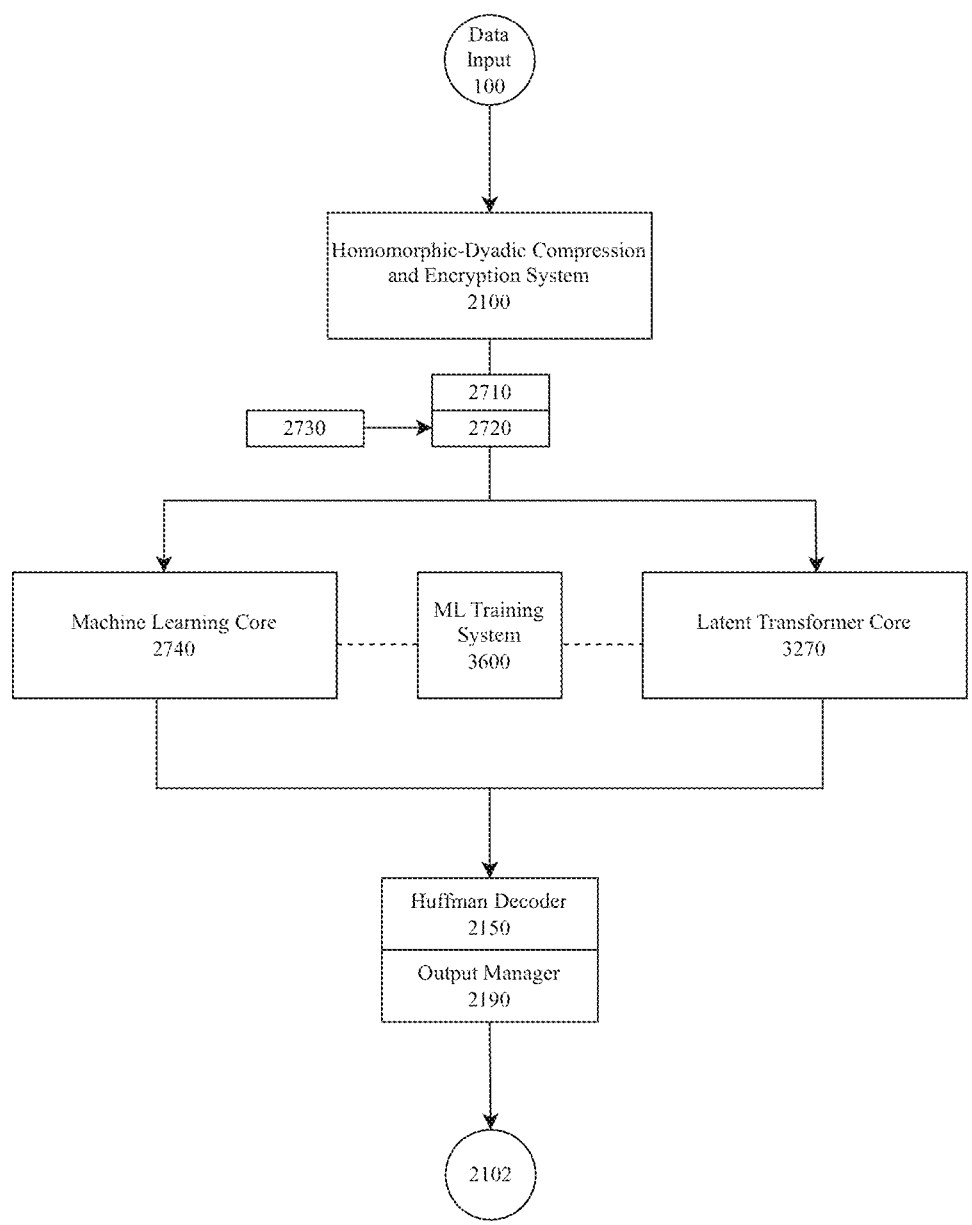
FIG. 20 is a block diagram illustrating exemplary system architecture of deep learning using large codeword model with homomorphically compressed data.

System Architecture of Deep Learning Using LCM with Homomorphic-Dyadic Compressed and Encrypted Data FIG. 20 is a block diagram illustrating exemplary system architecture of deep learning using large codeword model with homomorphically compressed and dyadically encrypted data. The system's architecture incorporates both a conventional transformer-based core and a latent transformer core, offering significant benefits in terms of flexibility, efficiency, and performance across various tasks and data types. The conventional transformer-based architecture, part of the machine learning core 2740, includes an embedding layer, a positional encoding layer, and a series of transformer layers. This structure is particularly well-suited for tasks where input sequence order is crucial and where capturing long-range dependencies in the input data is necessary. In contrast, the latent transformer core 3270 operates on latent space vectors produced by the homomorphic-dyadic compression and encryption 2100 system, without an embedding layer or positional encoding layer. This architecture excels when dealing with high-dimensional data that can be effectively compressed into a lower-dimensional latent space. The conventional transformer is optimal for scenarios where the sequential nature of the input is vital, such as in many natural language processing tasks, or when positional information is critical. It's also preferable for tasks that benefit from direct processing of input tokens. The latent transformer, on the other hand, is advantageous when working with high-dimensional data that can be effectively compressed, for tasks that benefit from learning a compact representation of the input, or when the overall structure or content of the input is more important than its exact sequential nature. The inclusion of both architectures allows the system to adapt to a wide range of problems in the domain of secure, privacy-preserving machine learning on encrypted data, with the specific choice between the two depending on the characteristics of the data and the requirements of the task at hand.

Data inputs 100 are preprocessed by an input processing module 2105 and then compressed into latent space vectors by a variational autoencoder (VAE) module 2110, which is part of homomorphic-dyadic compression and encryption system 2100. The latent space vectors are then transformed by a dyadic distribution transformer 2120 and processed by a dyadic distribution algorithm subsystem 2140, working with a transformation matrix generator 2145.

The stream generator 2130 within the homomorphic-dyadic compression and encryption system 2100 produces a main data stream of transformed latent vectors and a secondary stream of transformation information. These streams are then compressed by a Huffman encoder 2150 and interleaved by an interleaver 2160.

The homomorphically compressed and dyadically encrypted data is tokenized into sourceblocks by a tokenizer 2710 and assigned codewords by a codeword allocator 2720, using a codebook from the codebook generation subsystem 2730.

Two pathways for deep learning are provided: a conventional transformer-based architecture within the machine learning core 2740, and a latent transformer core 3270. The latter pathway directly uses the latent space vectors produced by the homomorphic-dyadic compression and encryption system.

For both pathways, the processed output is decrypted and decompressed by reversing the homomorphic-dyadic compression and encryption process using components of platform 2100, including the VAE decoder. An output manager 2190 is used to process the data, producing the final reconstructed output 2102.

The performance of the machine learning core is continuously improved by a machine learning training system 3600 using the processed data and training data. This architecture combines homomorphic-dyadic compression and encryption with large codeword models to enable secure and efficient deep learning on encrypted data, maintaining data privacy and security while allowing complex computations.

The system can be utilized in a scenario where sensitive data needs to be analyzed without compromising privacy. In a non-limiting use case example, consider a healthcare application where patient medical records are processed for research purposes. Patient data inputs 100 are first preprocessed by the input processing module 2105. This data is then compressed into latent space vectors and encrypted by the homomorphic-dyadic compression and encryption system 2100, creating a compressed and encrypted representation that preserves the mathematical properties of the original data while ensuring strong security.

Homomorphic-dyadic compression and encryption system 2100 applies both homomorphic compression and dyadic encryption in a single process, ensuring multiple layers of security. This doubly protected data is then tokenized 2710 and assigned codewords 2720.

Depending on the specific analysis required, the data is processed either through the conventional transformer-based architecture in the machine learning core 2740 or through the latent transformer core 3270. For example, the system might be used to identify patterns in patient treatment outcomes across various demographics.

Throughout this process, the actual content of the patient records remains encrypted, protecting individual privacy. The machine learning models work with encrypted data, leveraging the homomorphic properties to perform necessary computations without decrypting the sensitive information. After processing, the results are decrypted and decompressed using homomorphic-dyadic compression and encryption system 2100, providing meaningful insights from the analysis. The machine learning training system 3600 continually refines the model's performance based on the processed data, improving its ability to identify relevant patterns in future analyses.

This use case demonstrates how the system can enable complex data analysis while maintaining strict data privacy and security, a crucial requirement in fields like healthcare, finance, or any domain dealing with sensitive information.

In another non-limiting use case example, a financial institution is using this system for fraud detection across multiple banks without sharing sensitive customer transaction data.

Raw transaction data from various banks serves as the data inputs 100. This data is preprocessed by the input processing module 2105 to ensure consistency across different sources. homomorphic-dyadic compression and encryption system 2100 then compresses the transaction data into latent space vectors and applies dyadic encryption, creating a secure representation that maintains the mathematical relationships within the data without exposing actual transaction details. This doubly protected data is then tokenized by the tokenizer 2710 and assigned codewords by the codeword allocator 2720.

The system can then analyze this encrypted data for patterns indicative of fraudulent activity. It might use the conventional transformer-based architecture in the machine learning core 2740 for sequence analysis of transactions, or the latent transformer core 3270 for identifying subtle patterns across a large number of transactions.

Throughout this process, the specific details of individual transactions remain encrypted, preserving customer privacy and adhering to data protection regulations. The machine learning models work with the encrypted data, leveraging homomorphic properties to perform necessary computations without decrypting the sensitive information.

After processing, the results are decrypted and decompressed using homomorphic-dyadic compression and encryption system 2100 and organized by the output manager 2190. This provides insights into potential fraud patterns without ever exposing the raw transaction data. The machine learning training system 3600 continuously improves the model's performance, enhancing its ability to detect new and evolving fraud patterns over time.

This use case demonstrates how the system can enable collaborative data analysis across multiple organizations while maintaining strict data privacy and security, a crucial requirement in the financial sector where both data protection and fraud detection are paramount. Homomorphic-dyadic compression and encryption system's ability to provide both homomorphic properties and strong encryption in a single process enhances the efficiency and security of these operations.

Homomorphic-Dyadic Data Compression and Encryption

Figure 21:
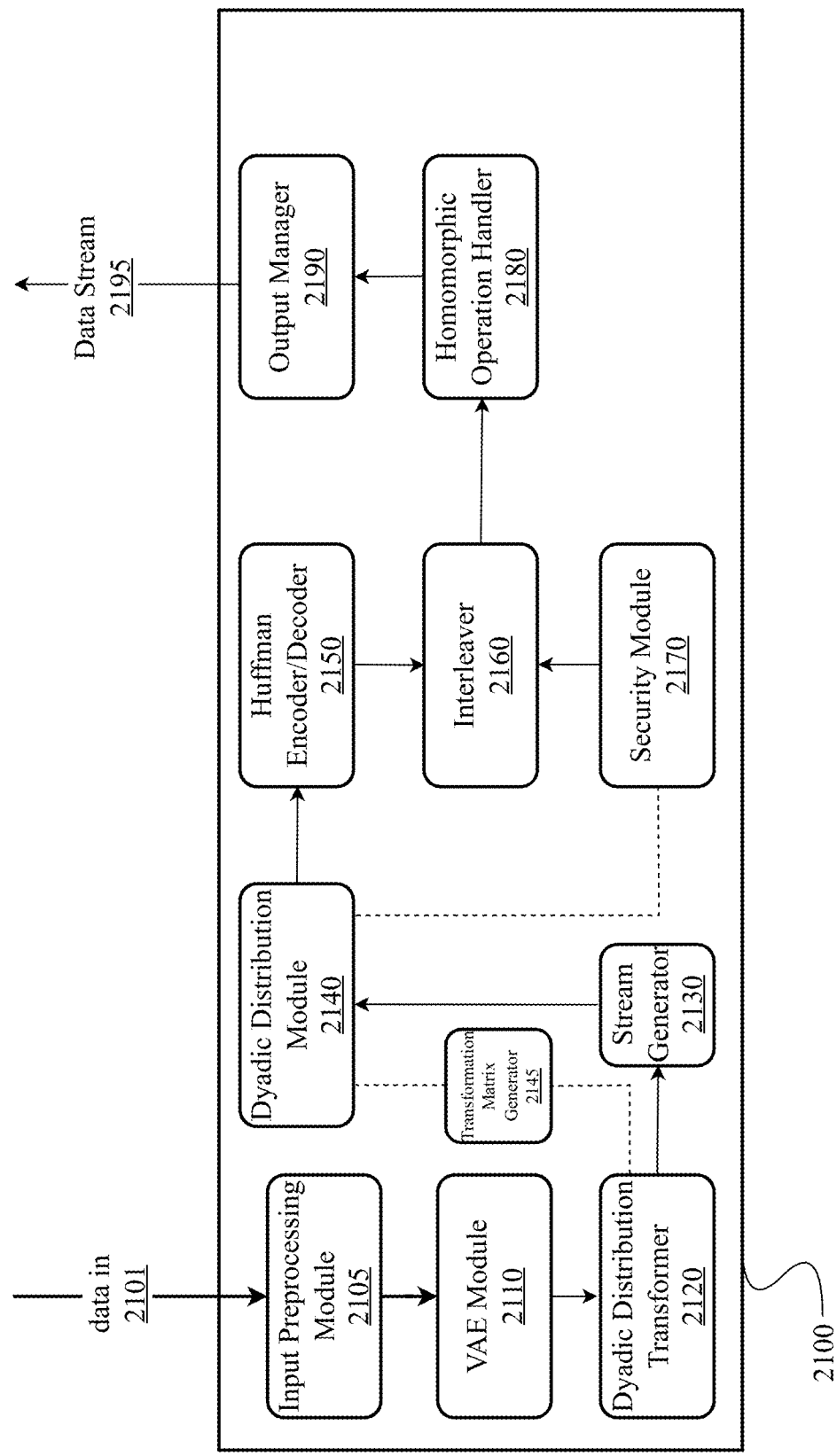
FIG. 21 is a block diagram illustrating an exemplary system architecture for a dyadic distribution-based compression and encryption platform.

FIG. 21 is a block diagram illustrating an exemplary system architecture for homomorphic-dyadic compression and encryption platform 2100, according to an embodiment. The platform 2100 comprises an input processing module 2105, a variational autoencoder (VAE) module 2110, a dyadic distribution transformer 2120, a stream generator 2130, a dyadic distribution algorithm subsystem module 2140 which integrates with a transformation matrix generator 2145, one or more Huffman encoder/decoders 2150, an interleaver 2160 which interfaces with a security subsystem module 2170, a homomorphic operation handler 2180, and an output manager 2190 which outputs a compressed, encrypted, and homomorphically operable data stream 2195.

In this architecture, data flows as illustrated. The input processing module 2105 first receives and analyzes the input data 2101, passing its analysis to the VAE module 2110. The VAE module 2110 compresses the input data into latent space vectors, which are then passed to the dyadic distribution transformer 2120. The dyadic distribution transformer 2120, working in conjunction with the transformation matrix generator 2145, applies the necessary transformations to reshape the latent space vectors into a dyadic distribution.

The stream generator 2130 then produces a main data stream of transformed latent vectors and a secondary stream of transformation information. The dyadic distribution module 2140 further processes these streams, implementing the core dyadic distribution algorithm. The Huffman encoder/decoder 2150 compresses the main data stream, which is then interleaved with the secondary transformation data stream by interleaver 2160.

The security module 2170 interacts with interleaver 2160 to ensure the cryptographic properties of the output stream are maintained. The homomorphic operation handler 2180 manages any homomorphic operations that need to be performed on the compressed and encrypted data. Finally, the output manager 2190 prepares the final compressed, encrypted, and homomorphically operable data stream 2195 for transmission or storage.

In some implementations, platform 2100 may be implemented as a cloud-based service or system which hosts and/or supports various microservices or subsystems (e.g., components 2110-2170 implemented as microservices/subsystems). In some implementations, platform 2100 may be implemented as computing device comprising a memory and a processor, with computer readable programming instructions (or other computer-readable storage media) stored within the memory and operable/executable by/on the processor which cause the computing device to perform various operations associated with the execution of one or more platform tasks described herein.

According to the embodiment, the input processing module 2105 is present and configured to analyze an input data stream to determine its statistical properties. This may comprise performing frequency analysis on data blocks within the input stream. It can determine the most frequent bytes or strings of bytes that occur at the beginning of each data block and designates these as prefixes. It may compile a prefix table based on the frequency distribution.

According to the embodiment, the VAE module 2110 is present and configured to compress the input data into latent space vectors. This module consists of an encoder network that compresses the input data and a decoder network that will be used in the decoding process. The latent space representation allows for homomorphic operations on the compressed data.

According to the embodiment, the dyadic distribution transformer 2120 is present and configured to transform the latent space vectors into a dyadic distribution. It works closely with the transformation matrix generator 2145 to create and apply a transformation matrix that reshapes the data distribution while introducing controlled randomness.

The dyadic distribution module 2140 receives the transformed latent space vectors and implements the core algorithm. This may comprise further transforming the latent space representation into a dyadic distribution whose Huffman encoding is close to uniform. It stores the transformations in a compressed secondary stream which may be (selectively) interwoven with the first, currently processing input stream.

Dyadic distribution module 2140 integrates with transformation matrix generator 2145. The transformation matrix generator creates and manages the transformation matrix B. According to an aspect, the generator constructs a nonnegative, row-stochastic matrix where each entry represents the probability of transforming one latent space state to another as an instance of matrix B. The matrix is configured to ensure that the transformation reshapes the latent space distribution while introducing controlled randomness and preserving homomorphic properties.

According to an implementation, transformation matrix generator 2145 creates the transformation matrix B based on the initial analysis of the input data distribution provided by the input processing module and the properties of the latent space representation. This matrix B is a component that dyadic distribution module 2140 will use throughout the process. As the dyadic distribution module receives each latent space vector, it consults the transformation matrix B to determine how to transform the data. For each state in the latent space, the transformer uses the corresponding row in matrix B to determine the probability distribution for transforming that state to other states. The dyadic distribution module may use a random number generator (such as provided by security module 2170) to select a transformation based on the probabilities in matrix B. This introduces controlled randomness into the process while maintaining homomorphic properties.

Through these transformations, the dyadic distribution module reshapes the latent space distribution to approach the dyadic distribution implied by the Huffman coding (as determined by the Huffman encoder/decoder). As transformations are applied, dyadic distribution module 2140 provides feedback to transformation matrix generator 2145 about the actual transformations performed. This allows the transformation matrix generator to refine matrix B if necessary. According to an embodiment, if the input data distribution changes over time, the transformation matrix generator can adapt matrix B based on new information from the input processing module. The dyadic distribution module will then use this updated matrix for subsequent transformations. The dyadic distribution module keeps track of the transformations it applies and generates a secondary data stream containing this information. This "transformation data" is important for the decoding process and may be interleaved with the main data stream by interleaver 2160. The transformation matrix generator continually works to optimize matrix B to minimize the amount of transformation data needed while maintaining the desired dyadic distribution and preserving homomorphic properties.

Both transformation components (dyadic distribution module and matrix generator) work together to ensure that the transformations contribute to the cryptographic security of the system while preserving homomorphic properties. The transformation matrix generator designs matrix B to make prediction of future states difficult, while the dyadic distribution module applies these transformations in a way that passes the modified next-bit test. In essence, the dyadic distribution module and transformation matrix generator form a tight feedback loop. The transformation matrix generator provides the rules for transformation (in the form of matrix B), while the dyadic distribution module applies these rules to the actual latent space data. The results of these transformations then inform potential updates to the transformation rules, allowing the system to maintain optimal compression, security, and homomorphic properties as it processes the data stream. This close interaction allows the system to dynamically balance compression efficiency, cryptographic security, and homomorphic capabilities, adapting to changes in the input data characteristics while maintaining the core properties that make the homomorphic-dyadic distribution algorithm effective.

The transformed latent space data then flows into a Huffman encoder/decoder 2150 which is configured to perform Huffman coding for compression and decoding for decompression. This may comprise constructing a Huffman tree based on the probability distribution of the transformed latent space data, and assigning shorter codewords to more frequent symbols for compression. For decompression, it reverses the process.

According to the embodiment, interleaver 2160 is present and configured to interleave the compressed and encrypted data streams. This may comprise combining the main data stream (e.g., the input data stream that has been processed by one or more platform components) with the secondary "transformation data" stream according to a specific partitioning scheme to create the final output. This scheme is designed to maximize security while maintaining efficient compression. Interleaver 2160 may integrate with security module 2170 during data processing. In an embodiment, security module implements security features such as the modified next-bit test. For example, the interleaver works with the security module to determine how many bits from each stream should be included in each block of the output. This allocation may be dynamic and based on security requirements and the current state of the data. In some implementations, before interleaving, the security module encrypts the transformation data using a cryptographic algorithm. This adds an extra layer of security to the sensitive information about how the data was transformed. In some implementations, the security module provides cryptographically secure random numbers to the interleaver (or other platform components such as dyadic distribution module). These may be used to introduce controlled randomness into the interleaving process, making it harder for an adversary to separate the two streams.

As the interleaver combines the streams, the security module performs ongoing checks to ensure the resulting stream maintains the required cryptographic properties, such as passing the modified next-bit test. According to an aspect, security module 2170 monitors the entropy of the interleaved stream. If the entropy drops below a certain threshold, it signals the interleaver to adjust its strategy, possibly by including more bits from the transformation data stream. In embodiments where the system uses cryptographic keys (e.g., for encrypting the transformation data), the security module manages these keys and provides them to the interleaver as needed. According to an aspect, based on feedback from the security module about the cryptographic strength of recent output, interleaver 2160 may adaptively change its interleaving strategy.

In an implementation, the security module advises the interleaver on how to maintain consistent timing in its operations to prevent timing-based attacks. This might involve adding deliberate delays or dummy operations. The interleaver may consult the security module on how to securely include any necessary headers or metadata in the output stream. This ensures that even auxiliary data doesn't compromise the system's security. According to an aspect, security module 2170 provides integrity check values (e.g., hash values or MAC codes) to interleaver 2160, which are then incorporated into the output stream. These allow the receiver to verify the integrity of the received data. According to another aspect, security module 2170 guides the interleaver in implementing techniques to resist side-channel attacks, such as ensuring that the power consumption or electromagnetic emissions during interleaving don't leak information about the data being processed.

In an implementation, if the interleaver encounters any issues during the interleaving process, it may consult the security module on how to handle these errors securely without leaking information about the underlying data or transformation process. In an implementation, the interleaver, guided by the security module, can include secure hints or markers in the output stream that will assist in the decoding process without compromising security. The interleaver and security module work in tandem to produce an output stream that is both compressed and securely encrypted. The interleaver focuses on efficiently combining the data streams, while the security module ensures that every step of this process maintains the cryptographic properties of the system. This close cooperation allows the platform to achieve its dual goals of data compression and encryption in a single, efficient process.

The homomorphic operation handler 2180 is present and configured to manage any homomorphic operations that need to be performed on the compressed and encrypted data. This component ensures that the homomorphic properties of the latent space representation are preserved throughout the compression and encryption process.

The output manager 2190 is present and configured to prepare the final compressed, encrypted, and homomorphically operable data stream 2195 for transmission or storage. It ensures that all necessary information for decoding and performing homomorphic operations is properly included in the output stream.

Figure 22:
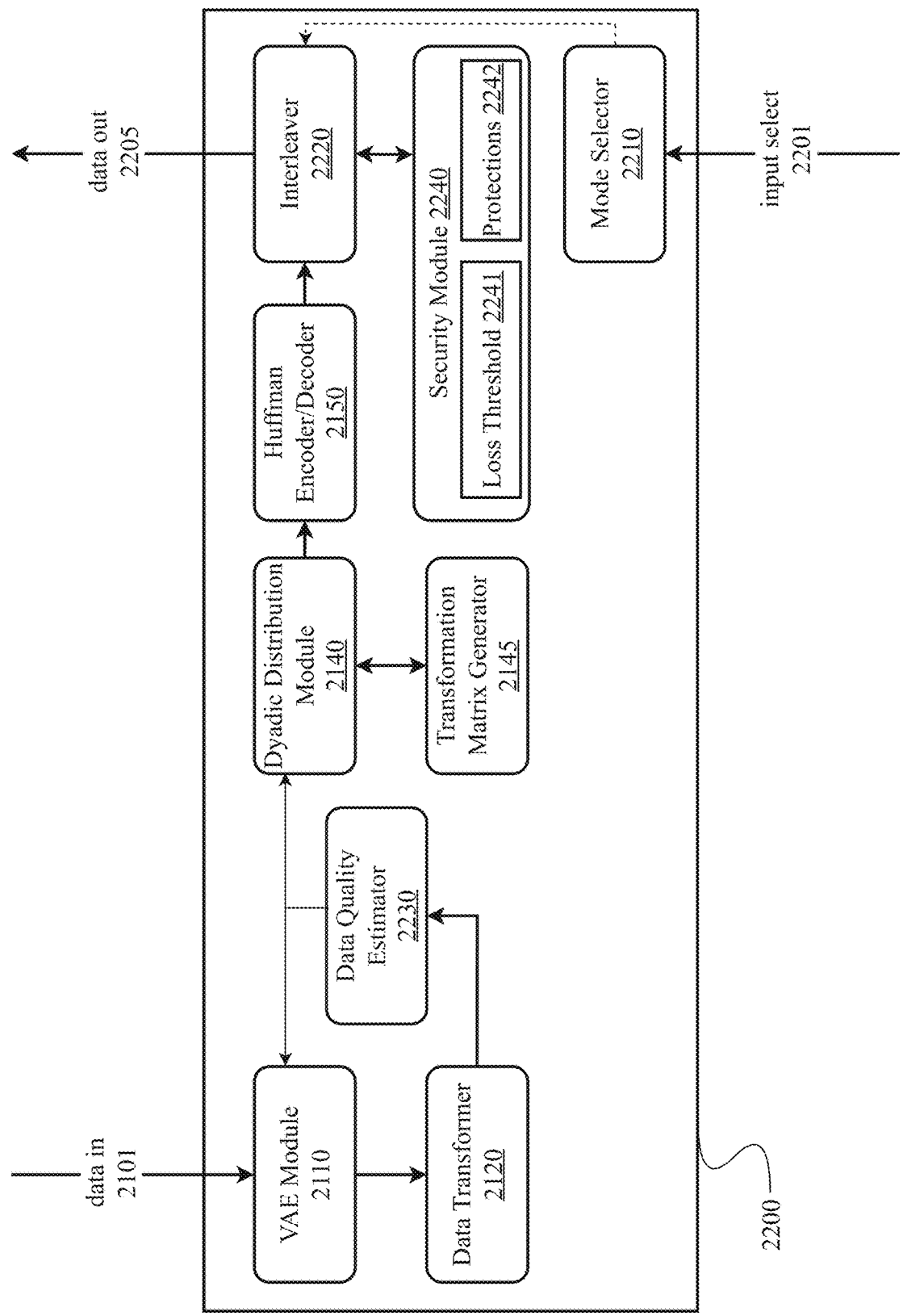
FIG. 22 is a block diagram illustrating another exemplary system architecture for a dyadic distribution-based compression and encryption platform

FIG. 22 is a block diagram illustrating another exemplary system architecture for a dyadic distribution-based compression and encryption platform 2200, according to an embodiment. According to an embodiment, a modification to the compression and encryption platform 2200 could be implemented as an optional mode within the existing platform architecture, allowing for flexibility in its application. For example, this may require the addition of a mode selector component 2210, which can determine whether to operate in the original lossless mode, the new lossy, high-security mode, in a modified lossless mode. Mode selector 2210 may receive input data 2201 which selects or otherwise sets the mode of operation of platform 2200. Input select data may be received from various sources such as, for example, a platform user (human or computer implemented agent), or an external application, service, or computing resource.

According to an embodiment, the platform may be modified to only send the modified stream without the secondary stream containing the modification information. This alteration fundamentally changes the nature of the compression from lossless to lossy, while simultaneously strengthening the encryption aspect of the system. The dyadic distribution module, guided by transformation matrix generator 2140, would still modify the input data to achieve a dyadic distribution. However, without the accompanying transformation data stream, perfect reconstruction of the original data becomes impossible, even with possession of the codebook used by Huffman encoder/decoder 2150.

Interleaver 2220 may receive from mode selector 2210 a signal and/or instruction on what process to apply to the one or more input data streams. If the platform is configured to perform the original lossless mode, interleaver 2220 interleaves the compressed latent space data stream and the secondary transformation data stream. If the platform is configured to perform lossy compression, interleaver 2220 does not interleave the two data streams, but instead transmits only the compressed latent space data stream. If the platform is configured to perform a modified lossless compression, interleaver 2220 can transmit the compressed latent space data stream by itself in a first transmission session, and then it may transmit the secondary transformation data stream by itself in a second transmission session. In some embodiments, the secondary transformation data stream may be encrypted according to a suitable data encryption technique prior to transmission.

Security module's 2240 role becomes even more critical in the implementation of the lossy modified system. It ensures that the encrypted latent space data stream maintains its cryptographic strength, potentially approaching perfect encryption. The absence of the secondary stream eliminates a potential attack vector, as the transformation information is never transmitted. Interleaver's 2220 function would be simplified, focusing solely on managing the primary latent space data stream, but it would still work closely with the security module to maintain the stream's cryptographic properties.

This approach presents a compelling trade-off between data integrity, transmission efficiency, enhanced security, and homomorphic capabilities. The input processing module's role remains the same in analyzing the input data characteristics, allowing the platform to optimize the compression, transformation, and homomorphic processes. The loss of data introduced by this method is directly related to the transformations applied by the VAE module and the dyadic distribution transformer, guided by the transformation matrix generator.

Potential applications for this modified system include scenarios where perfect data reconstruction is not critical, but high compression ratios, stringent security requirements, and homomorphic operations are paramount. Examples may include certain types of media streaming, sensor data transmission in IoT environments, secure transmission of non-critical telemetry data, or privacy-preserving computations on encrypted data.

According to an embodiment, to address concerns about data integrity, platform 2200 may incorporate a configurable loss threshold 2241 managed by security module 2240. This threshold can allow users to set a maximum acceptable level of data loss. If the estimated loss exceeds this threshold, the platform could automatically revert to the lossless mode or alert the user. The threshold may also consider the impact on homomorphic operations. Additionally, the platform may be extended to include a data quality estimator component 2230. This component may work in conjunction with various components (e.g., input processing module, VAE module, dyadic distribution transformer) to provide real-time estimates of the quality of the compressed and encrypted data compared to the original, as well as the precision of potential homomorphic operations. This could be particularly useful in applications like media streaming or privacy-preserving analytics, where maintaining a certain level of perceptual quality or computational accuracy is crucial.

Finally, it's worth noting that the lossy, high-security mode could potentially offer resistance to certain types of side-channel attacks, as the lack of perfect reconstruction could mask some of the subtle correlations that these attacks often exploit. In an embodiment, security module 2240 can be expanded to include specific protections 2242 against such attacks, further enhancing the overall security profile of the system. These protections would aim to mitigate various types of side-channel vulnerabilities that could potentially leak information about the encryption process, the homomorphic operations, or the data being processed.

Figure 23:
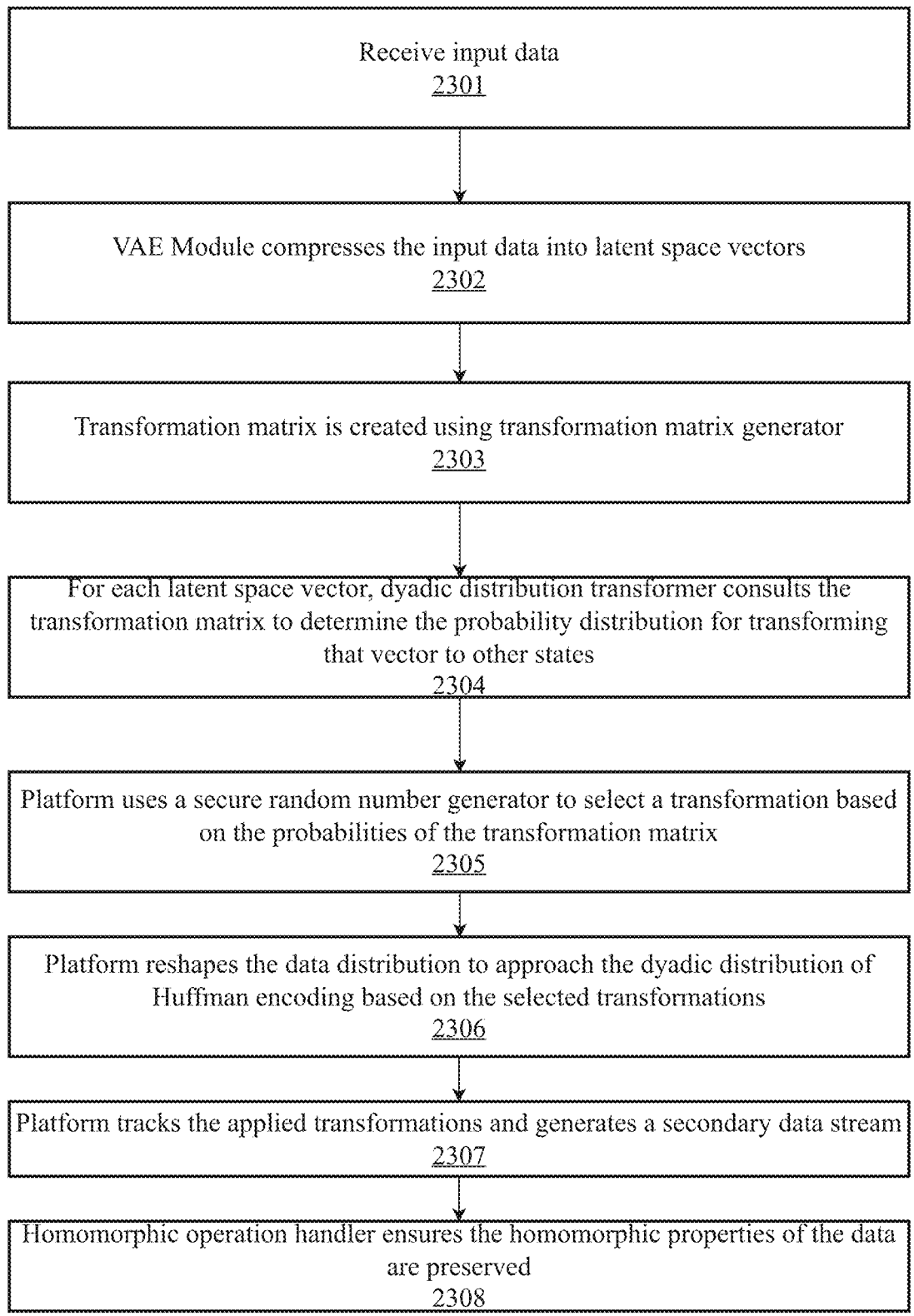
FIG. 23 is a flow diagram illustrating an exemplary method 2300 for implementing a dyadic distribution algorithm.

FIG. 23 is a flow diagram illustrating an exemplary method 2300 for implementing the Homomorphic-Dyadic Compression and Encryption 2100 algorithm, according to an aspect. The method may be performed, in whole or in part, by one or more homomorphic-dyadic compression and encryption platforms. According to the aspect, the process begins at step 2301 when the input processing module 2105 receives input data. At step 2302, the VAE module 2110 compresses the input data into latent space vectors. At step 2303, the platform creates a transformation matrix using the transformation matrix generator 2145. At step 2304, for each latent space vector, the dyadic distribution transformer 2120 consults the transformation matrix to determine the probability distribution for transforming that vector to other states. At step 2305, the platform uses a secure random number generator to select a transformation based on the probabilities in the transformation matrix. At step 2306, the platform reshapes the data distribution to approach the dyadic distribution of Huffman encoding based on the selected transformations. At step 2307, the platform keeps track of the applied transformations and generates a secondary data stream. Finally, at step 2308, the homomorphic operation handler 2180 ensures that the homomorphic properties of the data are preserved throughout the process.

Figure 24:
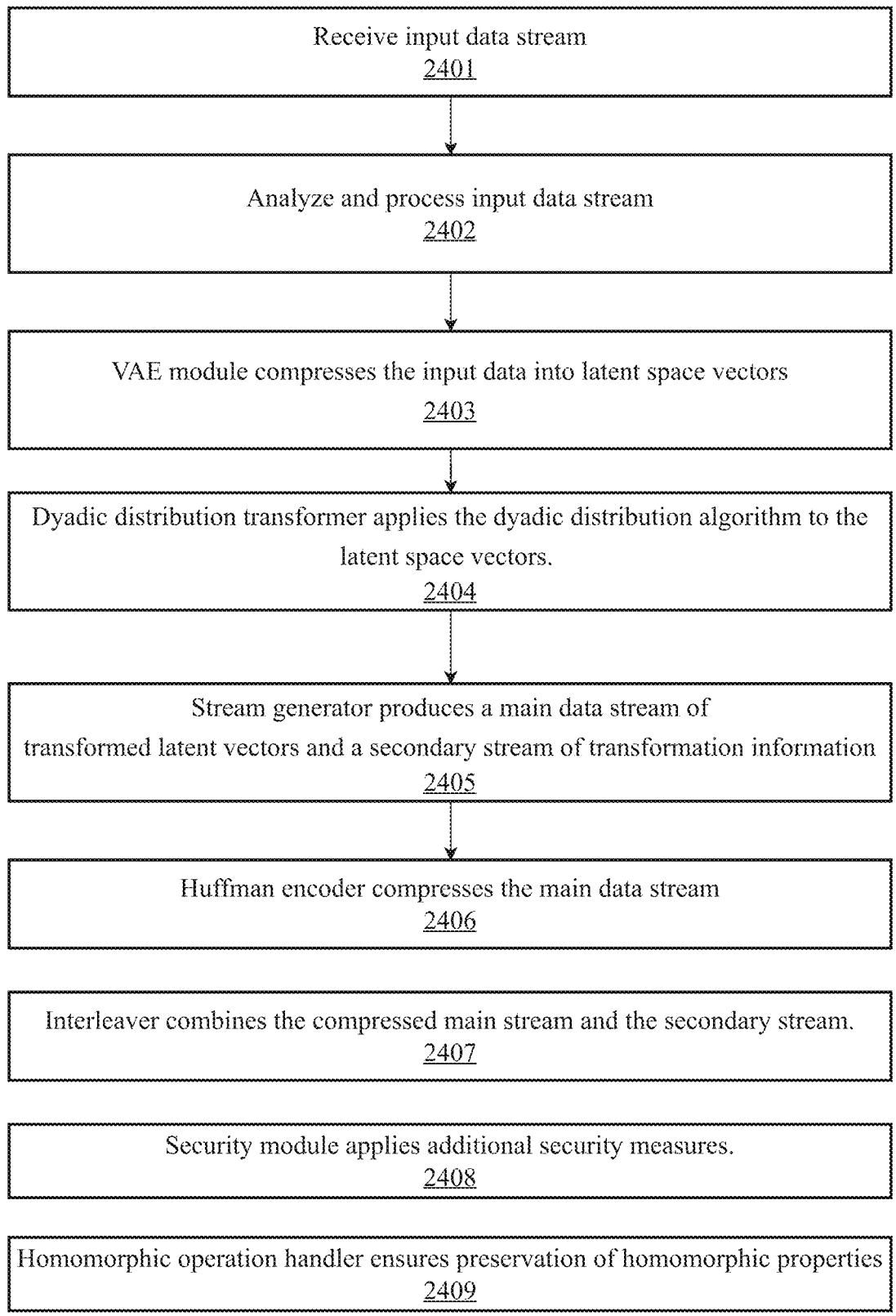
FIG. 24 is a flow diagram illustrating an exemplary method 2400 for providing lossless, dyadic distribution-based compression and encryption.

FIG. 24 is a flow diagram illustrating an exemplary method 2400 for providing lossless, homomorphic-dyadic compression and encryption, according to an aspect. According to the aspect, the process begins at step 2401 when platform 2100 receives, retrieves, or otherwise obtains an input data stream. At step 2402, the input processing module analyzes and processes the input data stream. This may comprise frequency analysis and other statistical property assessments. At step 2403, the VAE module compresses the input data into latent space vectors. At step 2404, the dyadic distribution transformer applies the dyadic distribution algorithm to the latent space vectors. At step 2405, the stream generator produces a main data stream of transformed latent vectors and a secondary stream of transformation information. At step 2406, the Huffman encoder compresses the main data stream. At step 2407, the interleaver combines the compressed main stream and the secondary stream. At step 2408, the security module applies additional security measures. Finally, at step 2409, the homomorphic operation handler ensures the preservation of homomorphic properties throughout the process, and the output manager prepares the final compressed, encrypted, and homomorphically operable data stream.

Large Codeword Model Deep Learning with Homomorphic-Dyadic Compressed and Encrypted Data The integration of homomorphic-dyadic compression and encryption with the large codeword model offers numerous advantages. Foremost, it enhances security by allowing secure processing of encrypted data throughout the entire pipeline, enabling privacy-preserving computations on sensitive information. The compressed nature of the input increases efficiency, reducing computational and storage requirements, which allows the system to handle larger datasets more effectively. Importantly, the homomorphic properties of the encryption permit certain operations to be performed on the data without decryption, maintaining data confidentiality during learning and prediction processes. This approach provides a standardized input format regardless of the original data modality, potentially simplifying the model architecture. It also reduces the risk of unintended data leakage during processing and improves scalability by enabling the model to learn from vast amounts of data while remaining privacy-compliant. The encrypted nature of the data could facilitate secure multi-party computations or federated learning scenarios. Additionally, this system can potentially handle various data types through the same pipeline, as they're all transformed into a similar encrypted format. Lastly, with data remaining encrypted throughout processing, there are fewer points where an attacker could intercept or manipulate raw data, thus reducing the overall attack surface.

Figure 27:
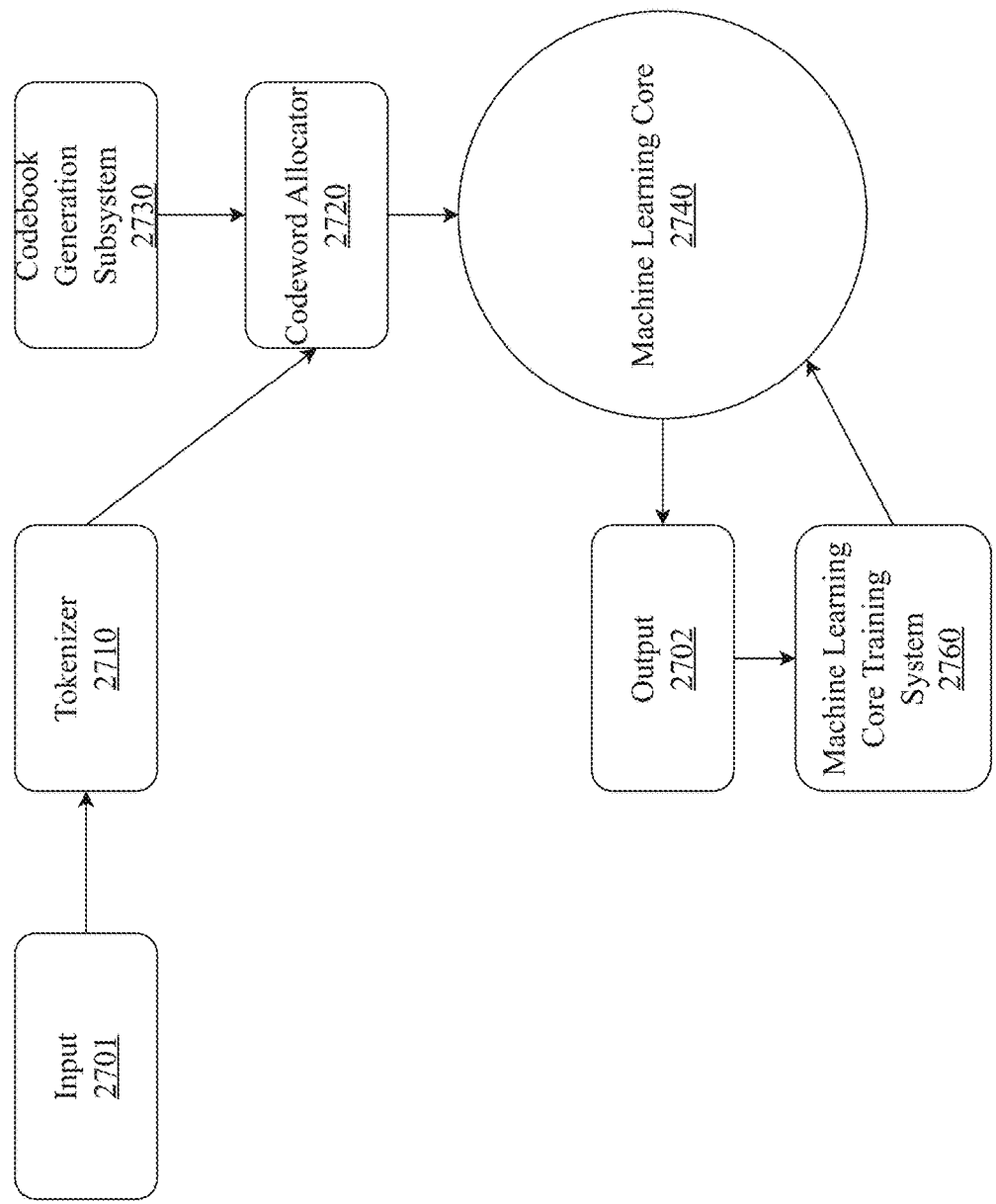
FIG. 27 is a block diagram illustrating an exemplary system architecture for a large codeword model for deep learning.

FIG. 27 is a block diagram illustrating an exemplary system architecture for a large codeword model for deep learning, which processes the output of the homomorphic-dyadic compression and encryption system (2100) described in FIGS. 20 and 21. Input 2701 represents the homomorphically compressed and dyadically encrypted data that has been processed by system 2100. This data, already in a secure and compressed form, can originally stem from various modalities, such as text, images, audio, time series, or any other structured or unstructured format, but has been transformed into a standardized, encrypted representation by system 2100. The input data 2701 is fed into the tokenizer 2710 for further processing within the large codeword model architecture.

A tokenizer 2710 is responsible for splitting the input data into meaningful semantic units called sourceblocks. This process, known as semantic splitting, aims to capture the inherent structure and patterns in the data. The tokenizer can employ various techniques to identify the optimal sourceblocks, such as rule-based splitting, statistical methods, or machine learning approaches. For textual data, the tokenizer may use subword tokenization methods like Byte-Pair Encoding (BPE) or WordPiece, which break down words into smaller, more frequently occurring units. For images, the tokenizer may use approaches such as but not limited to a patch-approach, where the image is divided into fixed-size patches or regions. The specific tokenization method can be chosen based on the data modality and the characteristics of the domain. For example, the first paragraph of Leo Tolstoy's War and Peace which reads, "Well, Prince, so Genoa and Lucca are now just family estates of the Buonapartes," may be tokenized into ['Well', ',', 'Prince', ',', 'so', 'Gen', 'oa', 'and', 'Luc', 'ca', 'are', 'now', 'just', 'family', 'estates', 'of', 'the', 'Buon', 'apar', 'tes', '.'].

In one embodiment, the tokenizer may utilize Huffman coding to split the data into sourceblocks. The Huffman coding-based tokenizer enables efficient and semantically meaningful splitting of the input data into sourceblocks. Huffman coding is a well-known data compression algorithm that assigns variable-length codes to symbols based on their frequency of occurrence. In the context of the LCM, the Huffman coding-based tokenizer adapts this principle to perform semantic splitting of the input data.

In another embodiment, tokenizer 2710 is responsible for splitting the homomorphically compressed and dyadically encrypted input data into meaningful semantic units called sourceblocks. This process, known as semantic splitting, aims to capture the inherent structure and patterns in the encrypted data while maintaining its secure properties. The tokenizer employs specialized techniques to identify optimal sourceblocks within the encrypted data structure, adapting its approach based on the characteristics of the homomorphic-dyadic encryption scheme used in system 2100.

With Huffman coding, the tokenizer starts by analyzing the input data and identifying the basic units of meaning, such as words, phrases, or subwords, depending on the specific data modality and the desired level of granularity. These basic units form the initial set of sourceblocks. The tokenizer then performs a frequency analysis of the sourceblocks, counting the occurrences of each sourceblock in the input data. Based on the frequency analysis, the tokenizer constructs a Huffman tree, which is a binary tree that represents the probability distribution of the sourceblocks. The Huffman tree is built by iteratively combining the two least frequent sourceblocks into a single node, assigning binary codes to the branches, and repeating the process until all sourceblocks are included in the tree. The resulting Huffman tree has the property that sourceblocks with higher frequencies are assigned shorter codes, while sourceblocks with lower frequencies are assigned longer codes.

The Huffman coding-based tokenizer then uses the constructed Huffman tree to perform semantic splitting of the input data. It traverses the input data and matches the sequences of symbols against the sourceblocks represented in the Huffman tree. When a sourceblock is identified, the tokenizer assigns the corresponding Huffman code to that sourceblock, effectively compressing the data while preserving its semantic structure. The use of Huffman coding for semantic splitting offers several advantages. It allows for variable-length sourceblocks, enabling the tokenizer to capture meaningful units of varying sizes. This is particularly useful for handling data with different levels of complexity and granularity, such as text with compound words or images with hierarchical structures.

A Huffman coding-based approach optimizes the representation of the sourceblocks based on their frequency of occurrence. By assigning shorter codes to more frequent sourceblocks and longer codes to less frequent ones, the tokenizer achieves data compression while still preserving the semantic information. This compression reduces the overall size of the data and improves the efficiency of subsequent processing stages. Additionally, the Huffman tree construction process inherently captures the statistical properties and patterns within the input data. The resulting sourceblocks and their assigned codes reflect the underlying structure and relationships present in the data. This semantic awareness enhances the ability of the LCM to learn and generate meaningful representations.

After the semantic splitting process, the resulting sourceblocks and their assigned Huffman codes are passed to the codeword allocator. The codeword allocator maps each sourceblock to a unique codeword, which is a compact representation used by the subsequent components of the LCM architecture. The codeword mapping can be based on various schemes, such as a fixed-length binary encoding or a learned embedding space.

Once the input data is tokenized into sourceblocks, the codeword allocator 2720 assigns a unique codeword to each sourceblock. The codewords are discrete, compressed representations of the sourceblocks, designed to capture the essential information in a compact form. The codeword allocator can use various mapping schemes to assign codewords to sourceblocks, such as hash functions, lookup tables, or learned mappings. For example, a simple approach could be to use a hash function that maps each sourceblock to a fixed-length binary code. Alternatively, another approach may involve learning a mapping function that assigns codewords based on the semantic similarity of the sourceblocks.

The codebook generation subsystem 2730 is responsible for creating and maintaining the codebook, which is a collection of all the unique codewords used by the LCM. The codebook can be generated offline, before the actual processing begins, or it can be updated dynamically as new sourceblocks are encountered during processing. The codebook generation subsystem can use various techniques to create a compact and efficient codebook, such as frequency-based pruning, clustering, or vector quantization. The size of the codebook can be adjusted based on the desired trade-off between compression and information preservation. Going back to the War and Peace example, the string of tokens ['Well', ',', 'Prince', ',', 'so', 'Gen', 'oa', 'and', 'Luc', 'ca', 'arc', 'now', 'just', 'family', 'estates', 'of', 'the', 'Buon', 'apar', 'tes', '.'] may be given codewords such as [12, 5, 78, 5, 21, 143, 92, 8, 201, 45, 17, 33, 49, 62, 87, 11, 2, 179, 301, 56, 4], where each token is assigned a unique codeword, which is represented as an integer. The mapping between tokens and codewords is determined by the codebook generated by the LCM system.

The machine learning core 2740 is the central component of the LCM architecture, where the actual learning and processing take place. The core operates on the codewords generated by the codeword allocator, learning to process, generate, and manipulate the compressed representations. The machine learning core can be implemented using various configurations, depending on the specific task and data modality. Some possible variations include:

In one embodiment, the machine learning core 2740 may be a Transformer-based core. The Transformer-based core consists of several key components. An embedding layer maps the codewords to dense vector representations, capturing their semantic and syntactic properties. Positional encoding is used to incorporate positional information into the codeword embeddings, enabling the Transformer to distinguish the relative positions of the codewords in the input sequence. The multi-head attention mechanism, which is the core building block of the Transformer, allows the model to attend to different parts of the input sequence simultaneously, capturing complex dependencies and relationships between codewords. Feed-forward networks are used to introduce non-linearity and increase the expressive power of the model. Residual connections and layer normalization are employed to facilitate the flow of information and stabilize the training process.

The Transformer-based core can be implemented using an encoder-decoder architecture. The encoder processes the input codewords and generates contextualized representations, while the decoder takes the encoder's output and generates the target codewords or the desired output sequence. The encoder and decoder are composed of multiple layers of multi-head attention and feed-forward networks, allowing for deep and expressive processing of the codeword representations.

One of the key advantages of the Transformer-based core in the LCM architecture is its ability to capture long-range dependencies between codewords. Unlike recurrent neural networks (RNNs), which process the input sequentially, the Transformer can attend to all codewords in parallel, enabling it to effectively capture relationships and dependencies that span across the entire input sequence. This is useful for processing long and complex data sequences, where capturing long-range dependencies is crucial for understanding the overall context. Another advantage of the Transformer-based core is its parallelization capability. The self-attention mechanism in the Transformer allows for efficient parallel processing of the codewords on hardware accelerators like GPUs. This parallelization enables faster training and inference times, making the LCM architecture suitable for processing large amounts of data in real-time applications.

The Transformer-based core also generates contextualized representations of the codewords, where each codeword's representation is influenced by the surrounding codewords in the input sequence. This contextualization allows the model to capture the semantic and syntactic roles of the codewords based on their context, enabling a deeper understanding of the relationships and meanings within the data. The scalability of the Transformer-based core is another significant advantage in the LCM architecture. By increasing the number of layers, attention heads, and hidden dimensions, the Transformer can learn more complex patterns and representations from large-scale datasets. This scalability has been demonstrated by models like GPT-3, which has billions of parameters and can perform a wide range of tasks with impressive performance.

In another embodiment, the machine learning core 2740 may utilize a Variational Autoencoder (VAE)-based core 2750. A VAE-based core consists of two main components: an encoder and a decoder. The encoder takes the codewords as input and maps them to a lower-dimensional latent space representation. The encoder is typically implemented as a neural network, such as a multi-layer perceptron (MLP) or a convolutional neural network (CNN), depending on the nature of the codewords and the data modality. The encoder learns to compress the codewords into a compact latent representation while capturing the essential features and relationships within the data.

The decoder, on the other hand, takes the latent space representation and reconstructs the original codewords. The decoder is also implemented as a neural network, typically the inverse architecture of the encoder. The decoder learns to map the latent space representation back to the codeword space, generating codewords that closely resemble the original input. One of the key advantages of the VAE-based core in the LCM architecture is its ability to learn a continuous and structured latent space representation of the codewords. The latent space captures the underlying patterns and relationships within the data, allowing for smooth interpolation and generation of new codewords. By sampling from the latent space, the VAE-based core can generate novel and meaningful codewords that are similar to the original data distribution.

The VAE-based core also enables efficient compression of the codewords. By encoding the codewords into a lower-dimensional latent space, the VAE reduces the storage and computational requirements of the LCM. The compact latent representation can be used for various downstream tasks, such as data compression, similarity search, or data generation. The VAE-based core in the LCM architecture offers several advantages over traditional data processing techniques. It enables the learning of a compact and expressive latent representation of the codewords, capturing the essential features and relationships within the data. The continuous latent space allows for smooth interpolation and generation of new codewords, enabling tasks such as data augmentation, anomaly detection, and creative content generation.

The LCM architecture with the VAE-based core has a wide range of applications across various domains. In natural language processing, it can be used for tasks such as language modeling, text generation, and text compression. In computer vision, the VAE-based core can be applied to image compression, image generation, and unsupervised representation learning. The architecture can also be used for audio and speech processing, where the codewords represent audio features, enabling tasks such as audio compression, speech synthesis, and music generation.

In another embodiment, the machine learning core 2740 may be a Recurrent Neural Network (RNN)-based core. The RNN-based core consists of one or more recurrent layers, such as Long Short-Term Memory (LSTM) or Gated Recurrent Unit (GRU) layers. These recurrent layers maintain an internal state that allows them to remember and process information from previous time steps, enabling the capture of long-term dependencies and context within the codeword sequences.

The RNN-based core takes a sequence of codewords as input and processes them one at a time. At each time step, the RNN-based core updates its internal state based on the current input codeword and the previous state. This allows the core to learn and encode the temporal dependencies and patterns within the codeword sequences.

The RNN-based core can be used for various tasks, such as codeword sequence prediction, codeword generation, and sequence-to-sequence mapping. In codeword sequence prediction, the RNN-based core learns to predict the next codeword in a sequence given the previous codewords. This enables tasks such as language modeling, time series forecasting, and predictive maintenance.

In codeword generation, the RNN-based core can be trained to generate new codeword sequences based on a learned probability distribution. By sampling from this distribution, the core can generate novel and coherent codeword sequences that resemble the training data. This has applications in tasks such as text generation, music composition, and synthetic data generation. Sequence-to-sequence mapping involves using two RNN-based cores, an encoder and a decoder, to map an input codeword sequence to an output codeword sequence. The encoder RNN processes the input sequence and generates a fixed-length context vector that captures the essential information. The decoder RNN takes the context vector and generates the output codeword sequence step by step. This architecture has been successfully applied to tasks such as machine translation, speech recognition, and image captioning.

The RNN-based core in the LCM architecture offers several advantages over traditional data processing techniques. It enables the capture and modeling of temporal dependencies and sequential patterns within the codeword sequences, which is crucial for processing and generating sequential data. The RNN-based core can learn and adapt to the specific characteristics and patterns of the data, allowing for more accurate and contextually relevant processing and generation. Furthermore, the RNN-based core can handle variable-length sequences, making it suitable for processing data with different lengths and temporal resolutions. The recurrent nature of the RNN allows it to maintain and propagate information over long sequences, enabling the capture of long-term dependencies and context.

In another embodiment, the core can be implemented as a hybrid of multiple architectures, combining the strengths of different approaches. For example, a Transformer-VAE hybrid can be used, where the Transformer encoder generates contextualized representations of the codewords, and the VAE decoder generates new codewords based on the learned latent space. The specific choice of the machine learning core can be tailored to the requirements of the task and the characteristics of the data. The modular nature of the LCM architecture allows for easy experimentation and adaptation of different core configurations.

After processing the codewords, the machine learning core generates the output 2702 in the desired format. The output can be in the form of codewords, which can be mapped back to the corresponding sourceblocks or tokens using the inverse mapping scheme. Alternatively, the output can be directly generated in the target modality, such as text, images, or audio, depending on the specific application.

The LCM architecture offers several advantages over traditional deep learning approaches. By operating on compressed codewords instead of raw tokens, the LCM can reduce the computational and memory requirements, making it more efficient and scalable. The semantic splitting and codeword representation also allow the LCM to capture the inherent structure and patterns in the data, enabling more effective learning and generalization. Moreover, the modular nature of the LCM architecture allows for easy adaptation to different data modalities and tasks, making it a versatile and flexible framework for various applications.

Figure 28:
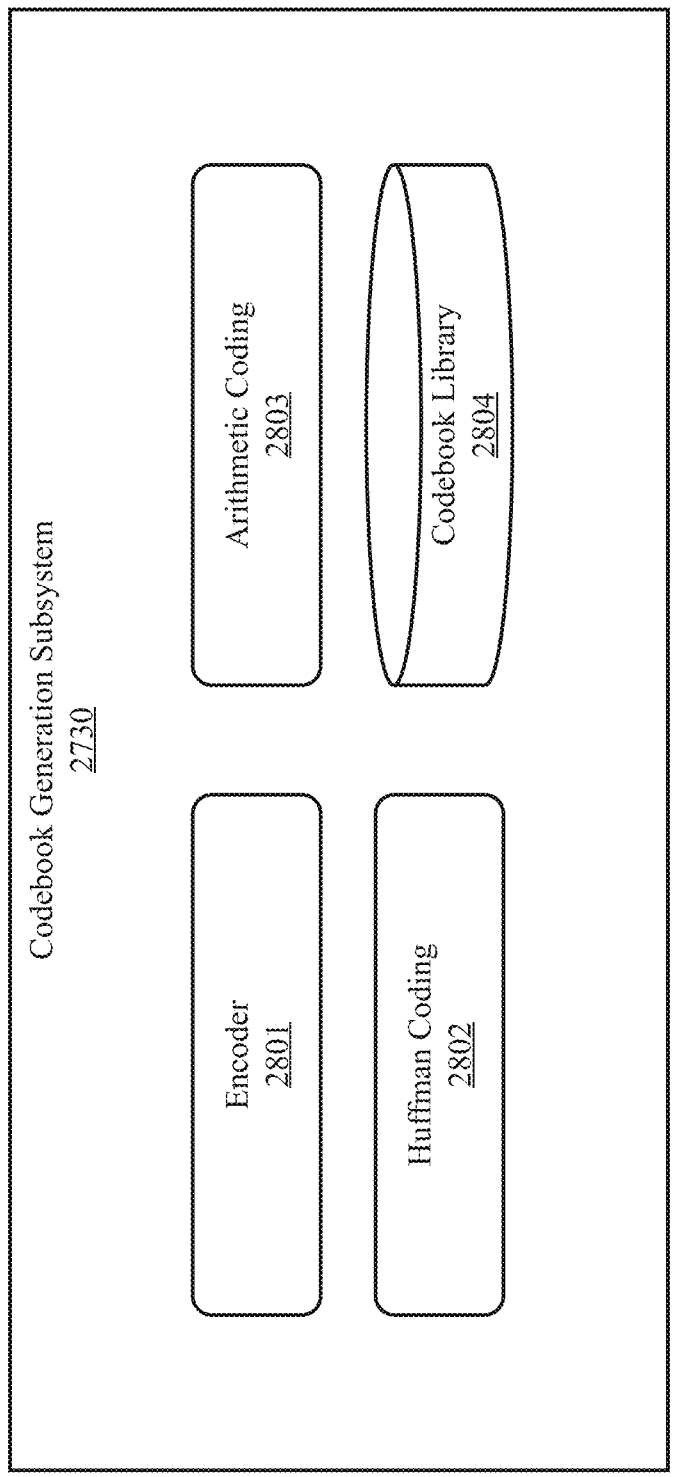
FIG. 28 is a block diagram illustrating an aspect of system and method for a large codeword model for deep learning.

FIG. 28 is a block diagram illustrating an aspect of system and method for a large codeword model for deep learning, a codeword generation subsystem. According to the aspect, codebook generation subsystem 2730 is configured to generate one or more codebooks for a collection of input data using various techniques, such as Huffman coding or arithmetic coding.

The codebook is an important component of the codebook-based homomorphic compression system. According to the embodiment, it is a collection of codewords, where each codeword corresponds to a sourceblock in the tokenized input. The codebook may generated based on the frequency distribution of the tokenized inputs, assigning shorter codewords to more frequently occurring tokens and longer codewords to less frequent tokens. There are several techniques for generating the codebook, with the goal of minimizing the average codeword length while maintaining the uniqueness of the codewords. Two common techniques are Huffman coding 2802 and arithmetic coding 2803. Huffman coding 2802 is a variable-length coding technique that assigns codewords based on the frequency of occurrence of each symbol (sourceblock). It constructs a binary tree, known as the Huffman tree, where each leaf node represents a symbol and the path from the root to the leaf determines the codeword. More frequent symbols are assigned shorter codewords, while less frequent symbols receive longer codewords. Huffman coding guarantees an optimal prefix code, meaning no codeword is a prefix of any other codeword. For example, consider the quantized temperature data from the previous example. Let's say the frequency distribution of the intervals is as follows:

Sourceblock 0: 5%
Sourceblock 1: 10%
Sourceblock 2: 20%
Sourceblock 3: 15%
Sourceblock 4: 50%

Using Huffman coding, the codebook generation subsystem 2730 can generate the following codebook:

Sourceblock 0: 1100
Sourceblock 1: 101
Sourceblock 2: 00
Sourceblock 3: 01
Sourceblock 4: 11

The most frequent tokenized input (Sourceblock 4) receives the shortest codeword (11), while the least frequent tokenized input (Sourceblock 0) receives the longest codeword (1100). Arithmetic coding 2803 is another entropy coding technique that assigns codewords to sourceblocks based on their probability distribution. Unlike Huffman coding, arithmetic coding does not assign fixed codewords to symbols. Instead, it represents the entire message as a single fractional number between 0 and 1. The interval [0, 1) is recursively divided based on the probabilities of the symbols, and the final codeword is a binary fraction that falls within the subinterval corresponding to the entire message. Arithmetic coding achieves near-optimal compression rates but requires more computational complexity compared to Huffman coding. For example, using the same quantized temperature data and frequency distribution as before, arithmetic coding would assign subintervals to each symbol based on their probabilities:

Sourceblock 0: [0.00, 0.05)
Sourceblock 1: [0.05, 0.15)
Sourceblock 2: [0.15, 0.35)
Sourceblock 3: [0.35, 0.50)
Sourceblock 4: [0.50, 1.00)

To encode a message sequence like [Sourceblock 4, Sourceblock 2, Sourceblock 1], arithmetic coding would recursively subdivide the interval [0, 1) based on the probabilities of the symbols, resulting in a final subinterval. The codeword would be a binary fraction that lies within this final subinterval.

According to an embodiment, an encoder component 2701 is present and configured to implement one or more deep learning techniques for generating codewords for quantized data. Deep learning techniques can be employed to generate effective codewords for the quantized data. One approach is to use deep learning-based autoencoder models to learn compact and meaningful representations of the quantized data. Autoencoders are neural network architectures that consist of an encoder and a decoder, where the encoder learns to compress the input data into a lower-dimensional latent space, and the decoder reconstructs the original data from the latent representation.

Here are a few exemplary deep learning encoding techniques that can be implemented for creating codewords of the quantized data, according to an embodiment. Convolutional autoencoders (CAEs) leverage convolutional neural networks (CNNs) in the encoder and decoder parts of the autoencoder. CNNs are particularly effective in capturing spatial dependencies and hierarchical features in data, making them well-suited for encoding structured data such as images or time series. In the context of the codebook-based homomorphic compression, a CAE can be trained on the quantized data. The encoder part of the CAE learns to compress the quantized data into a compact latent representation, which serves as the codeword. The decoder part learns to reconstruct the quantized data from the codeword. As an example, consider an example of using a CAE for encoding quantized sensor data. The quantized data is represented as a 2D matrix, where each row corresponds to a sensor reading, and each column represents a time step. The CAE encoder consists of convolutional layers followed by pooling layers, which gradually reduce the spatial dimensions of the input and extract meaningful features. The output of the encoder is a compact latent representation, which serves as the codeword. The CAE decoder consists of upsampling layers and convolutional layers, which reconstruct the original quantized data from the codeword.

Another form of deep learning coding includes recurrent autoencoders (RAEs). Recurrent autoencoders utilize recurrent neural networks (RNNs) in the encoder and decoder parts of the autoencoder. RNNs are well-suited for processing sequential data, such as time series or natural language, as they can capture temporal dependencies and context. An RAE can be used to encode quantized sequential data. The encoder part of the RAE consists of recurrent layers, such as Long Short-Term Memory (LSTM) or Gated Recurrent Unit (GRU) layers, which process the input sequence and generate a fixed-length latent representation, serving as the codeword. The decoder part of the RAE takes the codeword and reconstructs the original quantized sequence. For example, consider an example of using an RAE for encoding quantized audio data. The quantized audio signal is represented as a sequence of amplitude values. The RAE encoder consists of LSTM layers that process the input sequence and generate a fixed-length latent representation, which serves as the codeword. The RAE decoder, also consisting of LSTM layers, takes the codeword and reconstructs the original quantized audio sequence.

Another form of deep learning coding includes variational autoencoders (VAEs). Variational autoencoders extend the concept of autoencoders by introducing a probabilistic framework. VAEs learn to encode the input data into a probability distribution in the latent space, rather than a single point. The encoder part of the VAE learns to map the input data to the parameters of a probability distribution (e.g., mean and variance of a Gaussian distribution), and the decoder part learns to reconstruct the original data from samples drawn from this distribution. A VAE can be used to generate codewords that capture the underlying probability distribution of the quantized data. The encoder part of the VAE learns to map the quantized data to the parameters of a probability distribution in the latent space. The codewords are then obtained by sampling from this distribution. The decoder part of the VAE learns to reconstruct the original quantized data from the sampled codewords. Consider an example of using a VAE for encoding quantized image data. The quantized images are fed into the VAE encoder, which learns to map each image to the parameters of a Gaussian distribution in the latent space. The codewords are obtained by sampling from this distribution. The VAE decoder takes the sampled codewords and reconstructs the original quantized images.

Another form of deep learning coding includes deep belief networks (DBNs). Deep Belief Networks are generative models that consist of multiple layers of restricted Boltzmann machines (RBMs). DBNs can learn hierarchical representations of the input data by training each layer in an unsupervised manner, followed by fine-tuning the entire network using supervised learning. DBNs can be used to generate codewords that capture the hierarchical structure of the quantized data. The DBN is trained on the quantized data, and the activations of the hidden layers serve as the codewords. The hierarchical nature of DBNs allows for capturing complex patterns and dependencies in the data. Consider an example of using a DBN for encoding quantized text data. The quantized text is represented as a binary vector, where each element corresponds to the presence or absence of a specific word. The DBN is trained on the quantized text data, and the activations of the hidden layers serve as the codewords. The DBN learns to capture the hierarchical structure and semantic relationships in the text data.

These are just a few examples of deep learning encoding techniques that can be explored for creating codewords of the quantized data in an LCM. The choice of the specific deep learning architecture depends on the nature of the data and the desired properties of the codewords. It's important to note that the deep learning encoding process should be designed to generate codewords that are suitable for homomorphic operations. The codewords should exhibit certain properties, such as being compatible with the homomorphic encryption scheme's plaintext space and allowing for efficient homomorphic computations.

During the training process of the deep learning models, the objective function should be designed to capture the desired properties of the codewords, such as minimizing the reconstruction error while ensuring the codewords are suitable for homomorphic operations. Additionally, regularization techniques can be employed to encourage sparsity or other desirable properties in the codewords. Once the deep learning models are trained, the encoder part can be used to generate codewords for new quantized data. The generated codewords can then be used in the codebook-based homomorphic compression scheme, enabling efficient and privacy-preserving computations on the compressed data.

Experimental evaluation and performance analysis can be conducted to assess the effectiveness of the deep learning encoding techniques in generating codewords that achieve good compression ratios, maintain low approximation errors, and enable efficient homomorphic operations. The choice of the deep learning architecture and hyperparameters can be fine-tuned based on the specific requirements and characteristics of the data.

According to the aspect, a codebook library 2804 is present and configured to store a plurality of codewords (i.e., a codebook) generated by one or more of the techniques described herein. When it comes to storing the codewords and codebook in the codebook-based homomorphic compression system, several database systems and data storage solutions can be considered. The choice of the storage system depends on factors such as the size of the codebook, the frequency of updates, the retrieval and query requirements, and the overall system architecture. In some implementations key-value stores may be used, Key-value stores are a type of NoSQL database that provide a simple and efficient way to store and retrieve data based on a unique key. Examples of key-value stores include Redis, Memcached, and Amazon DynamoDB. For storing the codewords and codebook, key-value stores can be used to store each codeword as a key-value pair, where the key represents the codeword, and the value represents the corresponding data or metadata associated with the codeword. The codebook can be stored as a collection of key-value pairs, allowing for fast retrieval of codewords based on their keys. Key-value stores offer high performance, low latency, and scalability, making them suitable for scenarios where fast retrieval of codewords is critical.

Document databases, such as MongoDB or Couchbase, store data as flexible, semi-structured documents in formats like JSON or BSON. They provide a schema-less design and allow for easy modification of the data structure. For storing the codewords and codebook, document databases can be used to store each codeword as a document, along with its associated data or metadata. The codebook can be stored as a collection of documents, where each document represents a codeword and its related information. Document databases offer flexibility in terms of data structure, allowing for easy addition or modification of codeword attributes. They also provide querying capabilities based on document fields, enabling efficient retrieval of codewords based on specific criteria.

Relational databases, such as MySQL, PostgreSQL, or Oracle, can also be used to store the codewords and codebook. In a relational database, the codewords can be stored in a table with columns representing the codeword and its associated data or metadata. The codebook can be stored in a separate table, with each row representing a codeword and its corresponding information. Relational databases provide structured querying capabilities using SQL, allowing for efficient retrieval and filtering of codewords based on specific conditions. Relational databases offer strong consistency, ACID properties, and support for complex queries, making them suitable for scenarios where data integrity and structured querying are important.

Graph databases, such as Neo4j or Amazon Neptune, store data as nodes and edges in a graph structure. They are designed to efficiently handle complex relationships and connections between data entities. For storing the codewords and codebook, graph databases can be used to represent the relationships between codewords and their associated data or metadata. Each codeword can be represented as a node in the graph, with edges connecting related codewords or linking codewords to their corresponding data. Graph databases provide efficient traversal and querying capabilities based on the graph structure, allowing for fast retrieval of connected codewords and exploration of relationships between codewords.

Distributed key-value stores, such as Apache Cassandra or Apache HBase, are designed to handle large-scale data and provide high scalability and fault tolerance. They distribute data across multiple nodes in a cluster, allowing for horizontal scaling. For storing the codewords and codebook, distributed key-value stores can be used to store codewords as key-value pairs, similar to regular key-value stores. The codebook can be partitioned and distributed across multiple nodes in the cluster, enabling high scalability and performance. Distributed key-value stores offer eventual consistency, high write throughput, and the ability to handle large volumes of data, making them suitable for scenarios where scalability and fault tolerance are critical.

Figure 29:
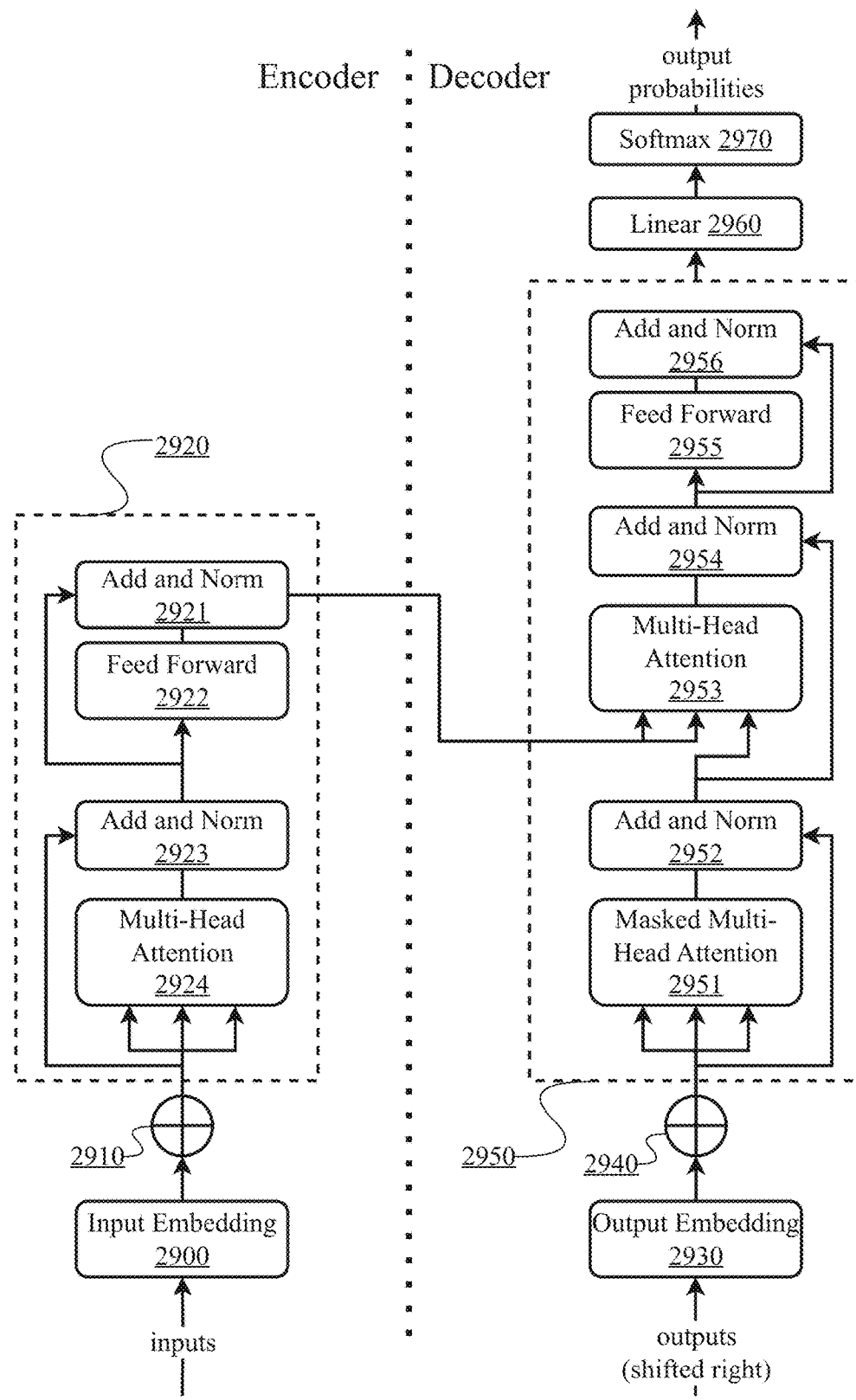
FIG. 29 is a block diagram illustrating an embodiment of the system and method for a large codeword model for deep learning.

FIG. 29 is a block diagram illustrating an embodiment of the system and method for a large codeword model for deep learning, where the machine learning core is a Transformer-based core. A Transformer generally comprises an Encoder (the components on the left side of the illustration) and a Decoder (the components on the right side of the illustration).

The illustrated Transformer comprises an Encoder and a Decoder. The Encoder takes input embeddings and processes them through a stack of layers (represented as dashed box 2920). Each layer consists of: positional encoding, which adds position information to the input embeddings; multi-head attention, which allows the model to attend to different parts of the input sequence; add and norm, which applies residual connection and layer normalization; feed forward, which is a fully connected feed-forward network; and add and norm which is another residual connection and layer normalization.

The power of the transformer model lies in the self-attention mechanism. This mechanism contributes to accelerated learning compared to traditional models such as long short-term memory models. Self-attention empowers the transformer model with the remarkable capability to meticulously scrutinize distinct segments of a given sequence or even encompass the entire contextual essence of a sentence. This profound contextual awareness enables the model to make predictions with an elevated degree of accuracy and relevance.

The input embedding 2900 to the encoder is a sequence of tokens, typically represented as integers. Each token is mapped to a learnable embedding vector of a fixed size. The embedding layer is a lookup table that converts each token into its corresponding dense vector representation. The embeddings are learned during training and capture semantic and syntactic relationships between tokens.

A dense vector representation, also known as a dense embedding or a continuous vector representation, is a way of representing data, particularly words or tokens, as dense vectors in a high-dimensional continuous space. In the context of natural language processing (NLP) and language models, dense vector representations are used to capture semantic and syntactic information about words or tokens. Each word or token is mapped to a fixed-size vector of real numbers, typically with hundreds or thousands of dimensions. Each word or token is represented by a vector of a fixed size, regardless of the length of the input sequence. The size of the vector is a hyperparameter that is determined during model design. The vectors exist in a continuous high-dimensional space, where each dimension represents a latent feature or aspect of the word or token. The continuous nature allows for capturing fine-grained relationships and similarities between words. The dense vector representations are learned during the training process of the model. The model learns to assign similar vectors to words that have similar meanings or occur in similar contexts. The dense vector representations aim to capture semantic and syntactic relationships between words. Words that have similar meanings or are used in similar contexts tend to have similar vector representations. Dense vector representations allow for performing algebraic operations on words, such as addition and subtraction. These operations can capture analogies and relationships between words, such as "prince"−"man"+"woman" ≈ "princess". Dense vector representations serve as input features for various downstream NLP tasks, such as text classification, sentiment analysis, named entity recognition, and machine translation. The dense representations provide a rich and informative input to the models, enabling them to learn patterns and make predictions. Some popular examples of dense vector representations include, but are not limited to, Word2Vec, Global Vectors for Word Representations (GloVe), FastText, and BERT.

After the input embedding layer, positional encoding 2901 is added to the input embedding to provide position information to the model. The positional encoding 2901 and the input embedding 2900 may be added using a function 2910. Since the Transformer architecture doesn't have inherent recurrence or convolution, positional encodings help capture the order and relative positions of tokens. The positional encodings are typically sine and cosine functions of different frequencies, allowing the model to learn relative positions. The positional encodings have the same dimensionality as the input embeddings and are summed with them.

The Encoder utilizes a multi-head attention mechanism 2924 which is a key component of the Transformer architecture. It allows the Encoder to attend to different parts of the input sequence and capture dependencies between tokens. The attention mechanism computes three matrices: Query (Q), Key (K), and Value (V). The Query, Key, and Value matrices are obtained by linearly projecting the input embeddings using learned weight matrices. The attention scores are computed by taking the dot product of the Query matrix with the transpose of the Key matrix, followed by scaling and applying a softmax function. The attention scores determine the importance of each token in the input sequence for a given position. The Value matrix is then multiplied with the attention scores to obtain the weighted sum of the values, which forms the output of the attention mechanism. Multi-Head Attention splits the Query, Key, and Value matrices into multiple heads, allowing the model to attend to different aspects of the input simultaneously. The outputs from each head are concatenated and linearly projected to obtain the final output of the Multi-Head Attention layer 2924.

After the Multi-Head Attention layer, a residual connection is applied, followed by Layer Normalization at add and norm 2923. The residual connection adds the input embeddings to the output of the attention layer, helping the model learn faster and deeper. Layer Normalization normalizes the activations across the features, stabilizing the training process.

The Feed Forward layer 2922 is a fully connected neural network applied to each position of the Encoder's hidden states. It consists of two linear transformations with a Rectified Linear Unit (ReLU) activation function in between. The purpose of the Feed Forward layer is to introduce non-linearity and increase the model's capacity to learn complex representations. The output of the Feed Forward layer has the same dimensionality as the input embeddings. A residual connection and Layer Normalization 2921 are applied after the Feed Forward layer.

The Encoder layers 2920 are stacked Nx times, where N is a hyperparameter that determines the depth of the Encoder. Each layer follows the same structure: Multi-Head Attention, Add & Norm, Feed Forward, and Add & Norm. By stacking multiple Encoder layers, the model can capture hierarchical and long-range dependencies in the input sequence. The output of the final Encoder layer represents the encoded input sequence, which is then passed to the Decoder for generating the output sequence.

The Decoder generates the output probabilities. It has a similar structure to the Encoder, with a few additions. The Decoder takes output embeddings and processes them through a stack of layers (represented as dashed box 2950). The output embedding layer 2930 takes the previous output tokens (shifted right by one position) and converts them into dense vectors. Each token is mapped to a learnable embedding vector of a fixed size. The embedding vectors capture semantic and syntactic relationships between tokens.

Positional encoding 2901 is added to the output embedding 2930 to provide position information to the model. Positional encoding 2901 may be added to the output embedding 2930 through a function 2940. Since the Transformer architecture does not have inherent recurrence or convolution, positional encodings help capture the order and relative positions of tokens. The positional encodings are typically sine and cosine functions of different frequencies, allowing the model to learn relative positions.

The masked multi-head attention 2951 mechanism prevents the model form attending to future tokens. This layer performs self-attention on the Decoder's input sequence. It allows the Decoder to attend to different parts of its own input sequence. The attention is "masked" to prevent the Decoder from attending to future tokens, ensuring that the predictions are based only on the previously generated tokens. Multi-head attention splits the input into multiple heads, allowing the model to attend different aspect of the input simultaneously.

After the masked multi-head attention, a residual connection is applied follows by layer normalization via add and norm 2952. The residual connection adds the input to the output of the attention layer, helping the model learn faster and deeper. Layer normalization normalizes the activations across the features, stabilizing the training process.

The multi-head attention 2953 layer performs attention between the Decoder's hidden states and the Encoder's output. It allows the Decoder to attend to relevant parts of the input sequence based on the Encoder's representations. The attention weights are computed based on the compatibility between the Decoder's hidden states and Encoder's outputs.

Another add and norm 2954 layer is then followed by feed forward network 2955. This a fully connected feed-forward network applied to each position of the Decoder's hidden states. It consists of two linear transformations with a Rectified Linear Unit (ReLU) activation in between. The feed forward layer helps the model capture non-linear interactions and increases the model's capacity.

Another add and norm 2956 layer is followed by linear 2960 and softmax 2970 layers. The final hidden states of the Decoder are passed through a linear transformation to project them into the vocabulary space. Vocabulary space refers to the set of all unique tokens or words that the model can generate or predict. In the context of language models, the vocabulary is a predefined set of tokens that the model is trained on and can output. When the Decoder's final hidden states are passed through a linear transformation, they are projected into a vector space with the same dimensionality as the size of the vocabulary. Each dimension in this space corresponds to a specific token in the vocabulary. For example, the model has a vocabulary of 10,000 unique tokens. The linear transformation would project the Decoder's hidden states into a 10,000-dimensional vector space. Each element in this vector represents the model's predicted probability or score for the corresponding token in the vocabulary.

A softmax function is applied to the projected values (vectors) to generate output probabilities over the vocabulary. The softmax function normalizes the values so that they sum up to 1, representing a probability distribution over the vocabulary. Each probability indicates the likelihood of a specific token being the next output token. The token with the highest probability is selected as the next output token. During the model's training, the objective is to maximize the probability of the correct next token given the input sequence and the previously generated tokens. The model learns to assign higher probabilities to the tokens that are more likely to appear based on the context. At inference time, the token with the highest probability in the vocabulary space is selected as the next output token. This process is repeated iteratively, with the generated token being fed back into the Decoder as input for the next step, until a stopping criterion is met (e.g., reaching a maximum length or generating an end-of-sequence token). The size and composition of the vocabulary can vary depending on the specific task and the data the model is trained on. It can include words, sub-words, or even characters, depending on the tokenization strategy used.

The decoder layers 2950 can be stacked Nx times, allowing the model to capture complex dependencies and generate coherent output sequences.

This transformer architecture allows the model to process input sequences, capture long-range dependencies, and generate output sequence based on the encoded input and the previously generated codewords.

There are at least three variations of transformer architecture that may enable an LCM. A first such variation comprises Auto-Encoding Models. In autoencoders, the decoder portion of the transformer is discarded after pre-training and only the encoder is used to generate the output. The popular BERT and ROBERTa models are examples of models based on this architecture and perform well on sentiment analysis and text classification. These types of models may be trained using a process called masked language modeling (MLM).

The primary goal of an autoencoder is to learn efficient representations of input data by encoding the data into a lower-dimensional space and then reconstructing the original data from the encoded representation. Autoencoders are trained in an unsupervised manner, meaning they don't require labeled data. They learn to capture the underlying structure and patterns in the input data without explicit guidance. An autoencoder consists of two main components: an encoder and a decoder. The encoder takes the input data and maps it to a lower-dimensional representation, often referred to as the latent space or bottleneck. The decoder takes the latent representation and tries to reconstruct the original input data. Autoencoders can be used for dimensionality reduction by learning a compressed representation of the input data in the latent space. The latent space has a lower dimensionality than the input data, capturing the most salient features or patterns. The training objective of an autoencoder is to minimize the reconstruction error between the original input and the reconstructed output. The model learns to encode and decode the data in a way that preserves the essential information needed for reconstruction. Variants and extensions of autoencoders can include denoising autoencoders, variational autoencoders (VAEs) which introduce a probabilistic approach to autoencoders wherein they learn a probabilistic encoder and decoder, allowing for generating new samples from the learned latent space, and conditional autoencoders which incorporate additional conditions or labels as input to the encoder and decoder, enabling the generation of samples conditioned on specific attributes.

Autoencoders can have various applications. Autoencoders can be used to detect anomalies by measuring the reconstruction error. Anomalous samples tend to have higher reconstruction errors compared to normal samples. Autoencoders can be used as a pre-training step to learn meaningful features from unlabeled data. The learned features can then be used for downstream tasks like classification or clustering. Additionally, or alternatively, autoencoders, particularly VAEs, can be used as generative models to generate new samples similar to the training data by sampling from the learned latent space. It's worth noting that while autoencoders can be effective for certain tasks, they have some limitations. They may struggle to capture complex dependencies and may generate blurry or less sharp reconstructions compared to other generative models like Generative Adversarial Networks (GANs).

Another type of variation is the auto-regressive model which feature the use of only the decoder portion of the transformer architecture. In autoregressive architectures, the decoder portion of the transformer is retained and the encoder portion is not used after model pre-training. Auto-regressive models are a class of models that generate outputs by predicting the next element based on the previously generated elements. In the context of the Transformer architecture and language modeling, auto-regressive models are commonly used for tasks such as text generation, machine translation, and language understanding.

Auto-regressive models generate outputs sequentially, one element at a time. In the case of language modeling, the model predicts the next word or token based on the previous words or tokens in the sequence. The prediction of the next element is conditioned on the previously generated elements. The model learns the conditional probability distribution $P(x\_t|x\_1, x\_2, \ldots, x\_{t-1})$, where $x\_t$ is the element at position t, and $x\_1, x\_2, \ldots, x\_{t-1}$ are the previously generated elements. The Transformer architecture, particularly the Decoder component, is well-suited for auto-regressive modeling. The Decoder generates the output sequence one element at a time, conditioned on the previously generated elements and the encoded input sequence from the Encoder. In the Transformer Decoder, the self-attention mechanism is masked to prevent the model from attending to future positions during training. This masking ensures that the model relies only on the previously generated elements to make predictions, following the auto-regressive property. During training, the Transformer Decoder uses a technique called teacher forcing. Instead of feeding the model's own predictions as input for the next step, the ground truth target sequence is used. This helps the model learn to generate the correct output sequence based on the input sequence and the previous target tokens. During inference or generation, the Transformer Decoder generates the output sequence one element at a time. At each step, the model takes the previously generated elements as input and predicts the next element. This process continues until a stopping criterion is met, such as reaching a maximum sequence length or generating an end-of-sequence token. Auto-regressive models, including the Transformer, have achieved state-of-the-art performance in language modeling tasks. They excel at capturing the statistical properties and dependencies in sequential data, making them effective for generating coherent and fluent text.

While text generation is the most suitable use case of auto-regressors, they perform exceptionally well on a wide variety of tasks. Most modern LLMs are auto-regressors including, for example, the popular GPT series of LLMs, BERT, and XLNet.

The third variation of the transformer model is the sequence-to-sequence model which utilizes both the encoder and decoder portions of the transformer and can be trained in multiple ways. One of the methods is span corruption and reconstruction. These models are, generally, best suited for language translation. The T5 and BART family of models are examples of sequence-to-sequence models.

Figure 30:
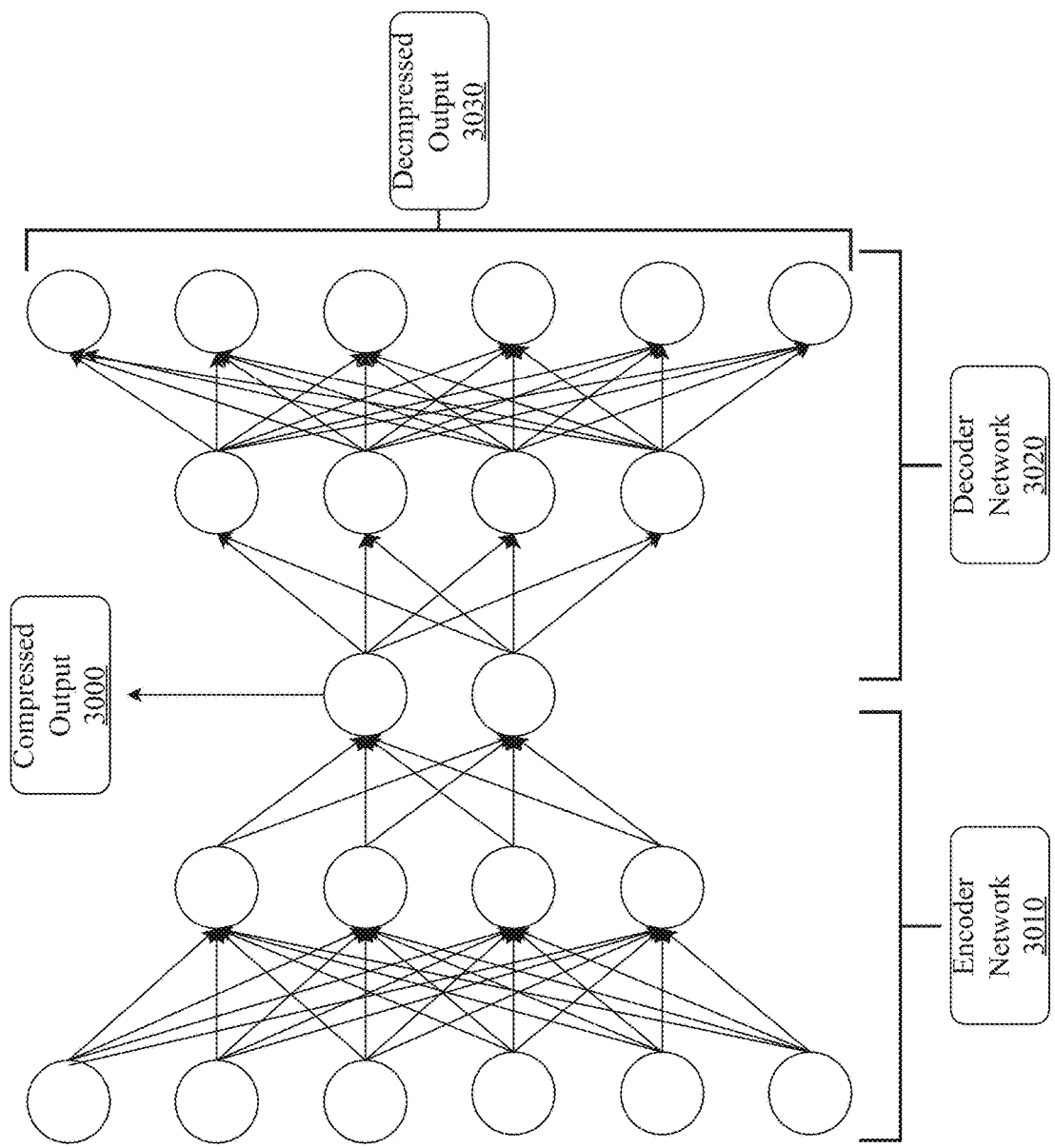
FIG. 30 is a block diagram illustrating an embodiment of the system and method for a large codeword model for deep learning.

FIG. 30 is a block diagram illustrating an embodiment of the system and method for a large codeword model for deep learning, where the machine learning core is a VAE-based core. An autoencoder network comprises an encoder network 3010 or a decoder network 3020 that work together to encode and decode data effectively. The encoder network 3010 and decoder network 3020 within the autoencoder network is comprised of a plurality of layers that contribute to the encoding and decoding process. These layers include, but are not limited to, convolutional layers, pooling layers, and a bottleneck layer. Some embodiments also include functions that operate on information including but not limited to rectified linear unit functions, sigmoid functions, and skip connections.

The convolutional layers are responsible for extracting meaningful features from the input data. They apply convolutional operations using learnable filters to capture spatial patterns and hierarchical representations of the data. The convolutional layers can have different numbers of filters, kernel sizes, and strides to capture features at various scales and resolutions. Skip connections are employed to facilitate the flow of information across different layers of the autoencoder. Skip connections allow the output of a layer to be directly added to the output of a subsequent layer, enabling the network to learn residual mappings and mitigate the vanishing gradient problem. Skip connections help in preserving fine-grained details and improving the training stability of the autoencoder.

Pooling layers are used to downsample the feature maps generated by the convolutional layers. They reduce the spatial dimensions of the feature maps while retaining the most salient information. Common pooling operations include but are not limited to max pooling and average pooling. Pooling layers help in achieving translation invariance, reducing computational complexity, and controlling the receptive field of the autoencoder. Rectified Linear Unit (ReLU) functions introduce non-linearity into the autoencoder by applying a ReLU activation function element-wise to the output of the previous layer. ReLU functions help in capturing complex patterns and relationships in the data by allowing the network to learn non-linear transformations. They also promote sparsity and alleviate the vanishing gradient problem. The bottleneck layer represents the most compressed representation of the input data. The bottleneck layer has a significantly reduced dimensionality compared to the input and output layers of the autoencoder. It forces the network to learn a compact and meaningful encoding of the data, capturing the essential features and discarding redundant information. In one embodiment, the multi-layer autoencoder network is comprised of a plurality of the previously mentioned layers where the sequence and composition of the layers may vary depending on a user's preferences and goals. The bottleneck layer is where the compressed output 3000 is created. Each layer previous to the bottleneck layer creates a more and more compressed version of the original input. The layers after the bottleneck layer represent the decoder network 3030 where a plurality of layers operate on a compressed input to decompress a data set. Decompression results in a version of the original input which is largely similar but has some lost data from the transformations.

Figure 31:
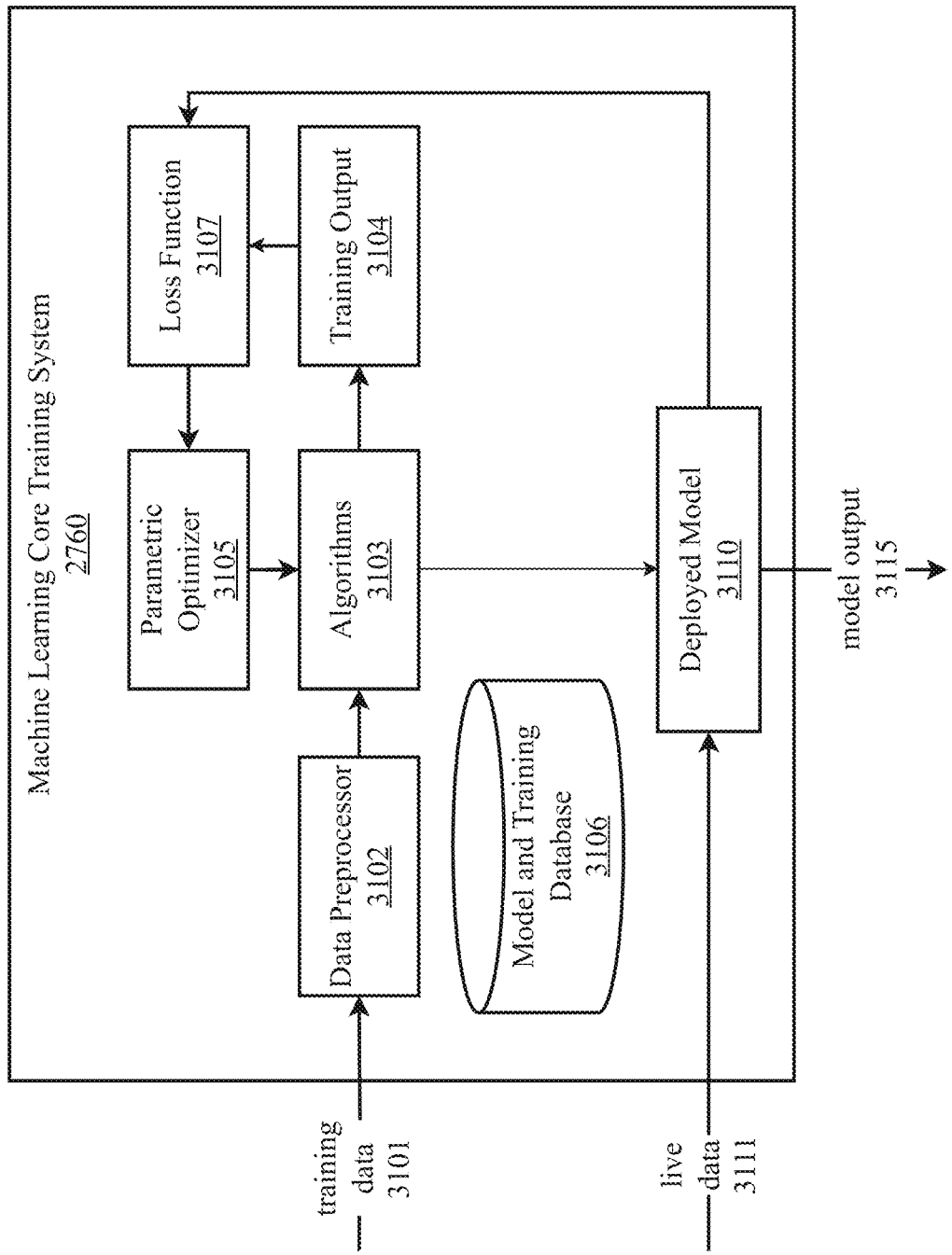
FIG. 31 is a block diagram illustrating an aspect of system and method for a large codeword model for deep learning, a machine learning core training system.

FIG. 31 is a block diagram illustrating an aspect of system and method for a large codeword model for deep learning, a machine learning core training system. According to the embodiment, the machine learning core training system 2760 may comprise a model training stage comprising a data preprocessor 3102, one or more machine and/or deep learning algorithms 3103, training output 3104, and a parametric optimizer 3105, and a model deployment stage comprising a deployed and fully trained model 3110 configured to perform tasks described herein such as processing codewords through a large codeword model. The machine learning core training system 2760 may be used to train and deploy a plurality of machine learning architectures in order to support the services provided by the large codeword model for deep learning.

At the model training stage, a plurality of training data 3101 may be received by the generative AI training system 3150. Data preprocessor 3102 may receive the input data (e.g., codewords, sourceblocks) and perform various data preprocessing tasks on the input data to format the data for further processing. For example, data preprocessing can include, but is not limited to, tasks related to data cleansing, data deduplication, data normalization, data transformation, handling missing values, feature extraction and selection, mismatch handling, and/or the like. Data preprocessor 3102 may also be configured to create training dataset, a validation dataset, and a test set from the plurality of input data 3101. For example, a training dataset may comprise 80% of the preprocessed input data, the validation set 10%, and the test dataset may comprise the remaining 10% of the data. The preprocessed training dataset may be fed as input into one or more machine and/or deep learning algorithms 3103 to train a predictive model for object monitoring and detection.

During model training, training output 3104 is produced and used to measure the accuracy and usefulness of the predictive outputs. During this process a parametric optimizer 3105 may be used to perform algorithmic tuning between model training iterations. Model parameters and hyperparameters can include, but are not limited to, bias, train-test split ratio, learning rate in optimization algorithms (e.g., gradient descent), choice of optimization algorithm (e.g., gradient descent, stochastic gradient descent, of Adam optimizer, etc.), choice of activation function in a neural network layer (e.g., Sigmoid, ReLu, Tanh, etc.), the choice of cost or loss function the model will use, number of hidden layers in a neural network, number of activation unites in each layer, the drop-out rate in a neural network, number of iterations (epochs) in a training the model, number of clusters in a clustering task, kernel or filter size in convolutional layers, pooling size, batch size, the coefficients (or weights) of linear or logistic regression models, cluster centroids, and/or the like. Parameters and hyperparameters may be tuned and then applied to the next round of model training. In this way, the training stage provides a machine learning training loop.

In some implementations, various accuracy metrics may be used by the machine learning core training system 2760 to evaluate a model's performance. Metrics can include, but are not limited to, word error rate (WER), word information loss, speaker identification accuracy (e.g., single stream with multiple speakers), inverse text normalization and normalization error rate, punctuation accuracy, timestamp accuracy, latency, resource consumption, custom vocabulary, sentence-level sentiment analysis, multiple languages supported, cost-to-performance tradeoff, and personal identifying information/payment card industry redaction, to name a few. In one embodiment, the system may utilize a loss function 3107 to measure the system's performance. The loss function 3107 compares the training outputs with an expected output and determined how the algorithm needs to be changed in order to improve the quality of the model output. During the training stage, all outputs may be passed through the loss function 3107 on a continuous loop until the algorithms 3103 are in a position where they can effectively be incorporated into a deployed model 3115.

The test dataset can be used to test the accuracy of the model outputs. If the training model is establishing correlations that satisfy a certain criterion such as but not limited to quality of the correlations and amount of restored lost data, then it can be moved to the model deployment stage as a fully trained and deployed model 3110 in a production environment making predictions based on live input data 3111 (e.g., interest factor data, incentive data). Further, model correlations and restorations made by deployed model can be used as feedback and applied to model training in the training stage, wherein the model is continuously learning over time using both training data and live data and predictions. A model and training database 3106 is present and configured to store training/test datasets and developed models. Database 3106 may also store previous versions of models.

According to some embodiments, the one or more machine and/or deep learning models may comprise any suitable algorithm known to those with skill in the art including, but not limited to: LLMs, generative transformers, transformers, supervised learning algorithms such as: regression (e.g., linear, polynomial, logistic, etc.), decision tree, random forest, k-nearest neighbor, support vector machines, Naïve-Bayes algorithm; unsupervised learning algorithms such as clustering algorithms, hidden Markov models, singular value decomposition, and/or the like. Alternatively, or additionally, algorithms 3103 may comprise a deep learning algorithm such as neural networks (e.g., recurrent, convolutional, long short-term memory networks, etc.).

In some implementations, the machine learning core training system 2760 automatically generates standardized model scorecards for each model produced to provide rapid insights into the model and training data, maintain model provenance, and track performance over time. These model scorecards provide insights into model framework(s) used, training data, training data specifications such as chip size, stride, data splits, baseline hyperparameters, and other factors. Model scorecards may be stored in database(s) 3106.

Figure 32A:
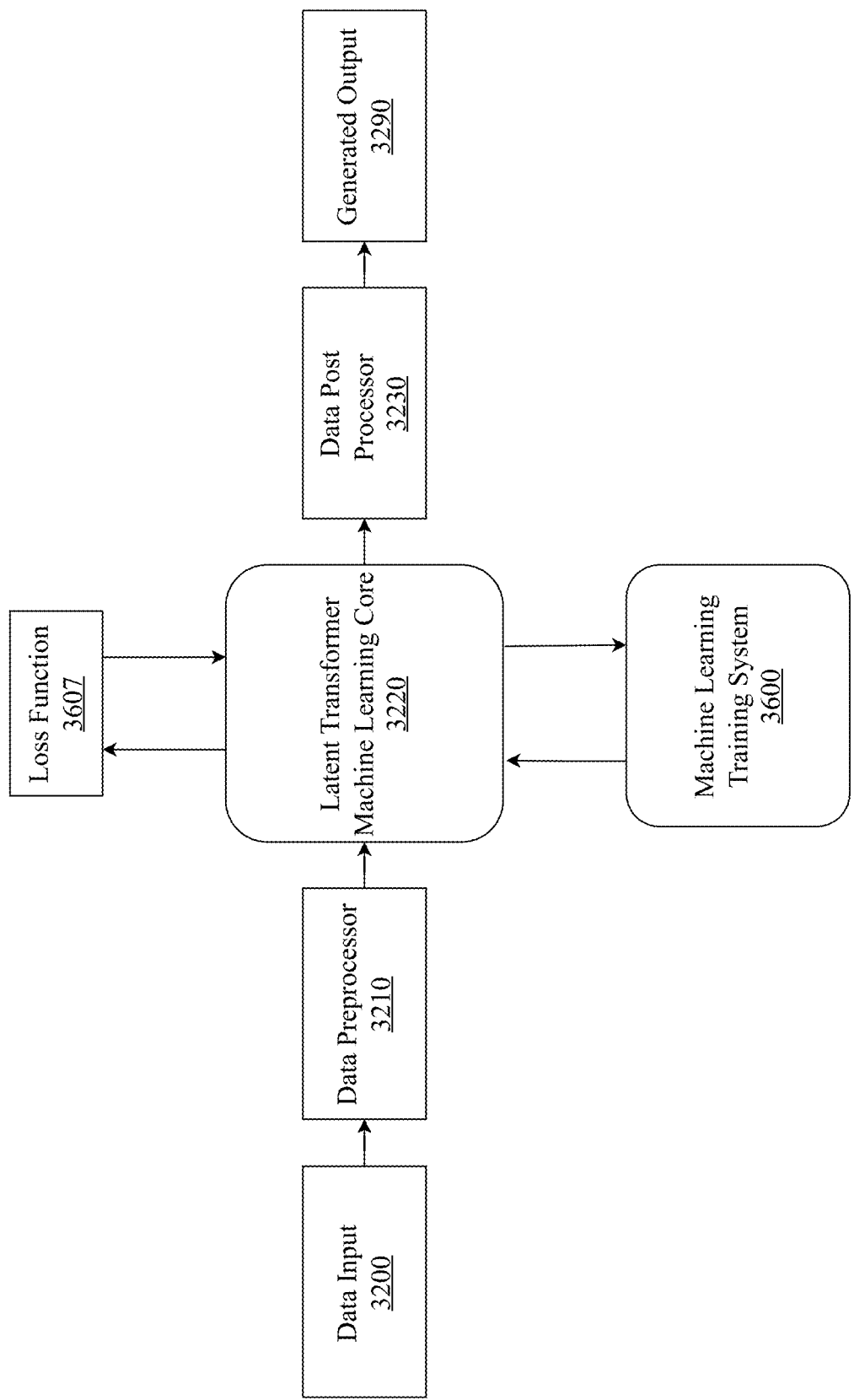
FIG. 32A is a block diagram illustrating an exemplary system architecture for a Latent Transformer core for a Large Codeword Model.

FIG. 32A is a block diagram illustrating an exemplary system architecture for a Latent Transformer core for a Large Codeword Model. The attached figure presents a streamlined view of the Latent Transformer Large Codeword Model (LCM) system, focusing on the core components and their interactions. This simplified representation highlights the essential elements of the system and illustrates the flow of data from input to output, along with the training process that enables the system to learn and generate meaningful results.

The system is fed a data input 3200, which represents the homomorphic-dyadic compressed and encrypted data that needs to be processed and analyzed. This data can come from various sources and domains, such as time series, text, images, or any other structured or unstructured format. The data input 3200 is fed into a data preprocessor 3210, which is responsible for cleaning, transforming, and preparing the data for further processing. The data preprocessor 3210 may perform tasks such as normalization, feature scaling, missing value imputation, or any other necessary preprocessing steps to ensure the data is in a suitable format for the machine learning core 3220.

Once the data is preprocessed, it is passed to a latent transformer machine learning core 3220. The machine learning core 3220 employs advanced techniques such as self-attention mechanisms and multi-head attention to learn the intricate patterns and relationships within the data. It operates in a latent space, where the input data is encoded into a lower-dimensional representation that captures the essential features and characteristics. By working in this latent space, the machine learning core 3220 can efficiently process and model the data, enabling it to generate accurate and meaningful outputs.

The generated outputs from the machine learning core 3220 are then passed through a data post processor 3230. The data post processor 3230 is responsible for transforming the generated outputs into a format that is suitable for the intended application or user. It may involve tasks such as denormalization, scaling back to the original data range, or any other necessary post-processing steps to ensure the outputs are interpretable and usable.

The processed outputs are provided as a generated output 3290, which represents the final result of the latent transformer LCM system. The generated output 3290 can take various forms, depending on the specific task and domain. It could be predicted values for time series forecasting, generated text for language modeling, synthesized images for computer vision tasks, or any other relevant output format.

To train and optimize the latent transformer machine learning core 3220, the system includes a machine learning training system 3600. The training system 3600 is responsible for updating the parameters and weights of the machine learning core 3220 based on the observed performance and feedback. The training system 3600 outputs from the machine learning core 3220 and processes the outputs to be reinserted back through the machine learning core 3220 as a testing and training data set. After processing the testing and training data set, the machine learning core 3220 may output a testing and training output data set. This output may be passed through a loss function 3607. The loss function 3607 may be employed to measure the discrepancy between the generated outputs and the desired outcomes. The loss function 3607 quantifies the error or dissimilarity between the predictions and the ground truth, providing a signal for the system to improve its performance.

The training process is iterative, where the system generates outputs, compares them to the desired outcomes using the loss function 3607, and adjusts the parameters of the machine learning core 3220 accordingly.

Through the iterative training process, the latent transformer machine learning core 3220 learns to capture the underlying patterns and relationships in the data, enabling it to generate accurate and meaningful outputs. The training process aims to minimize the loss and improve the system's performance over time, allowing it to adapt and generalize to new and unseen data.

Figure 32B:
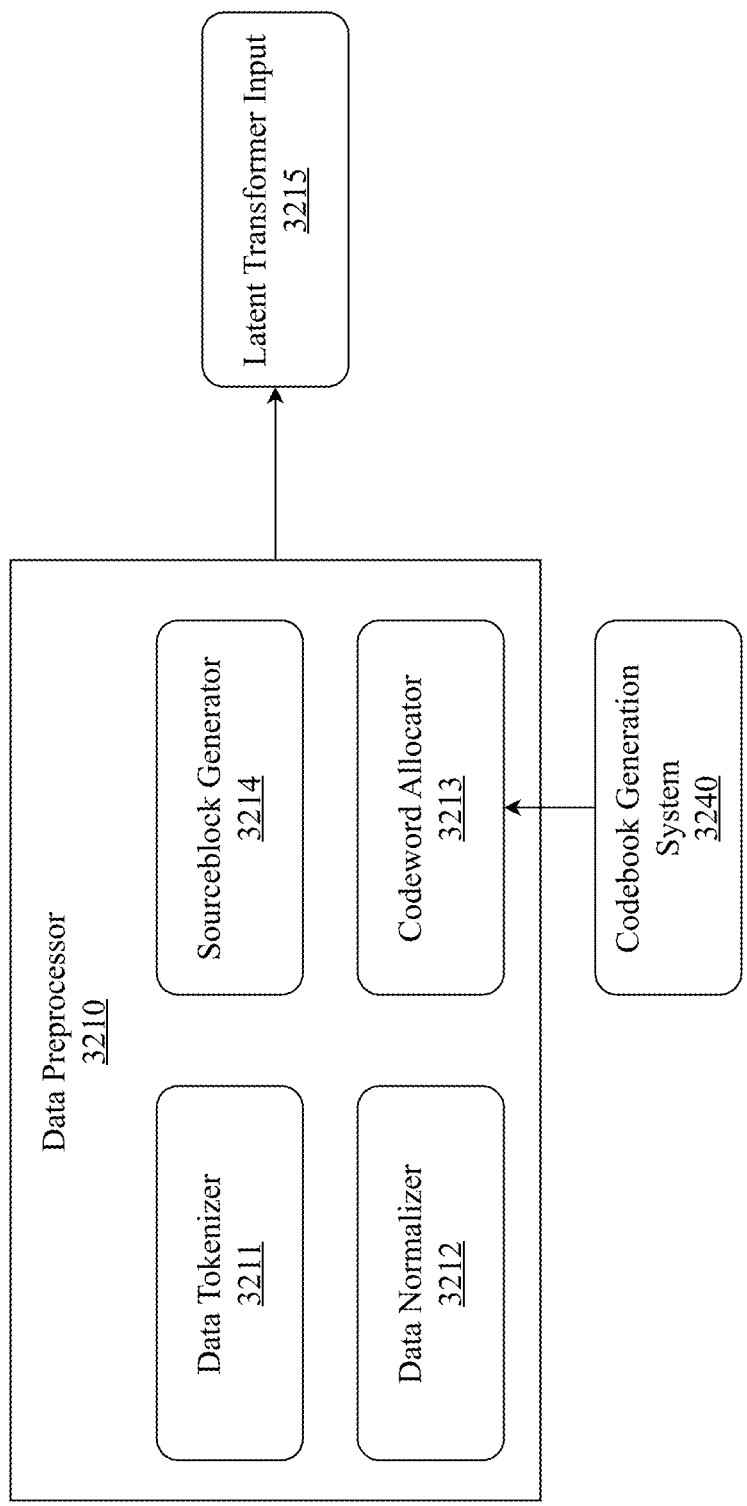
FIG. 32B is a block model illustrating an aspect of a system for a large codeword model for deep learning, a data preprocessor.

FIG. 32B is a block model illustrating an aspect of a system for a large codeword model for deep learning, a data preprocessor. The data preprocessor 3210 plays a role in preparing the input data for further processing by the latent transformer machine learning core 3220. It consists of several subcomponents that perform specific preprocessing tasks, ensuring that the data is in a suitable format and representation for effective learning and generation.

The data preprocessor 3210 receives the raw input data and applies a series of transformations and operations to clean, normalize, and convert the data into a format that can be efficiently processed by the subsequent components of the system. The preprocessing pipeline include but is not limited to subcomponents such as a data tokenizer, a data normalizer, a codeword allocator, and a sourceblock generator. A data tokenizer 3211 is responsible for breaking down the input data into smaller, meaningful units called tokens. The tokenization process varies depending on the type of data being processed. For textual data, the tokenizer may split the text into individual words, subwords, or characters. For time series data, the tokenizer may divide the data into fixed-length windows or segments. The goal of tokenization is to convert the raw input into a sequence of discrete tokens that can be further processed by the system.

A data normalizer 3212 is responsible for scaling and normalizing the input data to ensure that it falls within a consistent range. Normalization techniques, such as min-max scaling or z-score normalization, are applied to the data to remove any biases or variations in scale. Normalization helps in improving the convergence and stability of the learning process, as it ensures that all features or dimensions of the data contribute equally to the learning algorithm. A codeword allocator 3213 assigns unique codewords to each token generated by the data tokenizer 3211. Additionally, codewords may be directly assigned to sourceblocks that are generated from inputs rather than from tokens. The codewords are obtained from a predefined codebook, which is generated and maintained by the codebook generation system 3240. The codebook contains a mapping between the tokens and their corresponding codewords, enabling efficient representation and processing of the data. The codeword allocator 3213 replaces each token, sourceblock, or input with its assigned codeword, creating a compressed and encoded representation of the input data.

A sourceblock generator 3214 combines the codewords assigned by the codeword allocator 3213 into larger units called sourceblocks. sourceblocks are formed by grouping together a sequence of codewords based on predefined criteria, such as a fixed number of codewords or semantic coherence. The formation of sourceblocks helps in capturing higher-level patterns and relationships within the data, as well as reducing the overall sequence length for more efficient processing by the latent transformer machine learning core 3220.

A codebook generation system 3240 is a component that works in conjunction with the data preprocessor 3210. It is responsible for creating and maintaining the codebook used by the codeword allocator 3213. The codebook is generated based on the statistical properties and frequency of occurrence of the tokens in the training data. It aims to assign shorter codewords to frequently occurring tokens and longer codewords to rare tokens, optimizing the compression and representation of the data.

After the data has undergone the preprocessing steps performed by the data preprocessor 3210, the resulting output is the latent transformer input 3215. The latent transformer input 3215 represents the preprocessed and encoded data that is ready to be fed into the latent transformer machine learning core 3220 for further processing and learning.

When dealing with time series prediction, the codeword allocator 3213 may take a sequence of time series data points as input. In one example the input sequence consists of 1000 data points. The codeword allocator 3213 performs the necessary data preparation steps to create a suitable input vector for the autoencoder. It truncates the last 50 data points from the input sequence, resulting in a sequence of 950 elements. This truncated sequence represents the historical data that will be used to predict the future values. The codeword allocator 3213 then creates a 1000-element vector, where the first 950 elements are the truncated sequence, and the last 50 elements are filled with zeros. This input vector serves as the input to the Variational Autoencoder Encoder Subsystem 3250, which compresses the data into a lower-dimensional latent space representation.

By performing this data preparation step, the codeword allocator 3213 ensures that the input data is in a format that is compatible with the autoencoder's training process. During training, the autoencoder learns to reconstruct the complete 1000-element sequence from the truncated input vector. By setting the last 50 elements to zero, the autoencoder is forced to learn the patterns and dependencies in the historical data and use that information to predict the missing values. This approach enables the Latent Transformer LCM system to effectively handle time series prediction tasks by leveraging the power of autoencoders and the compressed latent space representation.

The codeword allocator 3213 may split the incoming data input 3200 into meaningful units called sourceblocks. This process, known as semantic splitting, aims to capture the inherent structure and patterns in the data. The allocator 3213 may employ various techniques to identify the optimal sourceblocks, such as rule-based splitting, statistical methods, or machine learning approaches. In one embodiment, the codeword allocator 3213 may utilize Huffman coding to split the data into sourceblocks. The Huffman coding-based allocator enables efficient and semantically meaningful splitting of the input data into sourceblocks. Huffman coding is a well-known data compression algorithm that assigns variable-length codes to symbols based on their frequency of occurrence. In the context of the LCM, the Huffman coding-based allocator adapts this principle to perform semantic splitting of the input data.

With Huffman coding, the allocator 3213 starts by analyzing the input data and identifying the basic units of meaning, such as words, phrases, or subwords, depending on the specific data modality and the desired level of granularity. This process may not be necessary for numerical or time series data sets. These basic units form the initial set of sourceblocks. The codeword allocator 3230 then performs a frequency analysis of the sourceblocks, counting the occurrences of each sourceblock in the input data. Based on the frequency analysis, the allocator 3213 constructs a Huffman tree, which is a binary tree that represents the probability distribution of the sourceblocks. The Huffman tree is built by iteratively combining the two least frequent sourceblocks into a single node, assigning binary codes to the branches, and repeating the process until all sourceblocks are included in the tree. The resulting Huffman tree has the property that sourceblocks with higher frequencies are assigned shorter codes, while sourceblocks with lower frequencies are assigned longer codes.

The Huffman coding-based codeword allocator 3213 then uses the constructed Huffman tree to perform semantic splitting of the input data. It traverses the input data and matches the sequences of symbols against the sourceblocks represented in the Huffman tree. When a sourceblock is identified, the allocator 3213 assigns the corresponding Huffman code to that sourceblock, effectively compressing the data while preserving its semantic structure. The use of Huffman coding for semantic splitting offers several advantages. It allows for variable-length sourceblocks, enabling the codeword allocator 3213 to capture meaningful units of varying sizes. This is particularly useful for handling data with different levels of complexity and granularity, such as text with compound words or images with hierarchical structures.

After the sourceblock generation process, the codeword allocator 3213 assigns a unique codeword to each sourceblock. The codewords are discrete, compressed representations of the sourceblocks, designed to capture the essential information in a compact form. The codeword allocator can use various mapping schemes to assign codewords to sourceblocks, such as hash functions, lookup tables, or learned mappings. For example, a simple approach could be to use a hash function that maps each sourceblock to a fixed-length binary code. Alternatively, another approach may involve learning a mapping function that assigns codewords based on the semantic similarity of the sourceblocks.

The codebook generation subsystem 3240 is responsible for creating and maintaining the codebook, which is a collection of all the unique codewords used by the LCM. The codebook can be generated offline, before the actual processing begins, or it can be updated dynamically as new sourceblocks are encountered during processing. The codebook generation subsystem can use various techniques to create a compact and efficient codebook, such as frequency-based pruning, clustering, or vector quantization. The size of the codebook can be adjusted based on the desired trade-off between compression and information preservation. Going back to the War and Peace example, the string of sourceblocks ['Well', ',', 'Prince', ',', 'so', 'Gen', 'oa', 'and', 'Luc', 'ca', 'are', 'now', 'just', 'family', 'estates', 'of', 'the', 'Buon', 'apar', 'tes', '.'] may be given codewords such as [12, 5, 78, 5, 21, 143, 92, 8, 201, 45, 17, 33, 49, 62, 87, 11, 2, 179, 301, 56, 4], where each sourceblock is assigned a unique codeword, which is represented as an integer. The mapping between tokens and codewords is determined by the codebook generated by the LCM system.

Once the input data is allocated codewords, it is passed through the Variational Autoencoder Encoder Subsystem 3250. This subsystem utilizes a VAE encoder to compress the codewords into a lower-dimensional latent space representation. The VAE encoder learns to capture the essential features and variations of the input data, creating compact and informative latent space vectors. The machine learning training system 3600 is responsible for training the VAE encoder using appropriate objective functions and optimization techniques.

The latent space vectors generated by the VAE encoder are then fed into the Latent Transformer Subsystem 3270. This subsystem is a modified version of the traditional Transformer architecture, where the embedding and positional encoding layers are removed. By operating directly on the latent space vectors, the Latent Transformer can process and generate data more efficiently, without the need for explicit embedding or positional information. The Transformer Training System 3271 is used to train the Latent Transformer, leveraging techniques such as self-attention and multi-head attention to capture dependencies and relationships within the latent space.

The Latent Transformer comprises of several key components. Latent space vectors may be passed directly through a multi-head attention mechanism. The multi-head attention mechanism, which is the core building block of the Transformer, allows the model to attend to different parts of the input sequence simultaneously, capturing complex dependencies and relationships between codewords. Feed-forward networks are used to introduce non-linearity and increase the expressive power of the model. Residual connections and layer normalization are employed to facilitate the flow of information and stabilize the training process.

The Latent Transformer-based core can be implemented using an encoder-decoder architecture. The encoder processes the input codewords and generates contextualized representations, while the decoder takes the encoder's output and generates the target codewords or the desired output sequence. The encoder and decoder are composed of multiple layers of multi-head attention and feed-forward networks, allowing for deep and expressive processing of the codeword representations.

One of the key advantages of the Transformer in the LCM architecture is its ability to capture long-range dependencies between codewords. Unlike recurrent neural networks (RNNs), which process the input sequentially, the Transformer can attend to all codewords in parallel, enabling it to effectively capture relationships and dependencies that span across the entire input sequence. This is useful for processing long and complex data sequences, where capturing long-range dependencies is crucial for understanding the overall context. Another advantage of the Transformer-based core is its parallelization capability. The self-attention mechanism in the Transformer allows for efficient parallel processing of the codewords on hardware accelerators like GPUs. This parallelization enables faster training and inference times, making the LCM architecture suitable for processing large amounts of data in real-time applications.

The Latent Transformer-based core also generates contextualized representations of the codewords, where each codeword's representation is influenced by the surrounding codewords in the input sequence. This contextualization allows the model to capture the semantic and syntactic roles of the codewords based on their context, enabling a deeper understanding of the relationships and meanings within the data. The scalability of the Transformer-based core is another significant advantage in the LCM architecture. By increasing the number of layers, attention heads, and hidden dimensions, the Transformer can learn more complex patterns and representations from large-scale datasets. This scalability has been demonstrated by models like GPT-3, which has billions of parameters and can perform a wide range of tasks with impressive performance.

After being processed by the Latent Transformer, the latent space vectors are passed through the Variational Autoencoder Decode Subsystem 3280. The VAE decoder takes the processed latent vectors and reconstructs the original data or generates new data based on the learned representations. The machine learning training subsystem 3600 is responsible for training the VAE decoder to accurately reconstruct or generate data from the latent space. In some embodiments, the Decode Subsystem 3280 may be used to create time series predictions about a particular data input.

The reconstructed or generated data is then output 3290, which can be in the same format as the original input data or in a different modality altogether. This flexibility allows the Latent Transformer LCM to handle various tasks, such as data compression, denoising, anomaly detection, and data generation, across multiple domains.

Moreover, the modular design of the system enables each subsystem to be trained independently or jointly, depending on the specific requirements and available resources. The machine learning training system 3600 may provide the necessary mechanisms to optimize the performance of each component and ensure the overall effectiveness of the Latent Transformer LCM.

Figure 32C:
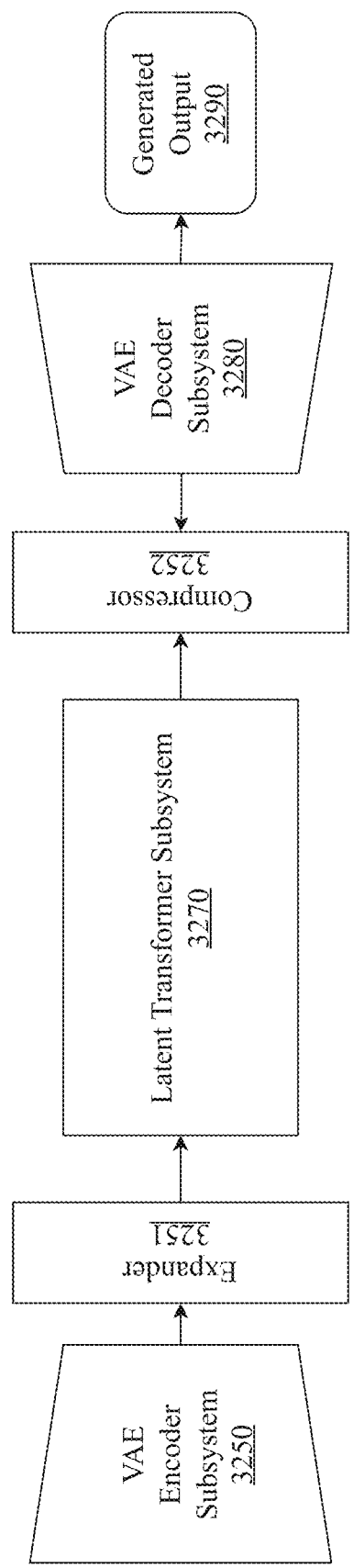
FIG. 32C is a block model illustrating an aspect of a system for a large codeword model for deep learning.

FIG. 32C is a block model illustrating an aspect of a system for a large codeword model for deep learning, a latent transformer machine learning core. At the heart of the system is a Latent Transformer Subsystem 3270, which serves as the central processing unit responsible for learning the underlying patterns, relationships, and dependencies within the input data. The Latent Transformer Subsystem 3270 leverages advanced techniques such as self-attention mechanisms and multi-head attention to capture the complex interactions and sequences in the data, enabling it to generate accurate and context-aware outputs.

The input to the Latent Transformer Subsystem 3270 is provided by a VAE Encoder Subsystem 3250. The VAE Encoder Subsystem 3250 is responsible for encoding the preprocessed input data into a lower-dimensional latent space representation. An input is passed through the VAE Encoder Subsystem 3250, which learns to compress the data into a compact latent space representation while preserving the essential features and characteristics of the input. Latent space vectors produced by the VAE Encoder Subsystem 3250 may be further processed by an expander 3251, which increases the dimensionality of the input data to a point where the vectors can be efficiently processed by the Latent Transformer Subsystem 3270.

The latent space representation generated by the VAE Encoder Subsystem 3250 serves as the input to the Latent Transformer Subsystem 3270. The Latent Transformer Subsystem 3270 operates in this latent space, leveraging the compressed and informative representation to learn the complex patterns and relationships within the data. By working in the latent space, the Latent Transformer Subsystem 3270 can efficiently process and model the data, capturing the intricate dependencies and generating accurate and meaningful outputs.

Once the Latent Transformer Subsystem 3270 has processed the latent space representation, the generated output is passed through the VAE Decoder Subsystem 3280. The VAE Decoder Subsystem 3280 is responsible for decoding the latent space representation back into the original data space. Prior to processing by the VAE Decoder Subsystem 3280, Latent Transformer Subsystem outputs may be compressed back to an original size before being processed by the expander 3251 by being processed by a compressor 3252. The VAE Decoder Subsystem 180 learns to reconstruct the original data from the latent space representation, ensuring that the generated output is coherent and meaningful.

The reconstructed output from the VAE Decoder Subsystem 3280 is provided as the generated output 3290. The generated output 3290 represents the final result of the Latent Transformer LCM system, which can take various forms depending on the specific task and domain. It could be predicted values for time series forecasting, generated text for language modeling, synthesized images for computer vision tasks, or any other relevant output format.

The VAE Encoder Subsystem 3250 and VAE Decoder Subsystem 3280 play large roles in the overall functioning of the Latent Transformer LCM system. The VAE Encoder Subsystem 3250 enables the system to learn a compressed and informative representation of the input data in the latent space, while the VAE Decoder Subsystem 3280 ensures that the generated output is coherent and meaningful by reconstructing it back into the original data space. The combination of these subsystems allows the Latent Transformer Subsystem 3270 to focus on learning the complex patterns and relationships within the data, leading to accurate and context-aware outputs.

The specific architectures and parameters of the VAE Encoder Subsystem 3250, Latent Transformer Subsystem 3270, and VAE Decoder Subsystem 3280 can be customized and adapted based on the characteristics and requirements of the input data and the specific task at hand. The modular design of the system allows for flexibility and extensibility, enabling the integration of different architectures, attention mechanisms, and training techniques to optimize the performance and efficiency of the Latent Transformer LCM system.

Figure 32D:
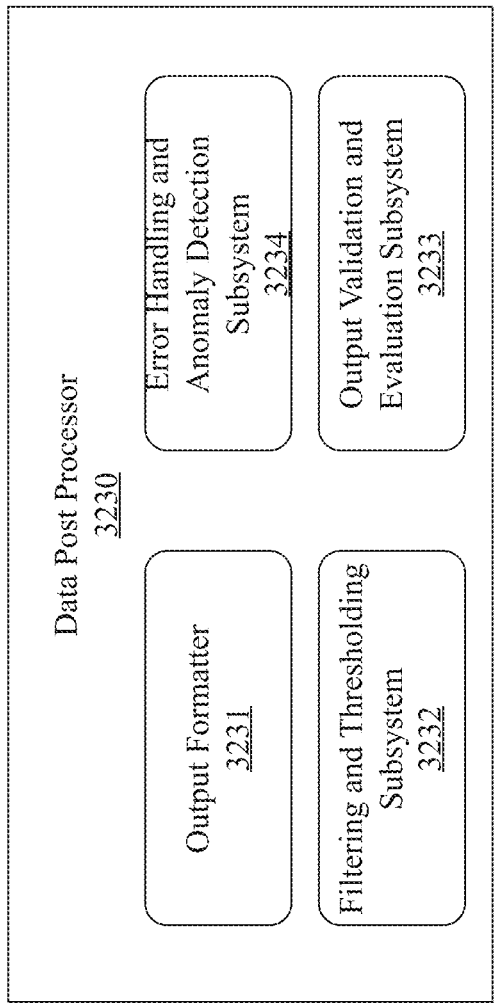
FIG. 32D is a block model illustrating an aspect of a system for a large codeword model for deep learning, a data post processor.

FIG. 32D is a block model illustrating an aspect of a system for a large codeword model for deep learning, a data post processor. The data post processor 3230 receives the generated output from the Latent Transformer Machine Learning Core 3220 and applies a series of transformations and operations to adapt it to the desired format and characteristics. The post-processing system may include, but is not limited to an output formatter, a filtering and thresholding subsystem, an output validation and evaluation subsystem, and an error handling and anomaly detection subsystem.

An output formatter 3231 is responsible for converting the generated output into a specific format required by the application or user. It applies formatting rules and conventions to enhance the readability, coherence, and usability of the generated output. For example, in the case of generated text, the output formatter 3231 may apply capitalization, punctuation, or line breaks to improve the clarity and structure of the text. In the case of generated time series data, the output formatter 3231 may convert the values into the desired unit of measurement or apply specific formatting conventions to ensure consistency with the expected output format.

A filtering and thresholding subsystem 3232 applies specific criteria or thresholds to filter or select the most relevant or reliable generated outputs. It helps to refine the generated output based on predefined rules, constraints, or user preferences. For example, in a recommendation system, the filtering and thresholding subsystem 3232 may filter out generated recommendations that fall below a certain relevance threshold or exclude items that have already been recommended to the user. This subsystem ensures that only the most pertinent and valuable outputs are presented to the user or passed on for further processing.

An output validation and evaluation subsystem 3233 assesses the quality and performance of the generated output against predefined metrics or ground truth data. It applies validation techniques to ensure that the generated output meets the expected criteria and conforms to the desired characteristics. This subsystem may include automatic evaluation methods, such as calculating similarity scores, perplexity, or domain-specific metrics, to measure the accuracy, coherence, or effectiveness of the generated output. By continuously monitoring and evaluating the generated output, the output validation and evaluation subsystem 3233 provides valuable insights for model improvement and fine-tuning.

An error handling and anomaly detection subsystem 3234 identifies and handles any errors, anomalies, or unexpected patterns in the generated output. It incorporates techniques for detecting and correcting syntactic or semantic errors, identifying out-of-distribution samples, or flagging potential issues that require human intervention. This subsystem plays a critical role in maintaining the quality and reliability of the generated output by proactively identifying and addressing any problems or inconsistencies. It helps to prevent the propagation of errors downstream and ensures that the generated output is trustworthy and dependable.

The data post processor 3230 works seamlessly with the other components of the Latent Transformer LCM system to deliver high-quality and reliable generated outputs. It receives the generated output from the Latent Transformer Machine Learning Core 3220, which has learned the underlying patterns, relationships, and dependencies within the input data. The post-processing subsystems within the data post processor 3230 then refine, format, validate, and ensure the quality of the generated output, making it suitable for the intended application or user.

The specific configuration and parameters of each subsystem within the Data Post Processor 3230 can be customized and adapted based on the requirements of the application domain and the nature of the generated output. The modular design of the post-processor allows for the integration of additional subsystems or the modification of existing ones to meet the specific needs of the task at hand.

FIG. 33 is a block diagram illustrating a component of the system for a Latent Transformer core for a Large Codeword Model, a Variational Autoencoder Encoder Subsystem. A VAE Encode Subsystem is responsible for compressing the input codeword vectors into a lower-dimensional latent space representation, enabling efficient processing and data generation.

The VAE Encoder Subsystem 3250 takes a codeword vector input 3300 as its input. This codeword vector is generated by the codeword allocator 3213, which converts the raw input data into a sequence of codewords based on the codebook maintained by the codebook generation subsystem 3240. The codeword vector represents the input data in a compact and discrete form, capturing the essential information and structure of the original data. Inside the VAE Encode Subsystem 3250, the codeword vector input 3300 undergoes a series of transformations to map it into the latent space. The encoder architecture typically consists of multiple layers of neural networks, such as fully connected layers or convolutional layers, depending on the nature of the input data.

A layer of the encoder takes the codeword vector and applies a linear transformation to project it into a higher-dimensional space. This transformation is learned during the training process and helps to capture the complex patterns and relationships within the input data. The output of this layer may be passed through a non-linear activation function, such as the rectified linear unit (ReLU), to introduce non-linearity and enhance the representational power of the encoder.

As the codeword vector input 3300 progresses through the subsequent layers of the encoder, the dimensionality of the representation is gradually reduced. Each layer applies a linear transformation followed by a non-linear activation function, allowing the encoder to learn hierarchical features and abstract representations of the input data.

The VAE Encoder Subsystem 3250 in the Latent Transformer LCM system can be trained independently or jointly with the other machine learning components, such as the Latent Transformer Subsystem 3270 and the VAE Decode Subsystem 3280. The flexibility in training allows for optimizing the VAE encoder based on specific requirements and available resources. When trained individually, the VAE encoder can focus on learning the optimal compression and representation of the input codeword vectors in the latent space. The Encoder Training System 3251 is responsible for updating the encoder's parameters using techniques like gradient descent and backpropagation, minimizing the reconstruction loss and the KL divergence. Individual training enables the encoder to specialize in mapping the input data to a meaningful latent space representation.

On the other hand, joint training of the VAE encoder 3250 with the Latent Transformer 3270 and VAE decoder 3280 allows for end-to-end optimization of the entire system. By training all components simultaneously, the VAE encoder 3250 can learn to generate latent space vectors that are well-suited for processing by the Latent Transformer and decoding by the VAE decoder 3280. Joint training enables the system to capture the dependencies and interactions between the different components, leading to improved overall performance. However, joint training may be more computationally intensive and require careful coordination between the training systems. The choice between individual or joint training depends on factors such as the complexity of the data, the desired performance, and the available computational resources. Experimentation and evaluation can help determine the most suitable training approach for a given scenario.

Once the VAE Encoder Subsystem 3250 is trained, it can map the input codeword vector to a lower-dimensional latent space representation. This latent space vector captures the essential features and characteristics of the input data in a compressed form. The dimensionality of the latent space vector is typically much smaller than the original codeword vector, allowing for efficient storage and processing.

The latent space vector output 3320 serves as the input to the Latent Transformer Subsystem 3270, which further processes and generates data based on the learned latent space representation. By compressing the input data into a compact latent space, the VAE Encoder Subsystem 3250 enables the Latent Transformer LCM system to handle large-scale and complex datasets efficiently, while preserving the essential information and structure of the data.

Latent space vectors possess the property of continuous differentiability. This means that the latent space formed by these vectors is a smooth and continuous manifold, allowing for smooth interpolation and gradual transitions between different points in the latent space. The continuous differentiability of latent space vectors has important implications for the similarity and relatedness of the outputs generated by the LCM system. In the latent space, outputs that are more proximate to one another, i.e., closer in terms of their latent vector representations, tend to exhibit higher levels of similarity. This is because the VAE Encoder Subsystem 3250 learns to map similar input data points to nearby regions in the latent space, capturing their shared characteristics and underlying patterns.

As a result, when the Latent Transformer Subsystem 3270 operates on the latent space vectors and generates outputs, the proximity of the latent vectors directly influences the similarity of the generated outputs. Outputs corresponding to latent vectors that are close to each other in the latent space are more likely to share common features, styles, or semantics. This property enables smooth interpolation between different outputs, allowing for the generation of intermediate or blended results that exhibit gradual variations along the latent space. The continuous differentiability of latent space vectors also facilitates the learning and optimization process of the LCM system. During training, the gradients can be computed and propagated smoothly through the latent space, enabling efficient updates of the model parameters. This allows the system to learn meaningful and coherent representations of the input data, capturing the underlying structure and relationships.

Moreover, the proximity-based similarity of latent space vectors opens up possibilities for various applications and use cases. For example, in the context of image generation, interpolating between latent vectors of different images can lead to the generation of smooth transitions or morphs between the corresponding visual contents. Similarly, in the domain of text generation, interpolating between latent vectors of different sentences or paragraphs can result in the generation of semantically coherent and gradually varying textual outputs. The continuous differentiability and proximity-based similarity of latent space vectors in the LCM system provide a powerful tool for exploring and manipulating the generated outputs. By navigating and interpolating within the latent space, users can discover novel and meaningful variations of the data, generate diverse and creative outputs, and gain insights into the underlying structure and relationships captured by the model.

In the Variational Autoencoder (VAE) Encoder and Decoder subsystems of the Latent Transformer Large Codeword Model (LCM) system, the shape of the tensors undergoes transformations as they are compressed and decompressed. The VAE Encoder Subsystem 3250 is responsible for compressing the input data into a lower-dimensional latent space representation, while the VAE Decoder Subsystem 3280 decompresses the latent representation back into the original data space. The specific shape and dimensionality of the tensors at each stage of the encoding and decoding process can be adjusted based on the goals and requirements of the system.

The VAE Encoder Subsystem 3250 takes the preprocessed input data, which is typically in the form of a high-dimensional vector or tensor, and applies a series of transformations to reduce its dimensionality. The shape of the tensor at each layer of the VAE Encoder Subsystem 3250 can be customized based on the desired level of compression and the complexity of the input data. For example, after passing through the first layer of the encoder, the expanded input vector may be reduced to a tensor with 1000 elements. This compression step aims to capture the most salient features and patterns in the input data while reducing its dimensionality. The subsequent layers of the encoder can further compress the tensor, reducing it to even lower dimensions, such as 50 or 10 elements, depending on the specific training parameters and the desired level of compression.

The choice of the target dimensionality for the latent space representation depends on various factors, such as the nature of the input data, the complexity of the patterns and relationships to be captured, and the available computational resources. A smaller latent space dimensionality can lead to higher compression rates and more efficient processing, but it may also result in a loss of information and reduced expressiveness. On the other hand, a larger latent space dimensionality allows for more detailed and nuanced representations but may require more computational resources and longer training times.

Once the input data is compressed into the latent space representation, it is passed through the Latent Transformer Subsystem 3270, where the self-attention mechanisms and multi-head attention operate on the compressed representation. The Latent Transformer Subsystem 3270 learns the underlying patterns, relationships, and dependencies within the latent space, enabling it to generate accurate and context-aware outputs. If the shape of the latent space representation is not large enough to be effectively processed by the Latent Transformer Subsystem 3270, the latent space vectors may be processed by an expander 3251, which increases the dimensionality of the vector allowing for a richer and more expressive representation.

The generated output from the Latent Transformer Subsystem 3270 is then fed into the VAE Decoder Subsystem 3280, which is responsible for decompressing the latent representation back into the original data space. The VAE Decoder Subsystem 3280 applies a series of transformations to gradually increase the dimensionality of the tensor, eventually reconstructing it into the desired output shape. Similar to the encoding process, the shape of the tensor at each layer of the VAE Decoder Subsystem 3280 can be customized based on the desired output characteristics and the requirements of the application.

The flexibility in tensor shapes throughout the encoding and decoding process allows the Latent Transformer LCM system to adapt to various data types, input sizes, and output requirements. By adjusting the compression and decompression parameters, the system can be optimized for different goals, such as achieving high compression rates, preserving important details, or generating outputs with specific dimensions or characteristics.

The ability to customize the tensor shapes in the VAE Encoder and Decoder subsystems enables the Latent Transformer LCM system to handle a wide range of data modalities and tasks, from time series forecasting and language modeling to image generation and beyond. It provides the flexibility to tailor the system to the specific needs of each application, balancing the trade-offs between compression, expressiveness, and computational efficiency.

FIG. 34 is a block diagram illustrating a component of the system and method for a large codeword model for deep learning, a Latent Transformer. A Transformer generally comprises an Encoder (the components on the left side of the illustration) and a Decoder (the components on the right side of the illustration).

The illustrated Latent Transformer comprises an Encoder and a Decoder. The Encoder takes latent space vector inputs and processes them through a stack of layers (represented as dashed box 3420). Each layer consists of: multi-head attention, which allows the model to attend to different parts of the input sequence; add and norm, which applies residual connection and layer normalization; feed forward, which is a fully connected feed-forward network; and add and norm which is another residual connection and layer normalization.

The power of the transformer model lies in the self-attention mechanism. This mechanism contributes to accelerated learning compared to traditional models such as long short-term memory models. Self-attention empowers the transformer model with the remarkable capability to meticulously scrutinize distinct segments of a given sequence or even encompass the entire contextual essence of a sentence. This profound contextual awareness enables the model to make predictions with an elevated degree of accuracy and relevance.

Contrary to a standard transformer architecture, in a Latent Transformer, an input embedding layer and a positional encoding layer are not necessary. This is because rather than processing data inputs, a Latent Transformer processes latent space vectors which have been processed by a Variational Autoencoder encoder.

This latent space representation captures the essential features and characteristics of the input data, including both the content and positional information. By encoding the input data into a compact latent vector, the VAE effectively combines the roles of the embedding layer and positional encoding layer. The latent vectors generated by the VAE encoder already contain the necessary information for the Transformer to process and learn from, without the need for explicit embedding or positional encoding. This streamlined approach simplifies the Transformer architecture and reduces the computational overhead associated with maintaining separate embedding and positional encoding layers. As a result, the Latent Transformer LCM system can efficiently process and generate data in the latent space, leveraging the power of the Transformer architecture while benefiting from the compressed representation learned by the VAE.

The Encoder utilizes a multi-head attention mechanism 3424 which allows the Encoder to attend to different parts of the input sequence and capture dependencies between vectors. The attention mechanism computes three matrices: Query (Q), Key (K), and Value (V). The Query, Key, and Value matrices are obtained by linearly projecting the input embeddings using learned weight matrices. The attention scores are computed by taking the dot product of the Query matrix with the transpose of the Key matrix, followed by scaling and applying a softmax function. The attention scores determine the importance of each vector in the input sequence for a given position. The Value matrix is then multiplied with the attention scores to obtain the weighted sum of the values, which forms the output of the attention mechanism. Multi-Head Attention splits the Query, Key, and Value matrices into multiple heads, allowing the model to attend to different aspects of the input simultaneously. The outputs from each head are concatenated and linearly projected to obtain the final output of the Multi-Head Attention layer 3424.

In the Latent Transformer LCM system, the number of attention heads used by the Encoder can be adjusted based on the complexity and nature of the relationships within the input data. The attention mechanism allows the Encoder to focus on different aspects of the input and capture dependencies between elements at various positions. When dealing with datasets where the relationships between elements are weaker or more subtle, increasing the number of attention heads can be beneficial. By having more attention heads, the Encoder can learn and capture a wider range of patterns and dependencies within the data. Each attention head can attend to different parts of the input sequence, allowing the model to capture fine-grained relationships and nuances that may be difficult to detect with fewer attention heads. This is particularly useful when working with complex or heterogeneous datasets, where the relationships between elements may not be immediately apparent. By increasing the number of attention heads, the Latent Transformer LCM system can more effectively learn and represent the underlying structure and dependencies in the data, leading to improved performance and generalization. However, it's important to strike a balance, as having an excessive number of attention heads can increase computational complexity and may lead to overfitting. Experimentation and evaluation on specific tasks can help determine the optimal number of attention heads for a given dataset and desired outcome.

After the Multi-Head Attention layer, a residual connection is applied, followed by Layer Normalization at add and norm 3423. The residual connection adds the input embeddings to the output of the attention layer, helping the model learn faster and deeper. Layer Normalization normalizes the activations across the features, stabilizing the training process.

The Feed Forward layer 3422 is a fully connected neural network applied to each position of the Encoder's hidden states. It consists of two linear transformations with a Rectified Linear Unit (ReLU) activation function in between. The purpose of the Feed Forward layer is to introduce non-linearity and increase the model's capacity to learn complex representations. The output of the Feed Forward layer has the same dimensionality as the input embeddings. A residual connection and Layer Normalization 3421 are applied after the Feed Forward layer.

The Encoder layers 3420 are stacked Nx times, where N is a hyperparameter that determines the depth of the Encoder. Each layer follows the same structure: Multi-Head Attention, Add & Norm, Feed Forward, and Add & Norm. By stacking multiple Encoder layers, the model can capture hierarchical and long-range dependencies in the input sequence. The output of the final Encoder layer represents the encoded input sequence, which is then passed to the Decoder for generating the output sequence.

The Decoder generates the output probabilities. It has a similar structure to the Encoder, with a few additions. The Decoder takes output embeddings and processes them through a stack of layers (represented as dashed box 3450). The latent space vector output layer 3430 takes the previous output vectors (shifted right by one position) and processes them through a plurality of layers.

The masked multi-head attention 3451 mechanism prevents the model form attending to future vectors. This layer performs self-attention on the Decoder's input sequence. It allows the Decoder to attend to different parts of its own input sequence. The attention is "masked" to prevent the Decoder from attending to future vectors, ensuring that the predictions are based only on the previously generated vectors. Multi-head attention splits the input into multiple heads, allowing the model to attend different aspect of the input simultaneously.

After the masked multi-head attention, a residual connection is applied follows by layer normalization via add and norm 3452. The residual connection adds the input to the output of the attention layer, helping the model learn faster and deeper. Layer normalization normalizes the activations across the features, stabilizing the training process.

The multi-head attention 3453 layer performs attention between the Decoder's hidden states and the Encoder's output. It allows the Decoder to attend to relevant parts of the input sequence based on the Encoder's representations. The attention weights are computed based on the compatibility between the Decoder's hidden states and Encoder's outputs.

In the Latent Transformer LCM system, the number of attention heads used by the Decoder can be adjusted based on the complexity and nature of the relationships within the input data. The attention mechanism allows the Decoder to focus on different aspects of the input and capture dependencies between elements at various positions. When dealing with datasets where the relationships between elements are weaker or more subtle, increasing the number of attention heads can be beneficial. By having more attention heads, the Decoder can learn and capture a wider range of patterns and dependencies within the data. Each attention head can attend to different parts of the input sequence, allowing the model to capture fine-grained relationships and nuances that may be difficult to detect with fewer attention heads. This is particularly useful when working with complex or heterogeneous datasets, where the relationships between elements may not be immediately apparent. By increasing the number of attention heads, the Latent Transformer LCM system can more effectively learn and represent the underlying structure and dependencies in the data, leading to improved performance and generalization. However, it's important to strike a balance, as having an excessive number of attention heads can increase computational complexity and may lead to overfitting. Experimentation and evaluation on specific tasks can help determine the optimal number of attention heads for a given dataset and desired outcome.

Another add and norm 3454 layer is then followed by feed forward network 3455. This a fully connected feed-forward network applied to each position of the Decoder's hidden states. It consists of two linear transformations with a Rectified Linear Unit (ReLU) activation in between. The feed forward layer helps the model capture non-linear interactions and increases the model's capacity.

Another add and norm 3456 layer is followed by linear 3460 and softmax 3470 layers. The final hidden states of the Decoder are passed through a linear transformation to project them into the vocabulary space. Vocabulary space refers to the set of all unique codewords or words that the model can generate or predict. In the context of language models, the vocabulary is a predefined set of codewords that the model is trained on and can output. When the Decoder's final hidden states are passed through a linear transformation, they are projected into a vector space with the same dimensionality as the size of the vocabulary. Each dimension in this space corresponds to a specific codeword in the vocabulary.

A softmax function is applied to the projected values (vectors) to generate output probabilities over the vocabulary. The softmax function normalizes the values so that they sum up to 1, representing a probability distribution over the vocabulary. Each probability indicates the likelihood of a specific vector being the next output vector. The vector with the highest probability is selected as the next output vector. During the model's training, the objective is to maximize the probability of the correct next vector given the input sequence and the previously generated vector. The model learns to assign higher probabilities to the vector that are more likely to appear based on the context. At inference time, the vector with the highest probability in the vocabulary space is selected as the next output vector. This process is repeated iteratively, with the generated vector being fed back into the Decoder as input for the next step, until a stopping criterion is met (e.g., reaching a maximum length or generating an end-of-sequence vector). The size and composition of the vocabulary can vary depending on the specific task and the data the model is trained on. It can include words, sub-words, or even characters, depending on the codeword strategy used.

The Decoder layers 3450 can be stacked Nx times, allowing the model to capture complex dependencies and generate coherent output sequences.

This transformer architecture allows the model to process input sequences, capture long-range dependencies, and generate output sequence based on the encoded input and the previously generated codewords.

Another type of variation is the auto-regressive model which feature the use of only the decoder portion of the transformer architecture. In autoregressive architectures, the decoder portion of the transformer is retained and the encoder portion is not used after model pre-training. Auto-regressive models are a class of models that generate outputs by predicting the next element based on the previously generated elements. In the context of the Transformer architecture and language modeling, auto-regressive models are commonly used for tasks such as text generation, machine translation, and language understanding.

Auto-regressive models generate outputs sequentially, one element at a time. In the case of language modeling, the model predicts the next word or vector based on the previous words or vector in the sequence. The prediction of the next element is conditioned on the previously generated elements. The model learns the conditional probability distribution $P(x\_t|x\_1, x\_2, \ldots, x\_{t-1})$, where $x\_t$ is the element at position t, and $x\_1, x\_2, \ldots, x\_{t-1}$ are the previously generated elements. The Transformer architecture, particularly the Decoder component, is well-suited for auto-regressive modeling. The Decoder generates the output sequence one element at a time, conditioned on the previously generated elements and the encoded input sequence from the Encoder. In the Transformer Decoder, the self-attention mechanism is masked to prevent the model from attending to future positions during training. This masking ensures that the model relies only on the previously generated elements to make predictions, following the auto-regressive property. During training, the Transformer Decoder uses a technique called teacher forcing. Instead of feeding the model's own predictions as input for the next step, the ground truth target sequence is used. This helps the model learn to generate the correct output sequence based on the input sequence and the previous target vectors. During inference or generation, the Transformer Decoder generates the output sequence one element at a time. At each step, the model takes the previously generated elements as input and predicts the next element. This process continues until a stopping criterion is met, such as reaching a maximum sequence length or generating an end-of-sequence vector. Auto-regressive models, including the Transformer, have achieved state-of-the-art performance in language modeling tasks. They excel at capturing the statistical properties and dependencies in sequential data, making them effective for generating coherent and fluent text.

While text generation is the most suitable use case of auto-regressors, they perform exceptionally well on a wide variety of tasks. Most modern LLMs are auto-regressors including, for example, the popular GPT series of LLMs, BERT, and XLNet.

The third variation of the transformer model is the sequence-to-sequence model which utilizes both the encoder and decoder portions of the transformer and can be trained in multiple ways. One of the methods is span corruption and reconstruction. These models are, generally, best suited for language translation. The T5 and BART family of models are examples of sequence-to-sequence models.

FIG. 35 is a block diagram illustrating a component of the system for a Latent Transformer core for a Large Codeword Model, a Variational Autoencoder Decoder Subsystem. The VAE Decoder Subsystem 3280 is a component of the Latent Transformer LCM system, responsible for reconstructing or generating output data from the latent space vector representations. It works in conjunction with the Latent Transformer Subsystem 3270 to provide meaningful and coherent outputs based on the learned relationships and patterns in the latent space. The input to the VAE Decoder Subsystem 3280 is a Generated Vector Response or Prediction 3500, which is produced by the Latent Transformer Subsystem 3270. The Latent Transformer learns to model the dependencies and relationships between the latent space vectors generated by the VAE Encoder Subsystem 3250. It processes the latent space vectors using self-attention mechanisms and captures the relevant information and context for generating the output.

The Generated Vector Response or Prediction 3500 is a lower-dimensional representation that encodes the necessary information for reconstructing or generating the desired output. It contains the learned patterns, relationships, and variations that the Latent Transformer has captured from the input data. The VAE Decoder Subsystem 3280 takes this generated vector as input and maps it back to the original data space, producing the final output 3290. The decoder architecture typically comprises multiple layers of neural networks, such as fully connected layers or deconvolutional layers, depending on the nature of the output data.

The decoder starts by applying a linear transformation to the generated vector, projecting it into a higher-dimensional space. This transformation helps to expand the compressed representation and prepare it for the subsequent decoding steps. The output of this layer is then passed through a non-linear activation function, such as the rectified linear unit (ReLU), to introduce non-linearity and increase the expressiveness of the decoder. As the generated vector progresses through the subsequent layers of the decoder, the dimensionality of the representation is gradually increased. Each layer applies a linear transformation followed by a non-linear activation function, allowing the decoder to reconstruct the fine-grained details and structure of the output data. In the case of sequence-to-sequence tasks, such as time series prediction or language translation, the VAE Decoder Subsystem 3280 may incorporate recurrent neural networks (RNNs) or attention mechanisms to generate the output sequence step by step. The decoder can attend to different parts of the generated vector and the previously generated outputs to produce coherent and contextually relevant results.

During the training process, the VAE Decoder Subsystem 3280 learns to minimize the reconstruction loss between the generated output and the target output. It aims to produce outputs that closely match the desired or expected results based on the learned latent space representations. The Decoder Training System 3281 is responsible for updating the decoder's parameters using techniques like gradient descent and backpropagation, optimizing the decoder's ability to generate accurate and meaningful outputs. Once the VAE Decoder Subsystem 3280 is trained, it can map the Generated Vector Response or Prediction 3500 back to the original data space, producing the final output 3290. The output can be in various forms, such as reconstructed input data, predicted future sequences, or generated samples, depending on the specific task and application. The flexibility of the VAE Decoder Subsystem 3280 allows it to handle various types of output data, such as time series, images, or text. By adapting the decoder architecture and training process to the specific requirements of the task, the Latent Transformer LCM system can generate high-quality outputs that capture the essential characteristics and variations of the target data.

FIG. 36 is a block diagram illustrating an aspect of system and method for a Latent Transformer core for a Large Codeword Model, a machine learning training system. According to the embodiment, the machine learning training system 3600 may comprise a model training stage comprising a data preprocessor 3602, one or more machine and/or deep learning algorithms 3603, training output 3604, and a parametric optimizer 3605, and a model deployment stage comprising a deployed and fully trained model 3610 configured to perform tasks described herein such as processing codewords through a large codeword model. The machine learning training system 3600 may be used to train and deploy a plurality of machine learning architectures in order to support the services provided by the large codeword model for deep learning. In one embodiment, machine learning training system 3600 may be used to train the VAE Encoder Subsystem 3250, the Latent Transformer Subsystem 3270, and the VAE Decoder Subsystem 3280. The machine learning training system 3600 may train each of the proceeding systems separately or together as a single system.

At the model training stage, a plurality of training data 3601 may be received by the generative AI training system 3650. Data preprocessor 3602 may receive the input data (e.g., codeword vector inputs, latent space vector representations) and perform various data preprocessing tasks on the input data to format the data for further processing. For example, data preprocessing can include, but is not limited to, tasks related to data cleansing, data deduplication, data normalization, data transformation, handling missing values, feature extraction and selection, mismatch handling, and/or the like. Data preprocessor 3602 may also be configured to create training dataset, a validation dataset, and a test set from the plurality of input data 3601. For example, a training dataset may comprise 80% of the preprocessed input data, the validation set 10%, and the test dataset may comprise the remaining 10% of the data. The preprocessed training dataset may be fed as input into one or more machine and/or deep learning algorithms 3603 to train a predictive model for object monitoring and detection.

During model training, training output 3604 is produced and used to measure the accuracy and usefulness of the predictive outputs. During this process a parametric optimizer 3605 may be used to perform algorithmic tuning between model training iterations. Model parameters and hyperparameters can include, but are not limited to, bias, train-test split ratio, learning rate in optimization algorithms (e.g., gradient descent), choice of optimization algorithm (e.g., gradient descent, stochastic gradient descent, of Adam optimizer, etc.), choice of activation function in a neural network layer (e.g., Sigmoid, ReLu, Tanh, etc.), the choice of cost or loss function the model will use, number of hidden layers in a neural network, number of activation unites in each layer, the drop-out rate in a neural network, number of iterations (epochs) in a training the model, number of clusters in a clustering task, kernel or filter size in convolutional layers, pooling size, batch size, the coefficients (or weights) of linear or logistic regression models, cluster centroids, and/or the like. Parameters and hyperparameters may be tuned and then applied to the next round of model training. In this way, the training stage provides a machine learning training loop.

In some implementations, various accuracy metrics may be used by the machine learning training system 3600 to evaluate a model's performance. Metrics can include, but are not limited to, word error rate (WER), word information loss, speaker identification accuracy (e.g., single stream with multiple speakers), inverse text normalization and normalization error rate, punctuation accuracy, timestamp accuracy, latency, resource consumption, custom vocabulary, sentence-level sentiment analysis, multiple languages supported, cost-to-performance tradeoff, and personal identifying information/payment card industry redaction, to name a few. In one embodiment, the system may utilize a loss function 3607 to measure the system's performance. The loss function 3607 compares the training outputs with an expected output and determined how the algorithm needs to be changed in order to improve the quality of the model output. During the training stage, all outputs may be passed through the loss function 3607 on a continuous loop until the algorithms 3603 are in a position where they can effectively be incorporated into a deployed model 3615.

The test dataset can be used to test the accuracy of the model outputs. If the training model is establishing correlations that satisfy a certain criterion such as but not limited to quality of the correlations and amount of restored lost data, then it can be moved to the model deployment stage as a fully trained and deployed model 3610 in a production environment making predictions based on live input data 3611 (e.g., codeword vector inputs, latent space vector representations). Further, model correlations and restorations made by deployed model can be used as feedback and applied to model training in the training stage, wherein the model is continuously learning over time using both training data and live data and predictions. A model and training database 3606 is present and configured to store training/test datasets and developed models. Database 3606 may also store previous versions of models.

According to some embodiments, the one or more machine and/or deep learning models may comprise any suitable algorithm known to those with skill in the art including, but not limited to: LLMs, generative transformers, transformers, supervised learning algorithms such as: regression (e.g., linear, polynomial, logistic, etc.), decision tree, random forest, k-nearest neighbor, support vector machines, Naïve-Bayes algorithm; unsupervised learning algorithms such as clustering algorithms, hidden Markov models, singular value decomposition, and/or the like. Alternatively, or additionally, algorithms 3603 may comprise a deep learning algorithm such as neural networks (e.g., recurrent, convolutional, long short-term memory networks, etc.).

In some implementations, the machine learning training system 3600 automatically generates standardized model scorecards for each model produced to provide rapid insights into the model and training data, maintain model provenance, and track performance over time. These model scorecards provide insights into model framework(s) used, training data, training data specifications such as chip size, stride, data splits, baseline hyperparameters, and other factors. Model scorecards may be stored in database(s) 3606.

Figure 25:
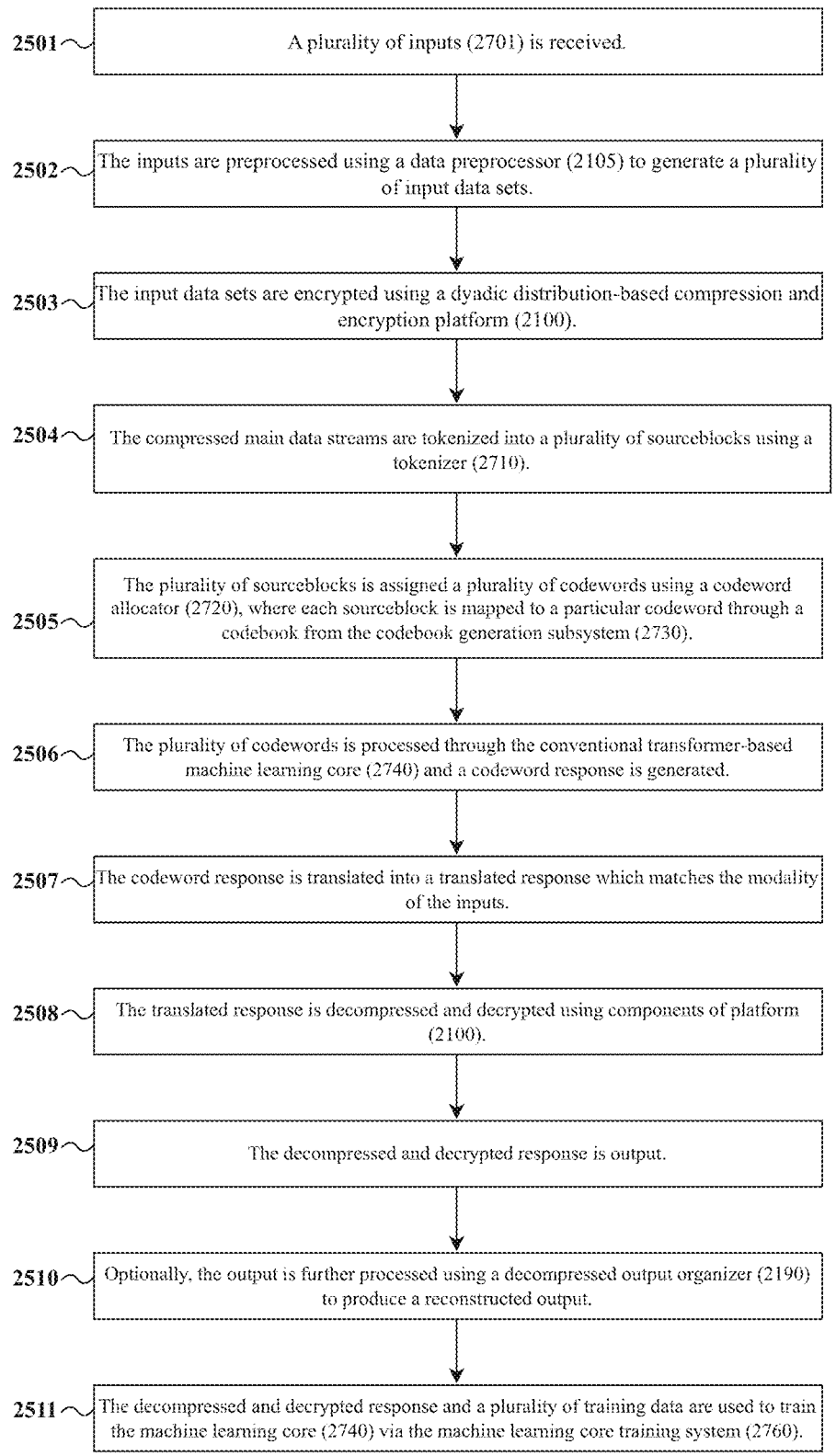
FIG. 25 is a method diagram illustrating the use of deep learning using a large codeword model with homomorphically compressed data, in an embodiment where the conventional transformer is engaged.

FIG. 25 is a method diagram illustrating the use of deep learning using a large codeword model with homomorphically compressed data, in an embodiment where the conventional transformer is engaged. A plurality of inputs (2701) is received and preprocessed using a data preprocessor (2105) to generate a plurality of input data sets 2501, 2502. The input data sets are then encrypted using a dyadic distribution-based compression and encryption platform (2100), which applies homomorphic-dyadic compression techniques to ensure both data security and the ability to perform operations on encrypted data 2503. The compressed main data streams are tokenized into a plurality of sourceblocks using a tokenizer (2710), which splits the encrypted data into meaningful semantic units 2504. These sourceblocks are then assigned unique codewords using a codeword allocator (2720), with each sourceblock mapped to a particular codeword through a codebook from the codebook generation subsystem (2730) 2505. The resulting plurality of codewords is processed through the conventional transformer-based machine learning core (2740), leveraging its ability to capture long-range dependencies and generate contextualized representations, ultimately producing a codeword response 2506. This codeword response is then translated into a response that matches the modality of the original inputs 2507. The translated response undergoes decompression and decryption using components of platform (2100) 2508, and the resulting decompressed and decrypted response is output 2509. Optionally, the output may be further refined using a decompressed output organizer (2190) to produce a reconstructed output that more closely resembles the original input format 2510. Finally, to improve the system's performance over time, the decompressed and decrypted response, along with a plurality of training data, is used to train the machine learning core (2740) via a machine learning core training system (2760) 2511. This process allows for continuous learning and adaptation of the model while maintaining the security and efficiency benefits of the homomorphic-dyadic compression.

Figure 26:
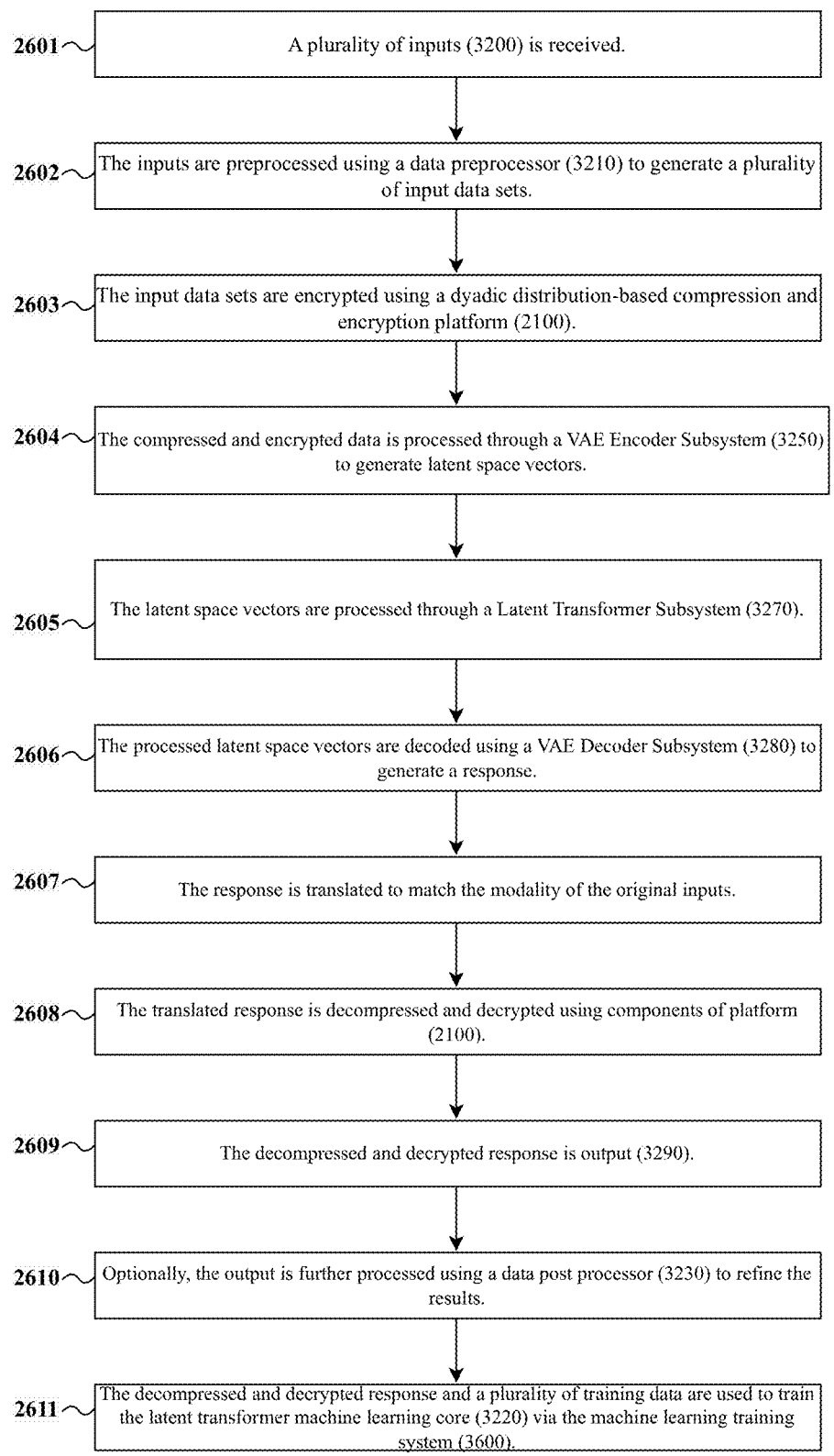
FIG. 26 is a method diagram illustrating the use of deep learning using a large codeword model with homomorphically compressed data, in an embodiment where the latent space transformer is engaged.

FIG. 26 is a method diagram illustrating the use of deep learning using a large codeword model with homomorphically compressed data, in an embodiment where the latent space transformer is engaged. A plurality of inputs (3200) is received and preprocessed using a data preprocessor (3210) to generate a plurality of input data sets, preparing the data for further processing 2601, 2602. The input data sets are then compressed and encrypted using a homomorphic-dyadic compression and encryption platform (2100), ensuring data security while maintaining the ability to perform computations on the encrypted data 2603. The compressed and encrypted data is then processed through a VAE Encoder Subsystem (3250), which maps the data into a lower-dimensional latent space, generating latent space vectors that capture the essential features of the input data 2604. These latent space vectors are then processed through a Latent Transformer Subsystem (3270), which learns and models the relationships and dependencies within the latent space representation 2605. The processed latent space vectors are subsequently decoded using a VAE Decoder Subsystem (3280) to generate a response, effectively reconstructing the data from its latent space representation 2606. This response is then translated to match the modality of the original inputs, ensuring compatibility with the input data format 2607. The translated response undergoes decompression and decryption using components of platform (2100), reversing the initial compression and encryption process 2608. The resulting decompressed and decrypted response is then output (3290) 2609. Optionally, the output may be further refined using a data post processor (3230) to enhance the quality and relevance of the results 2610. Finally, to improve the system's performance over time, the decompressed and decrypted response, along with a plurality of training data, is used to train the latent transformer machine learning core (3220) via the machine learning training system (3600), allowing for continuous learning and adaptation of the model 2611. This process leverages the advantages of both homomorphic encryption and latent space transformations to provide secure, efficient, and effective deep learning capabilities.

What is claimed is:

1. A system for deep learning using a large codeword model with homomorphically compressed dyadically encrypted data, comprising:
   a computing device comprising at least a memory and a processor;
   a plurality of programming instructions stored in the memory and operable on the processor, wherein the plurality of programming instructions, when operating on the processor, cause the computing device to:
   receive a plurality of inputs;
   preprocess the inputs to generate a plurality of input data sets;
   compress and encrypt the input data sets by:
      analyzing the input data sets to determine their properties;
      creating transformation matrices based on the properties of the input data;
      transforming the input data into modified distributions;
      generating main data streams of transformed data and secondary data streams of transformation information; and
      compressing the main data streams;
   tokenize the compressed main data streams into a plurality of sourceblocks;
   assign the plurality of sourceblocks a plurality of codewords, where each sourceblock is mapped to a particular codeword through a codebook;
   process the plurality of codewords through a machine learning core to generate a codeword response;
   translate the codeword response into a translated response which matches the modality of the inputs;
   decompress and decrypt the translated response; and
   train the machine learning core using the decompressed and decrypted response and a plurality of training data.

2. The system of claim 1, wherein the machine learning core is a conventional transformer-based architecture comprising:
   an embedding layer;
   a positional encoding layer; and
   a series of transformer layers.

3. The system of claim 2, further comprising a syntactic splitting component that splits the codewords into smaller units before processing through the conventional transformer-based architecture.

4. The system of claim 1, wherein the machine learning core is a latent transformer core comprising:
   a variational autoencoder with an encoder and a decoder; and
   a transformer that processes latent space vectors, wherein the transformer does not include an embedding layer and a positional encoding layer.

5. The system of claim 4, wherein processing the plurality of codewords through the machine learning core comprises:
   generating a plurality of latent space vectors by processing the plurality of codewords through the variational autoencoder's encoder;
   learning relationships between the plurality of latent space vectors by processing them through the transformer;
   using the learned relationships to generate a plurality of output latent space vectors; and
   generating the codeword response by passing the output latent space vectors through the variational autoencoder's decoder.

6. The system of claim 5, further comprising a syntactic splitting component that splits the latent space vectors into smaller units before processing through the transformer.

7. The system of claim 1, wherein compressing and encrypting the input data sets further comprises:
   combining the compressed main data streams and the secondary data streams into output streams; and
   implementing security measures to protect the output streams.

8. The system of claim 7, wherein the security measures comprise providing cryptographically secure random numbers for use in data transformation and implementing protections against side-channel attacks.

9. The system of claim 1, wherein transforming the input data into modified distributions comprises transforming the input data into dyadic distributions.

10. The system of claim 1, further comprising a neural upsampler that processes the codeword response to generate a reconstructed output containing more information than the translated response.

11. A method for deep learning using a large codeword model with homomorphically compressed dyadically encrypted data, comprising the steps of:
   receiving a plurality of inputs;
   preprocessing the inputs to generate a plurality of input data sets;
   compressing and encrypting the input data sets by:
      analyzing the input data sets to determine their properties;
      creating transformation matrices based on the properties of the input data;

transforming the input data into modified distributions;
generating main data streams of transformed data and secondary data streams of transformation information; and
compressing the main data streams;
tokenizing the compressed main data streams into a plurality of sourceblocks;
assigning the plurality of sourceblocks a plurality of codewords, where each sourceblock is mapped to a particular codeword through a codebook;
processing the plurality of codewords through a machine learning core to generate a codeword response;
translating the codeword response into a translated response which matches the modality of the inputs;
decompressing and decrypting the translated response; and
training the machine learning core using the decompressed and decrypted response and a plurality of training data.

12. The method of claim 11, wherein the machine learning core is a conventional transformer-based architecture comprising:
an embedding layer;
a positional encoding layer; and
a series of transformer layers.

13. The method of claim 12, further comprising splitting the codewords into smaller units before processing through the conventional transformer-based architecture.

14. The method of claim 11, wherein the machine learning core is a latent transformer core comprising:
a variational autoencoder with an encoder and a decoder; and
a transformer that processes latent space vectors, wherein the transformer does not include an embedding layer and a positional encoding layer.

15. The method of claim 14, wherein processing the plurality of codewords through the machine learning core comprises:
generating a plurality of latent space vectors by processing the plurality of codewords through the variational autoencoder's encoder;
learning relationships between the plurality of latent space vectors by processing them through the transformer;
using the learned relationships to generate a plurality of output latent space vectors; and
generating the codeword response by passing the output latent space vectors through the variational autoencoder's decoder.

16. The method of claim 15, further comprising splitting the latent space vectors into smaller units before processing through the transformer.

17. The method of claim 11, wherein compressing and encrypting the input data sets further comprises:
combining the compressed main data streams and the secondary data streams into output streams; and
implementing security measures to protect the output streams.

18. The method of claim 17, wherein the security measures comprise providing cryptographically secure random numbers for use in data transformation and implementing protections against side-channel attacks.

19. The method of claim 11, wherein transforming the input data into modified distributions comprises transforming the input data into dyadic distributions.

20. The method of claim 11, further comprising processing the codeword response through a neural upsampler to generate a reconstructed output containing more information than the translated response.

* * * * *